US012615787B2

(12) United States Patent
Wada et al.

(10) Patent No.: US 12,615,787 B2
(45) Date of Patent: Apr. 28, 2026

(54) ISOLATOR INCLUDING ELECTRICALLY FLOATING INTERMEDIATE ELECTRODE PORTION

(71) Applicant: ROHM CO., LTD., Kyoto (JP)

(72) Inventors: Keiji Wada, Kyoto (JP); Yasushi Hamazawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 85 days.

(21) Appl. No.: 18/476,339

(22) Filed: Sep. 28, 2023

(65) Prior Publication Data

US 2024/0030276 A1 Jan. 25, 2024

Related U.S. Application Data

(63) Continuation of application No. PCT/JP2022/015037, filed on Mar. 28, 2022.

(30) Foreign Application Priority Data

Mar. 29, 2021 (JP) ................................. 2021-056149

(51) Int. Cl.
*H10D 1/68* (2025.01)
*H01L 25/16* (2023.01)
(Continued)

(52) U.S. Cl.
CPC ............. *H10D 1/692* (2025.01); *H01L 25/16* (2013.01); *H03K 17/687* (2013.01); *H01L 24/48* (2013.01);
(Continued)

(58) Field of Classification Search
CPC ......... H10D 1/692; H01L 25/16; H01L 24/48; H01L 23/5223; H03K 17/687; H03K 17/689; H02M 1/08
See application file for complete search history.

(56) References Cited

U.S. PATENT DOCUMENTS 7,016,490 B2 3/2006 Beutler et al.
7,443,020 B2 * 10/2008 Selvaraj ................... G03F 1/00
257/773

(Continued)

FOREIGN PATENT DOCUMENTS

JP 2013-051547 A 3/2013
JP 2020-036171 A 3/2020

OTHER PUBLICATIONS

International Search Report and Written Opinion mailed on Jun. 14, 2022, received for PCT Application PCT/JP2022/015037, filed on Mar. 28, 2022, 15 pages including English Translation.
(Continued)

*Primary Examiner* — Ida M Soward

(74) *Attorney, Agent, or Firm* — XSENSUS LLP

(57) ABSTRACT

An isolator includes an insulation layer and a capacitor embedded in the insulation layer. The capacitor includes: a first electrode portion arranged in the insulation layer and connected to a first pad; a second electrode portion arranged in the insulation layer and connected to a second pad; and an intermediate electrode portion arranged in the insulation layer and not connected to the first electrode portion and the second electrode portion. The intermediate electrode portion includes a first intermediate layer, a second intermediate layer, and a connector connecting the first intermediate layer and the second intermediate layer. The capacitor is formed by coupling the first electrode portion and the second electrode portion through the intermediate electrode portion.

13 Claims, 20 Drawing Sheets

(51) Int. Cl.
H03K 17/687 (2006.01)
H01L 23/00 (2006.01)
(52) U.S. Cl.
CPC ............... *H01L 2224/48175* (2013.01); *H01L 2224/48195* (2013.01)

(56) References Cited

U.S. PATENT DOCUMENTS

| | | | | |
|---|---|---|---|---|
| 7,445,966 | B2 * | 11/2008 | Ellis-Monaghan .... | H10D 89/60 |
| | | | | 438/666 |
| 7,629,689 | B2 * | 12/2009 | Maeda ..................... | H01L 24/05 |
| | | | | 257/E23.002 |
| 2002/0117750 | A1 * | 8/2002 | Kojima ............. | H01L 23/49575 |
| | | | | 257/532 |
| 2002/0173111 | A1 * | 11/2002 | Kasai ..................... | H10B 53/40 |
| | | | | 257/E21.664 |
| 2003/0222295 | A1 * | 12/2003 | Lin ...................... | H01L 23/5329 |
| | | | | 257/E21.582 |
| 2004/0183209 | A1 * | 9/2004 | Lin ...................... | H01L 23/3171 |
| | | | | 257/E23.079 |
| 2005/0269685 | A1 * | 12/2005 | Chung ................... | H05K 1/162 |
| | | | | 257/E23.079 |
| 2006/0154469 | A1 * | 7/2006 | Hess ....................... | H01L 24/03 |
| | | | | 257/E23.161 |
| 2013/0055052 | A1 | 2/2013 | Kaeriyama | |
| 2014/0325322 | A1 | 10/2014 | Kaeriyama | |
| 2019/0206981 | A1 * | 7/2019 | Bonifield ............... | H01G 4/012 |
| 2020/0075229 | A1 | 3/2020 | Sawahara | |
| 2020/0395353 | A1 | 12/2020 | Shimoichi | |

OTHER PUBLICATIONS

German Office Action issued Mar. 4, 2024 in corresponding German Patent Application No. 11 2022 001264.1, 13 pages.

* cited by examiner

ISOLATOR INCLUDING ELECTRICALLY FLOATING INTERMEDIATE ELECTRODE PORTION

CROSS-REFERENCE TO RELATED APPLICATIONS

This application is a continuation of International Application No. PCT/JP2022/015037, filed Mar. 28, 2022, which claims priority to Japanese Patent Application No. 2021-056149, filed Mar. 29, 2021, the entire contents of each are incorporated herein by reference.

BACKGROUND

The present disclosure relates to an isolator, an insulating module, and a gate driver.

A known example of a gate driver that applies a gate voltage to the gate of a switching element such as a transistor is an insulated gate driver. Japanese Laid-Open Patent Publication No. 2013-51547 describes an example of a semiconductor integrated circuit used as an insulated gate driver that includes a transformer. The transformer includes a first coil at the primary side and a second coil at the secondary side.

DETAILED DESCRIPTION

Embodiments of a gate driver will be described below with reference to the drawings. The embodiments described below exemplify configurations and methods for embodying a technical concept and are not intended to limit the material, shape, structure, layout, dimensions, and the like of each component to those described below.

First Embodiment

Figure 1:
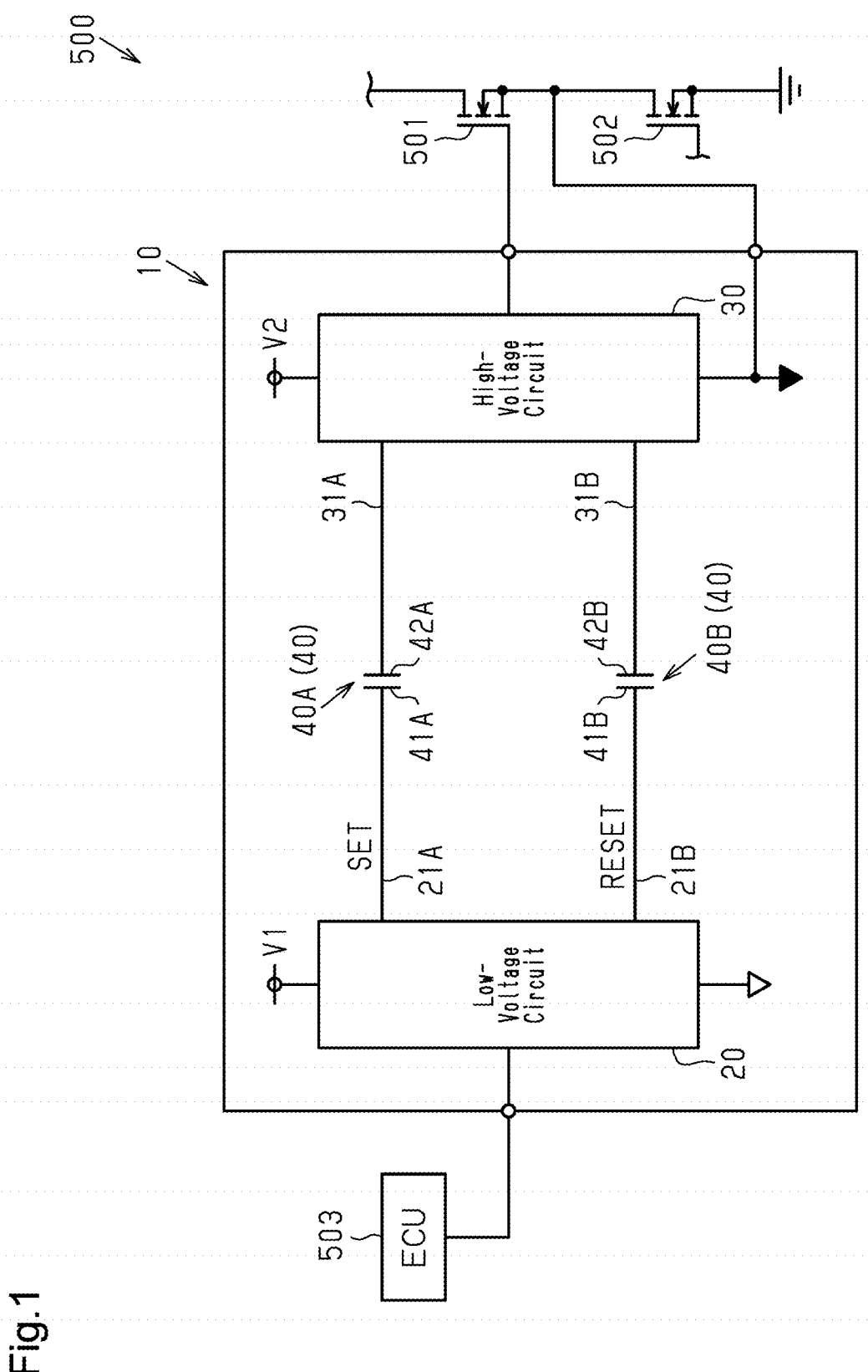
FIG. 1 is a schematic circuit diagram showing a first embodiment of a gate driver.

A first embodiment of a gate driver 10 will be described with reference to FIGS. 1 to 4. FIG. 1 schematically shows an example of a circuit configuration of the gate driver 10.

As shown in FIG. 1, the gate driver 10 is configured to apply a drive voltage signal to the gate of a switching element. In an example, the gate driver 10 is used in an inverter device 500 mounted on an electric vehicle or a hybrid electric vehicle. The inverter device 500 includes two switching elements 501 and 502 connected in series to each other, the gate driver 10, and an electronic control unit 503 (ECU) that controls the gate driver 10. In an example, the switching element 501 is a high-side switching element connected to a drive power supply. The switching element 502 is a low-side switching element. Examples of the switching elements 501 and 502 include transistors such as a Si metal-oxide-semiconductor field-effect transistor (Si MOSFET), a SiC MOSFET, and an insulated gate bipolar transistor (IGBT). The gate driver 10 of the present embodiment applies a drive voltage signal to the gate of the switching element 501. In the description hereafter, MOSFETs are used in the switching elements 501 and 502.

The gate driver 10 is provided for each of the switching elements 501 and 502 and separately drives the switching elements 501 and 502. In the present embodiment, the gate driver 10 that drives the switching element 501 will be described for the sake of convenience.

The gate driver 10 includes a low-voltage circuit 20 configured to be actuated by application of a first voltage V1, a high-voltage circuit 30 configured to be actuated by application of a second voltage V2 that is higher than the first voltage V1, and a capacitor 40. The first voltage V1 and the second voltage V2 are direct current voltages.

The gate driver 10 of the present embodiment is configured, based on a control signal from an ECU 503, which is an external control device, to transmit a signal from the low-voltage circuit 20 to the high-voltage circuit 30 through the capacitor 40 and to output a drive voltage signal from the high-voltage circuit 30.

The signal transmitted from the low-voltage circuit 20 toward the high-voltage circuit 30, that is, a signal output from the low-voltage circuit 20, is, for example, for driving the switching element 501. Examples of the signal include a set signal and a reset signal. The set signal transmits a rising edge of the control signal from the ECU 503. The reset signal transmits a falling edge of the control signal from the ECU 503. In other words, the set signal and the reset signal are signals for generating a drive voltage signal of the switching element 501. The set signal and the reset signal correspond to a first signal.

The low-voltage circuit 20 is electrically connected to the ECU 503 and generates a set signal and a reset signal based on a control signal received from the ECU 503. In an example, the low-voltage circuit 20 generates the set signal in response to a rising edge of the control signal and generates the reset signal in response to a falling edge of the control signal. The low-voltage circuit 20 transmits the generated set signal and reset signal toward the high-voltage circuit 30.

The high-voltage circuit 30 is electrically connected to the gate of the switching element 501. Based on the set signal and the reset signal received from the low-voltage circuit 20, the high-voltage circuit 30 generates a drive voltage signal for driving the switching element 501 and applies the drive voltage signal to the gate of the switching element 501. In other words, the high-voltage circuit 30 generates a drive voltage signal that is applied to the gate of the switching element 501 based on the first signal output from the low-voltage circuit 20. More specifically, the high-voltage circuit 30 generates a drive voltage signal for activating the switching element 501 based on the set signal and applies the drive voltage signal to the gate of the switching element 501. The high-voltage circuit 30 generates a drive voltage signal for deactivating the switching element 501 based on the reset signal and applies the drive voltage signal to the gate of the switching element 501. Thus, the gate driver 10 controls the activation and deactivation of the switching element 501.

The high-voltage circuit 30 includes, for example, an R-S flip-flop circuit, into which a set signal and a reset signal are input, and a driver unit. The driver unit generates a drive voltage signal based on an output signal of the R-S flip-flop circuit. However, the high-voltage circuit 30 may have any specific circuit configuration.

The capacitor 40 is arranged between the low-voltage circuit 20 and the high-voltage circuit 30. More specifically, the low-voltage circuit 20 and the high-voltage circuit 30 are electrically connected by the capacitor 40. In the gate driver 10 of the present embodiment, the low-voltage circuit 20 and the high-voltage circuit 30 are insulated from each other by the capacitor 40. More specifically, the capacitor 40 restricts transmission of a direct current voltage between the low-voltage circuit 20 and the high-voltage circuit 30 while allowing transmission of various signals such as the set signal and the reset signal.

Thus, the state in which the low-voltage circuit 20 and the high-voltage circuit 30 are insulated from each other refers to a state in which transmission of a direct current voltage between the low-voltage circuit 20 and the high-voltage circuit 30 is interrupted, while transmission of a signal between the low-voltage circuit 20 and the high-voltage circuit 30 is allowed.

The insulation voltage of the gate driver 10 is, for example, in a range of 2500 Vrms to 7500 Vrms. In the present embodiment, the insulation voltage of the gate driver 10 is approximately 3750 Vrms. However, the insulation voltage of the gate driver 10 is not limited to these values and may be any specific numerical value.

In the present embodiment, the insulation voltage of the capacitor 40 is, for example, in a range of 2500 Vrms to 7500 Vrms. The insulation voltage of the capacitor 40 may be in a range of 2500 Vrms to 5700 Vrms. However, the insulation voltage of the capacitor 40 is not limited to these values and may be any value.

In the present embodiment, the ground of the low-voltage circuit 20 and the ground of the high-voltage circuit 30 are arranged independently. In the description hereafter, the ground potential of the low-voltage circuit 20 is referred to as a first reference potential, and the ground potential of the high-voltage circuit 30 is referred to as a second reference potential. In this case, the first voltage V1 is a voltage from the first reference potential, and the second voltage V2 is a voltage from the second reference potential. The first voltage V1 is, for example, in a range of 4.5 V to 5.5 V. The second voltage V2 is, for example, in a range of 9 V to 24 V.

The capacitor 40 will now be described.

The gate driver 10 of the present embodiment includes two capacitors 40 corresponding to two types of signals transmitted from the low-voltage circuit 20 to the high-voltage circuit 30. More specifically, the gate driver 10 includes a capacitor 40 that is used to transmit a set signal and a capacitor 40 that is used to transmit a reset signal. Hereinafter, for the sake of brevity, the capacitor 40 used to transmit a set signal is referred to as a "capacitor 40A." The capacitor 40 used to transmit a reset signal is referred to as a "capacitor 40B."

The gate driver 10 includes a low-voltage signal line 21A, which connects the low-voltage circuit 20 and the capacitor 40A, and a low-voltage signal line 21B, which connects the low-voltage circuit 20 and the capacitor 40B. Thus, the low-voltage signal line 21A transmits the set signal from the low-voltage circuit 20 to the capacitor 40A. The low-voltage signal line 21B transmits the reset signal from the low-voltage circuit 20 to the capacitor 40B.

The gate driver 10 includes a high-voltage signal line 31A, which connects the capacitor 40A and the high-voltage circuit 30, and a high-voltage signal line 31B, which connects the capacitor 40B and the high-voltage circuit 30. Thus, the high-voltage signal line 31A transmits the set signal from the capacitor 40A to the high-voltage circuit 30. The high-voltage signal line 31B transmits the reset signal from the capacitor 40B to the high-voltage circuit 30.

The capacitor 40A includes a first electrode 41A and a second electrode 42A. The first electrode 41A is electrically connected to the low-voltage circuit 20. The second electrode 42A is electrically connected to the high-voltage circuit 30.

The capacitor 40B includes a first electrode 41B and a second electrode 42B. The first electrode 41B is electrically connected to the low-voltage circuit 20. The second electrode 42B is electrically connected to the high-voltage circuit 30.

Figure 2:
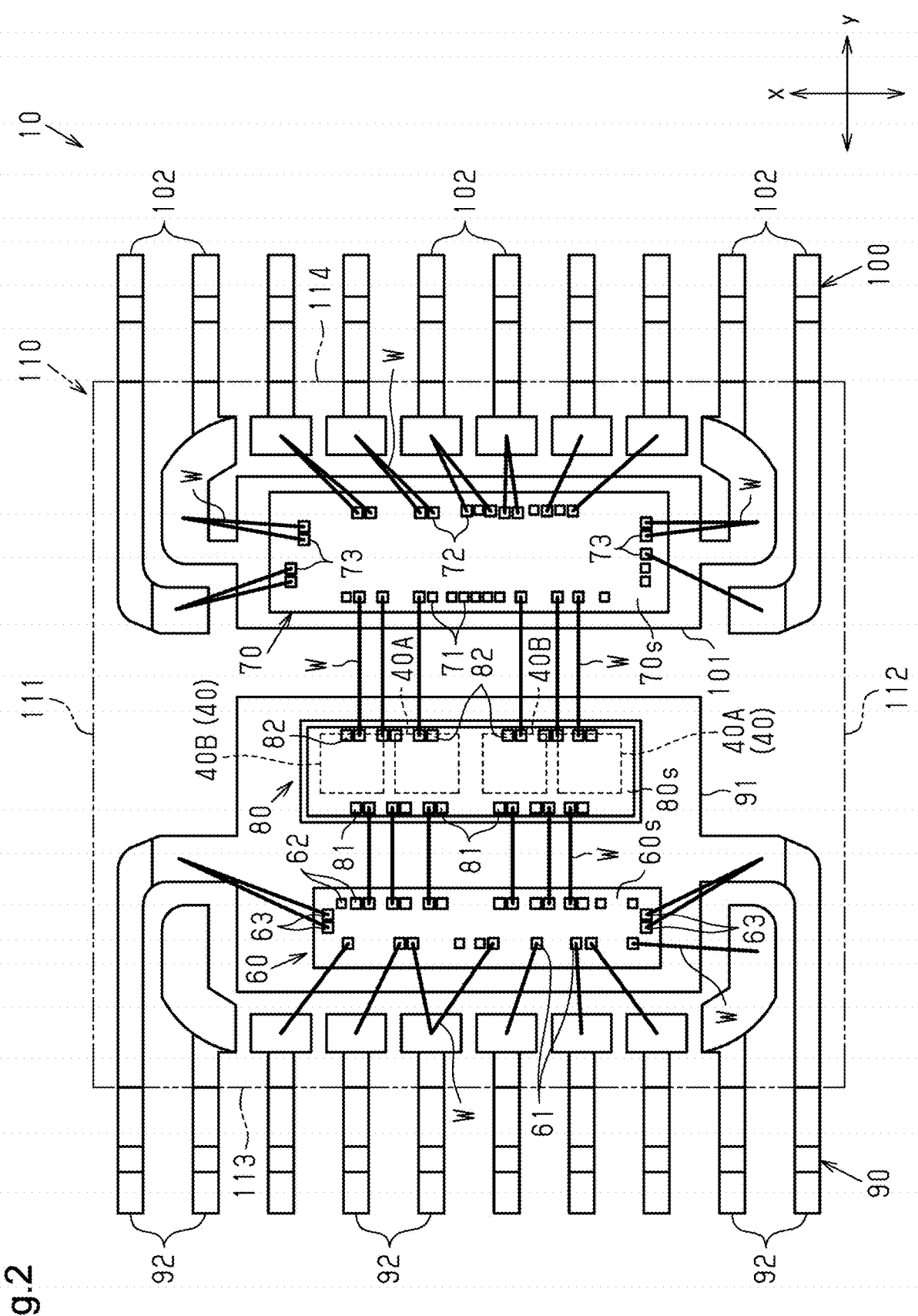
FIG. 2 is a plan view showing an internal structure of the gate driver of the first embodiment.

The structure of the gate driver 10 will now be described with reference to FIG. 2. FIG. 2 shows an example of a plan view showing the internal structure of the gate driver 10. FIG. 1 shows a simplified circuit configuration of the gate driver 10. Hence, the number of external terminals of the gate driver 10 shown in FIG. 2 is greater than the number of external terminals of the gate driver 10 shown in FIG. 1. The number of external terminals of the gate driver 10 is the number of external electrodes configured to connect the gate driver 10 to electronic components arranged outside the gate driver 10, such as the ECU 503 and the switching element 501 (refer to FIG. 1). The number of signal lines (the number of wires W described later) that transmit a signal from the low-voltage circuit 20 to the high-voltage circuit 30 in the gate driver 10 shown in FIG. 2 is greater than the number of signal lines in the gate driver 10 shown in FIG. 1.

As shown in FIG. 2, the gate driver 10 is a semiconductor device including multiple semiconductor chips arranged in a single package and is, for example, mounted on a circuit substrate arranged in the inverter device 500. Each of the switching elements 501 and 502 is mounted on a mount substrate that differs from the circuit substrate. A cooling unit is attached to the mount substrate.

The package type of the gate driver 10 is small outline (SO) and is a small outline package (SOP) in the present embodiment. The gate driver 10 includes a low-voltage circuit chip 60, a high-voltage circuit chip 70, and a capacitor chip 80, which are semiconductor chips, a low-voltage lead frame 90 on which the low-voltage circuit chip 60 is mounted, a high-voltage lead frame 100 on which the high-voltage circuit chip 70 is mounted, and an encapsulation resin 110 that encapsulates the chips 60, 70, 80 and a part of the lead frames 90 and 100. In the present embodiment, the capacitor chip 80 corresponds to an "isolator." The capacitor chip 80 and the encapsulation resin 110 correspond to an "insulating module" that insulates the low-voltage circuit 20 from the high-voltage circuit 30. In FIG. 2, the encapsulation resin 110 is indicated by double-dashed lines to illustrate the internal structure of the gate driver 10. The package type of the gate driver 10 may be changed in any manner.

The encapsulation resin 110 is formed from an electrically-insulative material and is formed from, for example, a black epoxy resin. The encapsulation resin 110 has the form of a rectangular plate having a thickness-wise direction conforming to the z-direction. The encapsulation resin 110 includes four resin side surfaces 111 to 114. More specifically, the encapsulation resin 110 includes two end surfaces in the x-direction, namely, the resin side surfaces 111 and 112, and two end surfaces in the y-direction, namely, the resin side surfaces 113 and 114. The x-direction and the y-direction are orthogonal to the z-direction. The x-direction and the y-direction are orthogonal to each other. In the description hereafter, a plan view means a view in the z-direction.

The low-voltage lead frame 90 and the high-voltage lead frame 100 are formed from a conductor and, in the present embodiment, are formed from copper (Cu). The lead frames 90 and 100 extend from the inside to the outside of the encapsulation resin 110.

The low-voltage lead frame 90 includes a low-voltage die pad 91 arranged in the encapsulation resin 110 and low-voltage leads 92 extending from the inside to the outside of the encapsulation resin 110. Each low-voltage lead 92 includes an external terminal configured to be electrically connected to an external electronic device such as the ECU 503 (refer to FIG. 1).

The low-voltage circuit chip 60 and the capacitor chip 80 are mounted on the low-voltage die pad 91. In plan view, the low-voltage die pad 91 is arranged so that the center of the low-voltage die pad 91 in the y-direction is located closer in the y-direction to the resin side surface 113 than the center of the encapsulation resin 110 is. In the present embodiment, the low-voltage die pad 91 is not exposed from the encapsulation resin 110. In plan view, the low-voltage die pad 91 is rectangular so that the long sides extend in the x-direction and the short sides extend in the y-direction.

The low-voltage leads 92 are separated from each other in the x-direction. Among the low-voltage leads 92, the low-voltage leads 92 located at opposite ends in the x-direction are integrated with the low-voltage die pad 91. Each low-voltage lead 92 partially projects from the resin side surface 113 toward the outside of the encapsulation resin 110.

The high-voltage lead frame 100 includes a high-voltage die pad 101 arranged in the encapsulation resin 110 and high-voltage leads 102 extending from the inside to the outside of the encapsulation resin 110. Each high-voltage lead 102 includes an external terminal configured to be electrically connected to an external electronic device such as the gate of the switching element 501 (refer to FIG. 1).

The high-voltage circuit chip 70 is mounted on the high-voltage die pad 101. In plan view, the high-voltage die pad 101 is located closer in the y-direction to the resin side surface 114 than the low-voltage die pad 91 is. In the present embodiment, the high-voltage die pad 101 is not exposed from the encapsulation resin 110. In plan view, the high-voltage die pad 101 is rectangular so that the long sides extend in the x-direction and the short sides extend in the y-direction.

The low-voltage die pad 91 and the high-voltage die pad 101 are separated from each other in the y-direction. The y-direction may also be referred to as the arrangement direction of the two die pads 91 and 101.

The dimension of the low-voltage die pad 91 and the high-voltage die pad 101 in the y-direction is set in accordance with the size and the number of semiconductor chips that are mounted. In the present embodiment, the low-voltage circuit chip 60 and the capacitor chip 80 are mounted on the low-voltage die pad 91, and the high-voltage circuit chip 70 is mounted on the high-voltage die pad 101. Hence, the low-voltage die pad 91 is larger than the high-voltage die pad 101 in dimension in the y-direction.

The high-voltage leads 102 are separated from each other in the x-direction. Among the high-voltage leads 102, two of the high-voltage leads 102 are integrated with the high-voltage die pad 101. Each high-voltage lead 102 partially projects from the resin side surface 114 toward the outside of the encapsulation resin 110.

In the present embodiment, the number of the high-voltage leads 102 is the same as the number of the low-voltage leads 92. As shown in FIG. 2, the low-voltage leads 92 and the high-voltage leads 102 are arranged in a direction (x-direction) orthogonal to the arrangement direction (y-direction) of the low-voltage die pad 91 and the high-voltage die pad 101. The number of the high-voltage leads 102 and the number of the low-voltage leads 92 may be changed in any manner.

In the present embodiment, the low-voltage die pad 91 is supported by the two low-voltage leads 92 integrated with the low-voltage die pad 91, and the high-voltage die pad 101 is supported by the two high-voltage leads 102 integrated with the high-voltage die pad 101. Thus, the die pads 91 and 101 do not include suspension leads exposed from the resin side surfaces 111 and 112. This allows for an increase in the insulation distance between the low-voltage lead frame 90 and the high-voltage lead frame 100.

The low-voltage circuit chip 60, the high-voltage circuit chip 70, and the capacitor chip 80 are separated from each other in the y-direction. In other words, in plan view, the low-voltage circuit chip 60, the high-voltage circuit chip 70, and the capacitor chip 80 are separated from each other in the arrangement direction of the die pads 91 and 101. In the present embodiment, the low-voltage circuit chip 60, the capacitor chip 80, and the high-voltage circuit chip 70 are arranged in this order from the resin side surface 113 toward the resin side surface 114 in the y-direction.

Since the leads 92 and 102 are arranged in the x-direction, the x-direction may also be referred to as the arrangement direction of the leads 92 and 102. The y-direction may also be referred to as a direction orthogonal to the arrangement direction of the leads 92 and 102 in plan view. In other words, the low-voltage circuit chip 60, the high-voltage circuit chip 70, and the capacitor chip 80 are separated from each other in the direction orthogonal to the arrangement direction of the leads 92 and 102 in plan view. In plan view, the low-voltage circuit chip 60, the capacitor chip 80, and the high-voltage circuit chip 70 are arranged in this order from the low-voltage leads 92 toward the high-voltage leads 102.

The low-voltage circuit chip 60 includes the low-voltage circuit 20 shown in FIG. 1. In plan view, the low-voltage circuit chip 60 is rectangular and has short sides and long sides. In plan view, the low-voltage circuit chip 60 is mounted on the low-voltage die pad 91 such that the long sides extend in the x-direction and the short sides extend in the y-direction. The low-voltage circuit chip 60 includes a chip main surface 60s and a chip back surface (not shown) facing opposite directions in the z-direction. The chip back surface of the low-voltage circuit chip 60 is bonded to the low-voltage die pad 91 by a conductive bonding material such as solder or silver (Ag) paste.

First electrode pads 61, second electrode pads 62, and third electrode pads 63 are formed on the chip main surface 60s of the low-voltage circuit chip 60. The electrode pads 61 to 63 are electrically connected to the low-voltage circuit 20 shown in FIG. 1.

The first electrode pads 61 are located on the chip main surface 60s between the center of the chip main surface 60s in the y-direction and the low-voltage leads 92. The first electrode pads 61 are arranged in the x-direction. The second electrode pads 62 are arranged on one of the opposite ends of the chip main surface 60s in the y-direction located closer to the capacitor chip 80. The second electrode pads 62 are arranged in the x-direction. The third electrode pads 63 are arranged on opposite ends of the chip main surface 60s in the x-direction.

The capacitor chip 80, the capacitor chip 80 includes the two capacitors 40A and 40B. More specifically, the two capacitors 40A and 40B are arranged in a single chip. In the present embodiment, as shown in FIG. 2, the capacitor chip 80 includes two capacitors 40A and two capacitors 40B. More specifically, the capacitor chip 80 shown in FIG. 2 has four transmission paths that transmit signals with the low-voltage circuit 20 and the high-voltage circuit 30 (refer to FIG. 1), which is different from the circuit diagram shown in FIG. 1. Alternatively, the capacitor chip 80 may have the two capacitors 40A and 40B as shown in the circuit diagram of FIG. 1.

In plan view, the capacitor chip 80 is rectangular and has short sides and long sides. In the present embodiment, in plan view, the capacitor chip 80 is mounted on the low-voltage die pad 91 such that the long sides extend in the x-direction and the short sides extend in the y-direction. The two capacitors 40A and the two capacitors 40B are separated from each other and arrange in the longitudinal direction of the capacitor chip 80 (in the present embodiment, x-direction). In other words, in plan view, the two capacitors 40A and the two capacitors 40B are arranged in a direction orthogonal to a direction in which the chips 60, 70, and 80 are arranged.

For the sake of convenience, the capacitors 40A and the capacitors 40B are alternately arranged in the x-direction. More specifically, one of the capacitors 40A is located closest to the resin side surface 113 of the encapsulation resin 110, and the capacitors and the capacitors 40B are alternately arranged in the x-direction.

The capacitor chip 80 is arranged adjacent to the low-voltage circuit chip 60 in the y-direction. In the present embodiment, the capacitor chip 80 is arranged closer to the high-voltage circuit chip 70 than the low-voltage circuit chip 60 is.

Figure 4:
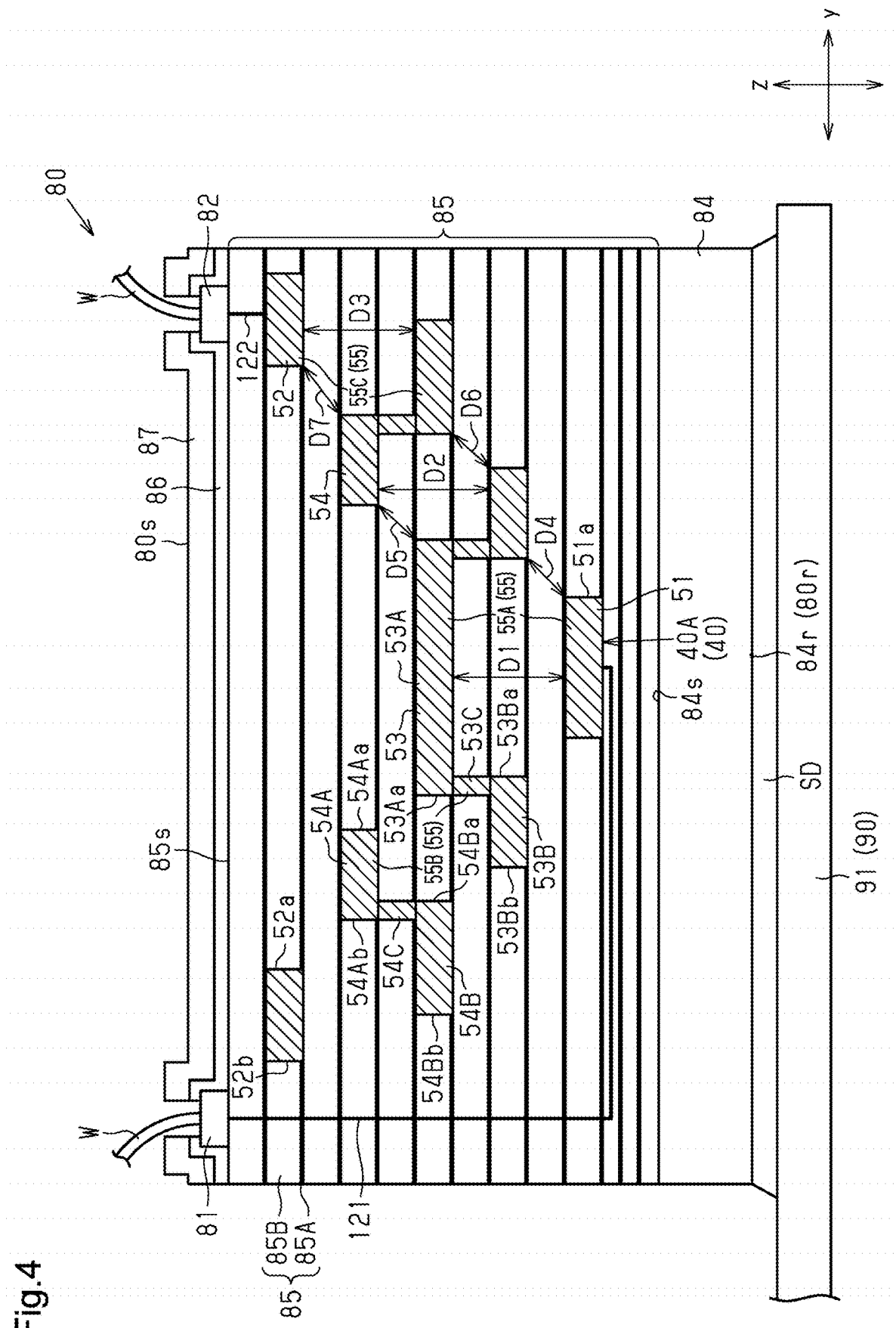
FIG. 4 is a schematic cross-sectional view of the capacitor chip shown in FIG. 2.

As shown in FIG. 4, the capacitor chip 80 includes a chip main surface 80s and a chip back surface 80r facing in opposite directions in the z-direction. The chip main surface and the chip main surface 60s (refer to FIG. 2) of the low-voltage circuit chip 60 face in the same direction. The chip back surface 80r and the chip back surface of the low-voltage circuit chip 60 face in the same direction. The chip back surface 80r of the capacitor chip 80 is bonded to the low-voltage die pad 91 by a conductive bonding material SD.

As shown in FIG. 2, first electrode pads 81 and second electrode pads 82 are formed on the chip main surface 80s of the capacitor chip 80. The first electrode pads 81 are located, for example, on one of the opposite ends of the chip main surface 80s in the y-direction located closer to the low-voltage circuit chip 60. The first electrode pads 81 are arranged in the x-direction. The second electrode pads 82 are located on one of the opposite ends of the chip main surface 80s in the y-direction located closer to the high-voltage circuit chip 70. The second electrode pads 82 are arranged in the x-direction.

The lead frames 90 and 100 are closest to each other at the low-voltage die pad 91 and the high-voltage die pad 101. Therefore, the low-voltage die pad 91 and the high-voltage die pad 101 need to be separated from each other by a predetermined distance or more so that the gate driver 10 has a predetermined insulation voltage. Hence, in plan view, the distance between the high-voltage circuit chip 70 and the capacitor chip 80 is greater than the distance between the low-voltage circuit chip 60 and the capacitor chip 80.

The first electrode 41A of the capacitor 40A and the first electrode 41B of the capacitor 40B are separately electrically connected to the first electrode pads 81. The second electrode 42A of the capacitor 40A and the second electrode 42B of the capacitor 40B are separately electrically connected to the second electrode pads 82.

As shown in FIG. 2, the high-voltage circuit chip 70 includes the high-voltage circuit 30 (refer to FIG. 1). In plan view, the high-voltage circuit chip 70 is rectangular and has short sides and long sides. In plan view, the high-voltage circuit chip 70 is mounted on the high-voltage die pad 101 such that the long sides extend in the x-direction and the short sides extend in the y-direction. The high-voltage circuit chip 70 includes a chip main surface 70s and a chip back surface (not shown) facing opposite directions in the z-direction. The chip main surface 70s and the chip main surface 80s of the capacitor chip 80 face in the same direction. The chip back surface of the high-voltage circuit chip 70 and the chip back surface of the capacitor chip 80 (refer to FIG. 4) face in the same direction. The chip back surface of the high-voltage circuit chip 70 is bonded to the high-voltage die pad 101 by a conductive bonding material.

As shown in FIG. 2, first electrode pads 71, second electrode pads 72, and third electrode pads 73 are formed on the chip main surface 70s of the high-voltage circuit chip 70. The first electrode pads 71 are located on one of the opposite ends of the chip main surface in the y-direction located closer to the capacitor chip 80. The first electrode pads 71 are arranged in the x-direction. The second electrode pads 72 are located on one of the opposite ends of the chip main surface 70s in the y-direction located farther away from the capacitor chip 80. The second electrode pads 72 are arranged in the x-direction. The third electrode pads 73 are arranged on opposite ends of the chip main surface 70s in the x-direction. The electrode pads 71 to 73 are electrically connected to the high-voltage circuit 30 (refer to FIG. 1) in the high-voltage circuit chip 70.

Wires W are connected to each of the low-voltage circuit chip 60, the capacitor chip 80, and the high-voltage circuit chip 70. Each of the wires W is a bonding wire formed by a wire bonder and is, for example, formed from a conductor such as gold (Au), aluminum (Al), or Cu.

The low-voltage circuit chip 60 is electrically connected to the low-voltage lead frame 90 by wires W. More specifically, the first electrode pads 61 of the low-voltage circuit chip 60 are connected to the low-voltage leads 92 by wires W. The third electrode pads 63 of the low-voltage circuit chip 60 are connected by wires W to the two low-voltage leads 92 integrated with the low-voltage die pad 91. Thus, the low-voltage circuit 20 (refer to FIG. 1) is electrically connected to the low-voltage leads 92 (external electrodes of the gate driver 10 that are electrically connected to the ECU 503). In the present embodiment, the two low-voltage leads 92 integrated with the low-voltage die pad 91 include a ground terminal, and the wires W electrically connect the low-voltage circuit 20 to the low-voltage die pad 91. Thus, the low-voltage die pad 91 has the same potential as the ground of the low-voltage circuit 20.

The low-voltage circuit chip 60 and the capacitor chip 80 are electrically connected by wires W. More specifically, the second electrode pads 62 of the low-voltage circuit chip and the first electrode pads 81 of the capacitor chip 80 are connected by the wires W. Thus, the low-voltage circuit 20 is electrically connected to the first electrodes 41A and 41B of the capacitors 40A and 40B (refer to FIG. 1).

The capacitor chip 80 and the high-voltage circuit chip 70 are electrically connected by wires W. More specifically, the second electrode pads 82 of the capacitor chip 80 and the first electrode pads 71 of the high-voltage circuit chip 70 are connected by the wires W. Thus, the second electrode 42A of the capacitor 40A is electrically connected to the high-voltage circuit 30 (refer to FIG. 1). The second electrode 42B of the capacitor 40B is electrically connected to the high-voltage circuit 30 (refer to FIG. 1).

The high-voltage circuit chip 70 and the high-voltage leads 102 of the high-voltage lead frame 100 are electrically connected by wires W. More specifically, the second electrode pads 72 and the third electrode pads 73 of the high-voltage circuit chip 70 are connected to the high-voltage leads 102 by the wires W. Thus, the high-voltage circuit 30 is electrically connected to the high-voltage leads 102 (external electrodes of the gate driver 10 that are electrically connected to the inverter device 500 such as the switching element 501). In the present embodiment, the two high-voltage leads 102 integrated with the high-voltage die pad 101 include a ground terminal, and the wires W electrically connect the high-voltage circuit 30 and the high-voltage die pad 101. Thus, the high-voltage die pad 101 has the same potential as the ground of the high-voltage circuit 30.

Structure of Capacitor Chip

Figure 3:
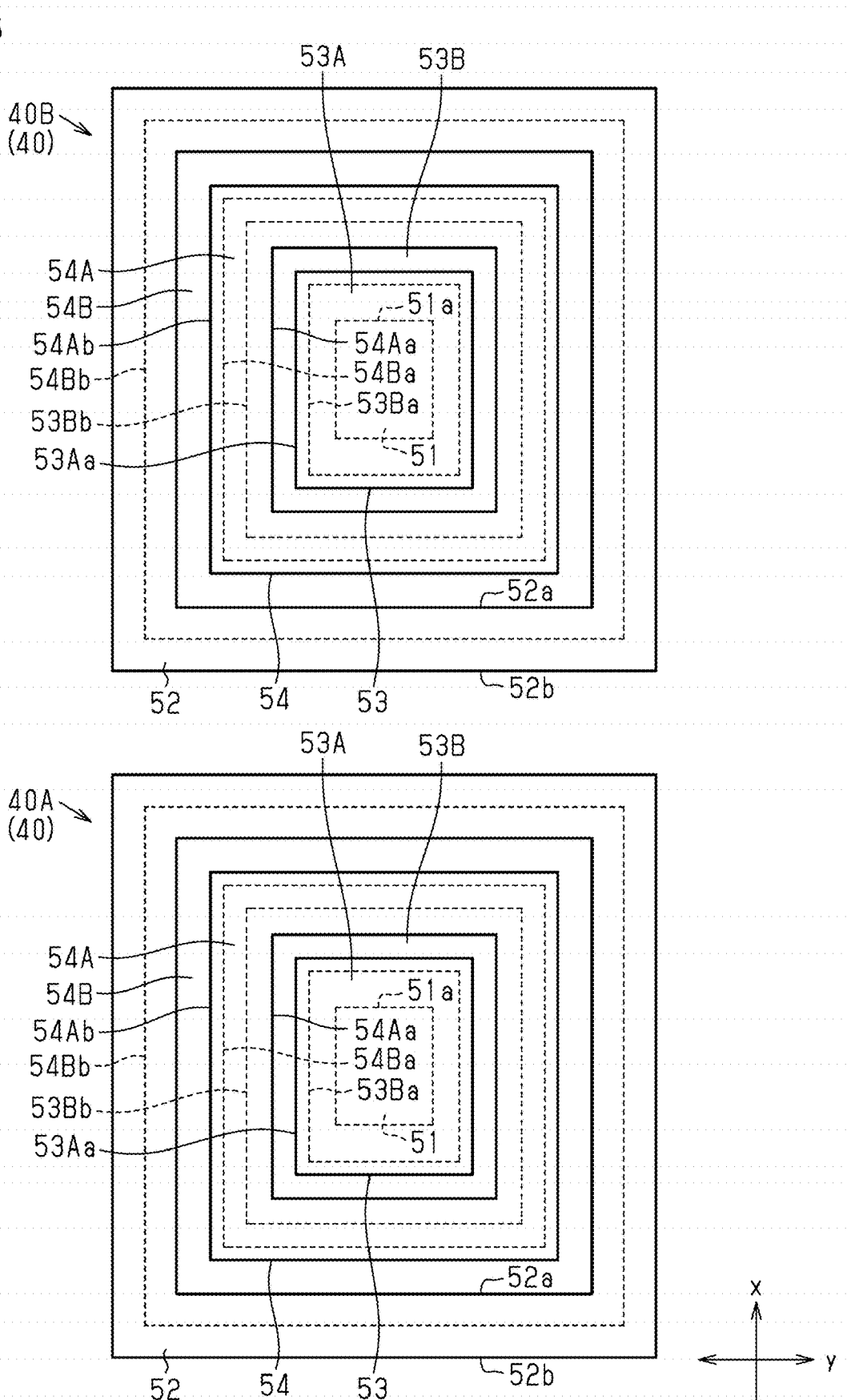
FIG. 3 is a schematic plan view of a capacitor in a capacitor chip in the gate driver shown in FIG. 2.

The structure of the capacitor chip 80 will be described in detail with reference to FIGS. 3 and 4. The structure of the capacitor 40B is the same as that of the capacitor 40A and thus will not be described in detail. In the following description, a direction from the chip back surface 80r of the capacitor chip 80 toward the chip main surface 80s is referred to as an upward direction, and a direction from the chip main surface 80s toward the chip back surface 80r is referred to as a downward direction. FIG. 3 is a schematic plan view showing the positional relationship of the capacitors 40A and 40B in the capacitor chip 80. FIG. 4 is a cross-sectional view of the capacitor 40A taken along a plane extending in the y-direction and the z-direction. FIG. 4 partially does not show hatching for simplicity and clarity.

As described above, the capacitor chip 80 includes the two capacitors 40A and 40B. More specifically, the two capacitors 40A and 40B are arranged in a single chip. More specifically, the capacitor chip 80 is a semiconductor chip that is separate from the low-voltage circuit chip 60 and the high-voltage circuit chip 70 (refer to FIG. 2) and is dedicated to the capacitors 40A and 40B.

As shown in FIG. 4, the capacitor chip 80 includes a substrate 84 and an insulation layer 85 disposed on the substrate 84.

The substrate 84 is formed of, for example, a semiconductor substrate. In the present embodiment, the substrate 84 is formed from a material containing silicon (Si). As the semiconductor substrate, a wide-bandgap semiconductor or a compound semiconductor may be used for the substrate 84. Alternatively, instead of using the semiconductor substrate, an insulating substrate formed from a glass-containing material may be used for the substrate 84.

The wide-bandgap semiconductor is a semiconductor substrate having a band gap that is greater than or equal to 2.0 eV. The wide-bandgap semiconductor may be silicon carbide (SiC). The compound semiconductor may be a group III-V compound semiconductor. The compound semiconductor may include at least one of aluminum nitride (AlN), indium nitride (InN), gallium nitride (GaN), and gallium arsenide (GaAs).

The substrate 84 includes a substrate main surface 84s and a substrate back surface 84r facing opposite directions in the z-direction. The substrate back surface 84r defines the chip back surface 80r of the capacitor chip 80.

In the present embodiment, multiple insulation layers 85 are stacked on the substrate main surface 84s of the substrate 84 in the z-direction. Thus, the z-direction may be referred to as a thickness-wise direction of the insulation layers 85. The insulation layers 85 are formed on the substrate main surface 84s of the substrate 84. In the present embodiment, the total thickness of the insulation layers 85 is greater than the thickness of the substrate 84. The number of the insulation layers 85 stacked is set in accordance with an insulation voltage required of the capacitor chip 80. Therefore, the total thickness of the insulation layers 85 may be smaller than the thickness of the substrate 84 depending on the number of the insulation layers 85 stacked.

Each insulation layer 85 includes a first insulation film 85A and a second insulation film 85B formed on the first insulation film 85A.

The first insulation film 85A is, for example, an etching stopper film, and is formed from a material including silicon nitride (SiN), SiC, nitrogen-added silicon carbide (SiCN), or the like. In the present embodiment, the first insulation film 85A is formed from a material including SiN. The second insulation film 85B is, for example, an interlayer insulation film and is an oxide film formed from a material including, for example, silicon oxide ($SiO_2$). As shown in FIG. 4, the second insulation film 85B is greater in thickness than the first insulation film 85A. The thickness of the first insulation film 85A may be in a range of 100 nm to 1000 nm. The thickness of the second insulation film 85B may be in a range of 1000 nm to 3000 nm. In the present embodiment, the thickness of the first insulation film 85A, is, for example, approximately 300 nm, and the thickness of the second insulation film 85B, is, for example, approximately 2000 nm.

The first electrode pads 81 and the second electrode pads 82 are arranged on a surface 85s of the insulation layers 85. In the present embodiment, the surface 85s of the insulation layers 85 is the surface of the uppermost the insulation layer 85 among the insulation layers 85 stacked in the z-direction. The first electrode pads 81 and the second electrode pads 82 are each formed from a material including, for example, Al.

The capacitor chip 80 further includes a protection film 86 formed on the surface 85s of the insulation layers 85 and a passivation film 87 formed on the protection film 86. The protection film 86 is configured to protect the insulation layers 85 and is formed of, for example, a silicon oxide film. The passivation film 87 is a surface protection film of the capacitor chip 80 and is formed of, for example, a silicon nitride film. The passivation film 87 defines the chip main surface 80s of the capacitor chip 80.

The first electrode pads 81 and the second electrode pads 82 are covered by the protection film 86 and the passivation film 87. The protection film 86 and the passivation film 87 include openings that expose the first electrode pads 81 and the second electrode pads 82. This forms an exposed surface on each of the electrode pads 81 and 82 for connecting a wire W.

The capacitor 40A includes a first electrode portion 51 electrically connected to the first electrode pad 81, a second electrode portion 52 electrically connected to the second electrode pad 82, and intermediate electrode portions 53 and 54 that are not connected to the first electrode portion 51 and the second electrode portion 52. The capacitor 40A include capacitor cells 55 formed of the electrodes 51 and 52 and the intermediate electrode portions 53 and 54. The capacitor 40A is formed by coupling the first electrode portion 51 and the second electrode portion 52 through the intermediate electrode portions 53 and 54. In other words, the intermediate electrode portions 53 and 54 are electrically floating such that the intermediate electrode portions 53 and 54 are not fixed at an electric potential that is applied to the first electrode portion 51 and the second electrode portion 52.

The first electrode portion 51 is configured as the first electrode 41A of the capacitor 40A (refer to FIG. 1). The second electrode portion 52 is configured as the second electrode 42A of the capacitor 40A (refer to FIG. 1). In the present embodiment, the capacitor 40A includes multiple intermediate electrode portions. In the description hereafter, the intermediate electrode portion 53 is referred to as "first intermediate electrode portion 53." The intermediate electrode portion 54 is referred to as "second intermediate electrode portion 54."

The first electrode portion 51, the second electrode portion 52, and the intermediate electrode portions 53 and 54 are formed from, for example, the same metal material. The metal material forming the first electrode portion 51, the second electrode portion 52, and the intermediate electrode portions 53 and 54 includes one of Cu, Al, titanium (Ti), and a tungsten (W). In the present embodiment, the metal material forming the first electrode portion 51, the second electrode portion 52, and the intermediate electrode portions 53 and 54 includes Cu.

The first electrode portion 51, the second electrode portion 52, and the intermediate electrode portions 53 and 54 are arranged in the insulation layers 85. The first electrode portion 51, the second electrode portion 52, and the intermediate electrode portions 53 and 54 partially differ from each other in position in the z-direction.

The first electrode portion 51, the second electrode portion 52, and the intermediate electrode portions 53 and 54 are located in the insulation layers 85 at different positions in the z-direction. In other words, the first electrode portion 51, the second electrode portion 52, and the intermediate electrode portions 53 and 54 each have a portion located in the insulation layers 85 at a position in the z-direction differing from the others of the first electrode portion 51, the second electrode portion 52, and the intermediate electrode portions 53 and 54.

The first electrode portion 51 is located closer to the substrate 84 than the second electrode portion 52 and the intermediate electrode portions 53 and 54 are in the z-direction. The first electrode portion 51 is separated from the substrate 84 in the z-direction. Thus, the insulation layer 85 is arranged between the first electrode portion 51 and the substrate 84 in the z-direction.

The second electrode portion 52 is located farther away from the substrate 84 than the first electrode portion 51 and the intermediate electrode portions 53 and 54 are in the z-direction. The second electrode portion 52 is located closer to the substrate 84 than the surface 85s of the insulation layers 85 is in the z-direction. In the present embodiment, the second electrode portion 52 is arranged in the insulation layer 85 located directly below the uppermost one of the insulation layers 85.

In the present embodiment, the intermediate electrode portions 53 and 54 are arranged between the first electrode portion 51 and the second electrode portion 52 in the z-direction. The first intermediate electrode portion 53 is arranged between the first electrode portion 51 and the second intermediate electrode portion 54 in the z-direction. The second intermediate electrode portion 54 is arranged between the first intermediate electrode portion 53 and the second electrode portion 52 in the z-direction.

As shown in FIG. 3, in the present embodiment, as viewed in the z-direction, the first electrode portion 51 is rectangular such that the long sides extend in the longitudinal direction of the capacitor chip 80 (x-direction) and the short sides extend in the lateral direction of the capacitor chip 80 (y-direction). In plan view, the first electrode portion 51 is arranged, for example, in the center of the capacitor chip 80 in the y-direction. As shown in FIG. 4, in the present embodiment, the thickness of the first electrode portion 51 (dimension of the first electrode portion 51 in the z-direction) is equal to the thickness of the insulation layer 85 (dimension of the insulation layer 85 in the z-direction). The thickness of the insulation layer 85 refers to the total thickness of the thickness of the first insulation film 85A (dimension of the first insulation film 85A in the z-direction) and the thickness of the second insulation film 85B (dimension of the second insulation film 85B in the z-direction). When the difference in thickness between the first electrode portion 51 and the insulation layer 85 is, for example, within 20% of the thickness of the first electrode portion 51, it is considered that the thickness of the first electrode portion 51 is equal to the thickness of the insulation layer 85.

As shown in FIG. 4, the first electrode portion 51 is electrically connected to the first electrode pad 81 by a first interconnect 121. The first interconnect 121 is arranged in the insulation layers 85 to connect the first electrode portion 51 and the first electrode pad 81. Thus, the first electrode portion 51 and the first electrode pad 81 are electrically connected in the capacitor chip 80. In other words, the first electrode portion 51 and the first electrode pad 81 are electrically connected in the insulation layers 85.

The first intermediate electrode portion 53 is opposed to the first electrode portion 51 in the z-direction. The first intermediate electrode portion 53 includes a first upper electrode layer 53A and a first lower electrode layer 53B located at different positions in the z-direction. The first intermediate electrode portion 53 further includes a first connector 53C connecting the first upper electrode layer 53A and the first lower electrode layer 53B. In the present embodiment, the first upper electrode layer 53A corresponds to "first intermediate layer of first intermediate electrode portion." The first lower electrode layer 53B corresponds to "second intermediate layer of first intermediate electrode portion."

The first upper electrode layer 53A is opposed to the first electrode portion 51 in the z-direction. The insulation layers 85 are arranged between the first upper electrode layer 53A and the first electrode portion 51. In the present embodiment, three insulation layers 85 are arranged between the first upper electrode layer 53A and the first electrode portion 51. The first upper electrode layer 53A and the first electrode portion 51 form a first capacitor cell 55A, which is one of the capacitor cells 55.

As shown in FIG. 3, as viewed in the z-direction, the first upper electrode layer 53A is rectangular such that the long sides extend in the longitudinal direction of the capacitor chip 80 (x-direction) and the short sides extend in the lateral direction of the capacitor chip 80 (y-direction). In plan view, the first upper electrode layer 53A is arranged, for example, in the center of the capacitor chip 80 in the y-direction. In the present embodiment, the first upper electrode layer 53A is larger than the first electrode portion 51 in the dimension in the y-direction. The first upper electrode layer 53A is larger than the first electrode portion 51 in the dimension in the x-direction. Thus, in plan view, the first upper electrode layer 53A covers the entire first electrode portion 51. As shown in FIG. 4, the thickness of the first upper electrode layer 53A (dimension of the first upper electrode layer 53A in the z-direction) is equal to the thickness of the insulation layer 85. When the difference in thickness between the first upper electrode layer 53A and the insulation layer 85 is, for example, within 20% of the thickness of the first upper electrode layer 53A, it is considered that the thickness of the first upper electrode layer 53A is equal to the thickness of the insulation layer 85.

As shown in FIG. 3, in plan view, the first lower electrode layer 53B has the form of a rectangular ring such that the long sides extend in the longitudinal direction of the capacitor chip 80 (the x-direction) and the short sides extend in the lateral direction of the capacitor chip 80 (the y-direction).

In plan view, the first lower electrode layer 53B includes a portion that differs in position from the first upper electrode layer 53A. In other words, in plan view, the first lower electrode layer 53B includes a portion extending outward from the first upper electrode layer 53A. More specifically, an inner surface 53Ba of the first lower electrode layer 53B is located inward from an outer surface 53Aa of the first upper electrode layer 53A. The outer surface 53Bb of the first lower electrode layer 53B is located outward from an outer surface 53Aa of the first upper electrode layer 53A. In other words, in plan view, the first lower electrode layer 53B surrounds the first upper electrode layer 53A.

In plan view, the first lower electrode layer 53B and the first electrode portion 51 are located at different positions. More specifically, the inner surface 53Ba of the first lower electrode layer 53B is located outward from an outer surface 51a of the first electrode portion 51. Thus, in plan view, the first lower electrode layer 53B is located at a position that does not overlap the first electrode portion 51 and surrounds the first electrode portion 51.

As shown in FIG. 4, in the present embodiment, the first lower electrode layer 53B and the first electrode portion 51 are located at different positions in the z-direction. More specifically, the first lower electrode layer 53B is located closer to the first upper electrode layer 53A than the first electrode portion 51 is in the z-direction. The first lower electrode layer 53B is located closer to the first electrode portion 51 than the first upper electrode layer 53A is in the z-direction. In other words, the first lower electrode layer 53B is located between the first upper electrode layer 53A and the first electrode portion 51 in the z-direction. In the present embodiment, one insulation layer 85 is arranged between the first lower electrode layer 53B and the first electrode portion 51 in the z-direction. One insulation layer 85 is arranged between the first lower electrode layer 53B and the first upper electrode layer 53A in the z-direction.

The thickness of the first lower electrode layer 53B (dimension of the first lower electrode layer 53B in the z-direction) is equal to the thickness of the insulation layer 85. When the difference in thickness between the first lower electrode layer 53B and the insulation layer 85 is, for example, within 20% of the thickness of the first lower electrode layer 53B, it is considered that the thickness of the first lower electrode layer 53B is equal to the thickness of the insulation layer 85.

As shown in FIG. 4, the first connector 53C extends in the z-direction. In the present embodiment, in plan view, the first connector 53C has the form of a rectangular ring such that the long sides extend in the longitudinal direction of the capacitor chip 80 (the x-direction) and the short sides extend in the lateral direction of the capacitor chip 80 (the y-direction). The first connector 53C connects portions of the first upper electrode layer 53A and the first lower electrode layer 53B that are opposed to each other in the z-direction. Thus, in plan view, the first connector 53C is arranged to overlap both the first upper electrode layer 53A and the first lower electrode layer 53B. In the present embodiment, an outer peripheral end of the first upper electrode layer 53A is opposed to an inner peripheral end of the first lower electrode layer 53B in the z-direction. Thus, the first connector 53C is in contact with the outer peripheral end of the first upper electrode layer 53A and the inner peripheral end of the first lower electrode layer 53B. Thus, the first intermediate electrode portion 53 has steps formed of the first upper electrode layer 53A, the first lower electrode layer 53B, and the first connector 53C.

As shown in FIG. 4, the second intermediate electrode portion 54 is opposed to the first intermediate electrode portion 53 in the z-direction. The second intermediate electrode portion 54 includes a second upper electrode layer 54A and a second lower electrode layer 54B located at different positions in the z-direction. The second intermediate electrode portion 54 further includes a second connector 54C connecting the second upper electrode layer 54A and the second lower electrode layer 54B. In the present embodiment, the second upper electrode layer 54A corresponds to "first intermediate layer of second intermediate electrode portion." The second lower electrode layer 54B corresponds to "second intermediate layer of second intermediate electrode portion."

As shown in FIG. 3, as viewed in the z-direction, the second upper electrode layer 54A has the form of a rectangular ring such that the long sides extend in the longitudinal direction of the capacitor chip 80 (x-direction) and the short sides extend in the lateral direction of the capacitor chip 80 (y-direction).

The second upper electrode layer 54A is shifted from the first lower electrode layer 53B. More specifically, an inner surface 54Aa of the second upper electrode layer 54A is located outward from the inner surface 53Ba of the first lower electrode layer 53B and inward from the outer surface 53Bb of the first lower electrode layer 53B. An outer surface 54Ab of the second upper electrode layer 54A is located outward from the outer surface 53Bb of the first lower electrode layer 53B. Thus, in plan view, an inner peripheral portion of the second upper electrode layer 54A overlaps an outer peripheral portion of the first lower electrode layer 53B. In other words, in plan view, the second upper electrode layer 54A surrounds the first lower electrode layer 53B.

In plan view, the second upper electrode layer 54A is shifted from the first upper electrode layer 53A. In plan view, the second upper electrode layer 54A is located outward from the first upper electrode layer 53A. More specifically, the inner surface 54Aa of the second upper electrode layer 54A is located outward from the outer surface 53Aa of the first upper electrode layer 53A. In other words, in plan view, the second upper electrode layer 54A does not overlap the first upper electrode layer 53A. In plan view, the second upper electrode layer 54A surrounds the first upper electrode layer 53A.

As shown in FIG. 4, the second upper electrode layer 54A is opposed to the first lower electrode layer 53B in the z-direction. The second upper electrode layer 54A is located above the first lower electrode layer 53B. In other words, the second upper electrode layer 54A is located farther away from the substrate 84 than the first lower electrode layer 53B is or is located closer to the surface 85s of the insulation layers 85 than the first lower electrode layer 53B is. The insulation layers 85 are arranged between the second upper electrode layer 54A and the first lower electrode layer 53B. In the present embodiment, three insulation layers 85 are arranged between the second upper electrode layer 54A and the first lower electrode layer 53B. The second upper electrode layer 54A and the first lower electrode layer 53B form a second capacitor cell 55B, which is one of the capacitor cells 55. Since the first lower electrode layer 53B is electrically connected to the first upper electrode layer 53A by the first connector 53C, the second capacitor cell 55B is connected in series to the capacitor cell 55A through the first connector 53C.

In the first intermediate electrode portion 53, the first lower electrode layer 53B is located farther away from the surface 85s of the insulation layers 85 than the first upper electrode layer 53A is. This increases a separation distance D2 between the first lower electrode layer 53B and the second upper electrode layer 54A.

The thickness of the second upper electrode layer 54A (dimension of the second upper electrode layer 54A in the z-direction) is equal to the thickness of the insulation layer 85. When the difference in thickness between the second upper electrode layer 54A and the insulation layer 85 is, for example, within 20% of the thickness of the second upper electrode layer 54A, it is considered that the thickness of the second upper electrode layer 54A is equal to the thickness of the insulation layer 85.

As shown in FIG. 3, in plan view, the second lower electrode layer 54B has the form of a rectangular ring such that the long sides extend in the longitudinal direction of the capacitor chip 80 (the x-direction) and the short sides extend in the lateral direction of the capacitor chip 80 (the y-direction).

In plan view, the second lower electrode layer 54B includes a portion that differs in position from the second upper electrode layer 54A. In other words, in plan view, the second lower electrode layer 54B includes a portion extending outward from the second upper electrode layer 54A. More specifically, an inner surface 54Ba of the second lower electrode layer 54B is located outward from the inner surface 54Aa of the second upper electrode layer 54A and inward from the outer surface 54Ab of the second upper electrode layer 54A. An outer surface 54Bb of the second lower electrode layer 54B is located outward from the outer surface 54Ab of the second upper electrode layer 54A. Thus, in plan view, an inner peripheral portion of the second lower electrode layer 54B overlaps an inner peripheral portion of the second upper electrode layer 54A. In other words, in plan view, the second lower electrode layer 54B surrounds the second upper electrode layer 54A.

In plan view, the second lower electrode layer 54B and the first lower electrode layer 53B are located at different positions. More specifically, the inner surface 54Ba of the second lower electrode layer 54B is located outward from the outer surface 53Bb of the first lower electrode layer 53B. In other words, in plan view, the second lower electrode layer 54B does not overlap the first lower electrode layer 53B. In plan view, the second lower electrode layer 54B surrounds the first lower electrode layer 53B.

The second lower electrode layer 54B and the first lower electrode layer 53B are located at different positions in the z-direction. More specifically, the second lower electrode layer 54B is located closer to the second upper electrode layer 54A than the first lower electrode layer 53B is in the z-direction. The second lower electrode layer 54B is located closer to the first lower electrode layer 53B than the second upper electrode layer 54A is in the z-direction. In other words, the second lower electrode layer 54B is located between the second upper electrode layer 54A and the first lower electrode layer 53B in the z-direction. In the present embodiment, one insulation layer 85 is arranged between the second lower electrode layer 54B and the first lower electrode layer 53B in the z-direction. One insulation layer 85 is arranged between the second lower electrode layer 54B and the second upper electrode layer 54A in the z-direction. As shown in FIG. 4, in the present embodiment, the second lower electrode layer 54B is aligned with the first upper electrode layer 53A in the z-direction. That is, the second lower electrode layer 54B and the first upper electrode layer 53A are arranged in the same insulation layer 85.

The thickness of the second lower electrode layer 54B (dimension of the second lower electrode layer 54B in the z-direction) is equal to the thickness of the respective insulation layer 85. When the difference in thickness between the second lower electrode layer 54B and the insulation layer 85 is, for example, within 20% of the thickness of the second lower electrode layer 54B, it is considered that the thickness of the second lower electrode layer 54B is equal to the thickness of the insulation layer 85.

As shown in FIG. 4, the second connector 54C extends in the z-direction. In the present embodiment, in plan view, the second connector 54C has the form of a rectangular ring such that the long sides extend in the longitudinal direction of the capacitor chip 80 (the x-direction) and the short sides extend in the lateral direction of the capacitor chip 80 (the y-direction). The second connector 54C connects portions of the second upper electrode layer 54A and the second lower electrode layer 54B that are opposed to each other in the z-direction. Thus, in plan view, the second connector 54C is arranged to overlap both the second upper electrode layer 54A and the second lower electrode layer 54B. In the present embodiment, an outer peripheral end of the second upper electrode layer 54A is opposed to an inner peripheral end of the second lower electrode layer 54B in the z-direction. Thus, the second connector 54C is in contact with the outer peripheral end of the second upper electrode layer 54A and the inner peripheral end of the second lower electrode layer 54B. Thus, the second intermediate electrode portion 54 has steps formed of the second upper electrode layer 54A, the second lower electrode layer 54B, and the second connector 54C.

As shown in FIG. 3, in plan view, the second electrode portion 52 has the form of a rectangular ring such that the long sides extend in the longitudinal direction of the capacitor chip 80 (the x-direction) and the short sides extend in the lateral direction of the capacitor chip 80 (the y-direction).

In plan view, the second electrode portion 52 includes a portion that differs in position from the second lower electrode layer 54B. In other words, in plan view, the second electrode portion 52 includes a portion extending outward from the second lower electrode layer 54B. More specifically, an inner surface 52a of the second electrode portion 52 is located outward from the inner surface 54Ba of the second lower electrode layer 54B and inward from the outer surface 54Bb of the second lower electrode layer 54B. An outer surface 52b of the second electrode portion 52 is located outward from the outer surface 54Bb of the second lower electrode layer 54B. Thus, an inner peripheral portion of the second electrode portion 52 overlaps an outer peripheral portion of the second lower electrode layer 54B. In plan view, the second electrode portion 52 surrounds the second lower electrode layer 54B.

In plan view, the second electrode portion 52 and the second upper electrode layer 54A are located at different positions. More specifically, the inner surface 52a of the second electrode portion 52 is located outward from the outer surface 54Ab of the second upper electrode layer 54A. In other words, in plan view, the second electrode portion 52 does not overlap the second upper electrode layer 54A. In plan view, the second electrode portion 52 surrounds the second upper electrode layer 54A.

As shown in FIG. 4, the second electrode portion 52 is opposed to the second intermediate electrode portion 54 in the z-direction. More specifically, the second electrode portion 52 is opposed to the second lower electrode layer 54B. The second electrode portion 52 is located above the second lower electrode layer 54B. In other words, the second electrode portion 52 is located farther away from the substrate 84 than the second lower electrode layer 54B is or is located closer to the surface 85s of the insulation layers 85 than the second lower electrode layer 54B is. The second lower electrode layer 54B is located above the first lower electrode layer 53B. The second lower electrode layer 54B is located between the first lower electrode layer 53B and the second electrode portion 52 in the z-direction.

The insulation layers 85 are arranged between the second electrode portion 52 and the second lower electrode layer 54B. In the present embodiment, the second electrode portion 52 is located above the second lower electrode layer 54B with three insulation layers 85 arranged between the second electrode portion 52 and the second lower electrode layer 54B. The second electrode portion 52 and the second lower electrode layer 54B form a third capacitor cell 55C, which is one of the capacitor cells 55. Since the second lower electrode layer 54B is electrically connected to the second upper electrode layer 54A by the second connector 54C, the third capacitor cell 55C is connected in series to the second capacitor cell 55B through the second connector 54C.

The second lower electrode layer 54B of the second intermediate electrode portion 54 is located farther away from the surface 85s of the insulation layers 85 than the second upper electrode layer 54A is. This increases a separation distance D3 between the second lower electrode layer 54B and the second electrode portion 52.

In the present embodiment, the second electrode portion 52 is located above the second upper electrode layer 54A. The second electrode portion 52 is located farther away from the substrate 84 than the second upper electrode layer 54A is or is located closer to the surface 85s of the insulation layers 85 than the second upper electrode layer 54A. In the present embodiment, the second electrode portion 52 is located above the second upper electrode layer 54A with one insulation layer 85 arranged between the second electrode portion 52 and the second upper electrode layer 54A.

The thickness of the second electrode portion 52 (dimension of the second electrode portion 52 in the z-direction) is equal to the thickness of the insulation layers 85. When the difference in thickness between the second electrode portion 52 and the insulation layer 85 is, for example, within 20% of the thickness of the second electrode portion 52, it is considered that the thickness of the second electrode portion 52 is equal to the thickness of the insulation layer 85.

In the present embodiment, in plan view, the second electrode portion 52 overlaps the second electrode pad 82. More specifically, the inner surface 52a of the second electrode portion 52 is located inward from the second electrode pad 82, and the outer surface 52b of the second electrode portion 52 is located outward from the second electrode pad 82. Therefore, in plan view, the second electrode portion 52 overlaps the entire second electrode pad 82.

The second electrode portion 52 is electrically connected to the second electrode pad 82 by a second interconnect 122. The second interconnect 122 is arranged in the insulation layers 85 to connect the second electrode portion 52 and the second electrode pad 82. Thus, the second electrode portion 52 and the second electrode pad 82 are electrically connected in the capacitor chip 80.

The positional relationship of the first electrode portion 51, the second electrode portion 52, and the intermediate electrode portions 53 and 54 in the z-direction will be summarized as follows.

The first electrode portion 51 is located closer to the substrate 84 than the second electrode portion 52 and the intermediate electrode portions 53 and 54 are. In other words, the first electrode portion 51 is located farther away from the surface 85s of the insulation layers 85 than the second electrode portion 52 and the intermediate electrode portions 53 and 54 are.

The first lower electrode layer 53B of the first intermediate electrode portion 53 is arranged between the first electrode portion 51 and the second lower electrode layer 54B of the second intermediate electrode portion 54 in the z-direction.

The first upper electrode layer 53A of the first intermediate electrode portion 53 is arranged between the first lower electrode layer 53B and the second upper electrode layer 54A of the second intermediate electrode portion 54 in the z-direction.

The second upper electrode layer 54A is arranged between the second lower electrode layer 54B and the second electrode portion 52 in the z-direction. In other words, the second upper electrode layer 54A is arranged between the first upper electrode layer 53A and the second electrode portion 52 in the z-direction.

The second lower electrode layer 54B is arranged between the second upper electrode layer 54A and the first lower electrode layer 53B in the z-direction.

The second electrode portion 52 is located farther away from the substrate 84 than the first electrode portion 51 and the intermediate electrode portions 53 and 54 are. In other words, the second electrode portion 52 is located closer to the surface 85s of the insulation layers 85 than the first electrode portion 51 and the intermediate electrode portions 53 and 54 are. Thus, the second electrode portion 52 is located closer to the surface 85s of the insulation layers 85 than the second upper electrode layer 54A is.

In the capacitor 40A having the structure described above, a total value (D1+D2+D3) of a separation distance D1 between the first electrode portion 51 and the first upper electrode layer 53A in the z-direction, the separation distance D2 between the first lower electrode layer 53B and the second upper electrode layer 54A in the z-direction, and the separation distance D3 between the second lower electrode layer 54B and the second electrode portion 52 in the z-direction is greater than a distance between the first electrode portion 51 and the second electrode portion 52 in the z-direction. In addition, the total value (D1+D2+D3) may be greater than the thickness of the insulation layers 85. The thickness of the insulation layers 85 refers to a distance from the substrate main surface 84s to the surface 85s of the insulation layers 85 in the z-direction.

In the present embodiment, the layout and the size of the first electrode portion 51, the second electrode portion 52, the first intermediate electrode portion 53, and the second intermediate electrode portion 54 are set so that the capacitance of the capacitor cell 55A, the capacitance of the second capacitor cell 55B, and the capacitance of the third capacitor cell 55C are equal to each other. More specifically, the opposing area of the first electrode portion 51 and the first upper electrode layer 53A of the first intermediate electrode portion 53, the separation distance D1, the opposing area of the first lower electrode layer 53B and the second upper electrode layer 54A of the second intermediate electrode portion 54, the separation distance D2, the opposing area of the second lower electrode layer 54B and the second electrode portion 52, and the separation distance D3 are set so that the capacitance of the capacitor cell 55A, the capacitance of the second capacitor cell 55B, and the capacitance of the third capacitor cell 55C are equal to each other.

In an example, the separation distance D1 between the first electrode portion 51 and the first upper electrode layer 53A in the z-direction, the separation distance D2 between the first lower electrode layer 53B and the second upper electrode layer 54A in the z-direction, and the separation distance D3 between the second lower electrode layer 54B and the second electrode portion 52 in the z-direction are equal to each other. When the maximum value of variations between the separation distance D1, the separation distance D2, and the separation distance D3 is, for example, within 20% of the separation distance D1, it is considered the separation distance D1, the separation distance D2, and the separation distance D3 are equal to each other.

A first opposing area in which the first electrode portion 51 is opposed to the first upper electrode layer 53A, a second opposing area in which the first lower electrode layer 53B is opposed to the second upper electrode layer 54A, and a third opposing area in which the second lower electrode layer 54B is opposed to the second electrode portion 52 are equal to each other. When the maximum value of variations between the first opposing area, the second opposing area, and the third opposing area is, for example, within 20% of the first opposing area, it is considered that the first opposing area, the second opposing area, the third opposing area are equal to each other.

When the separation distance D1 and the first opposing area, the separation distance D2 and the second opposing area, and the separation distance D3 and the third opposing area are set to be equal to each other, the capacitance of the capacitor cell 55A, the capacitance of the second capacitor cell 55B, and the capacitance of the third capacitor cell 55C are equal to each other.

In FIG. 4, which schematically shows a cross-sectional structure of the capacitor chip 80, a separation distance D4 between the first electrode portion 51 and the first lower electrode layer 53B is less than the separation distance D1 between the first electrode portion 51 and the first upper electrode layer 53A for the sake of convenience. However, in an actual structure, the separation distance D4 is greater than or equal to the separation distance D1. Also, in FIG. 4, a separation distance D5 between the first upper electrode layer 53A and the second upper electrode layer 54A is less than the separation distance D2 between the first lower electrode layer 53B and the second upper electrode layer 54A. However, in an actual structure, the separation distance D5 is greater than or equal to the separation distance D2. In FIG. 4, a separation distance D6 between the first lower electrode layer 53B and the second lower electrode layer 54B is less than the separation distance D2. However, in an actual structure, the separation distance D6 is greater than or equal to the separation distance D2. In FIG. 4, a separation distance D7 between the second upper electrode layer 54A and the second electrode portion 52 is less than the separation distance D3 between the second lower electrode layer 54B and the second electrode portion 52. In an actual structure, the separation distance D7 is greater than or equal to the separation distance D3.

Operation of Gate Driver of Present Embodiment

Figure 5:
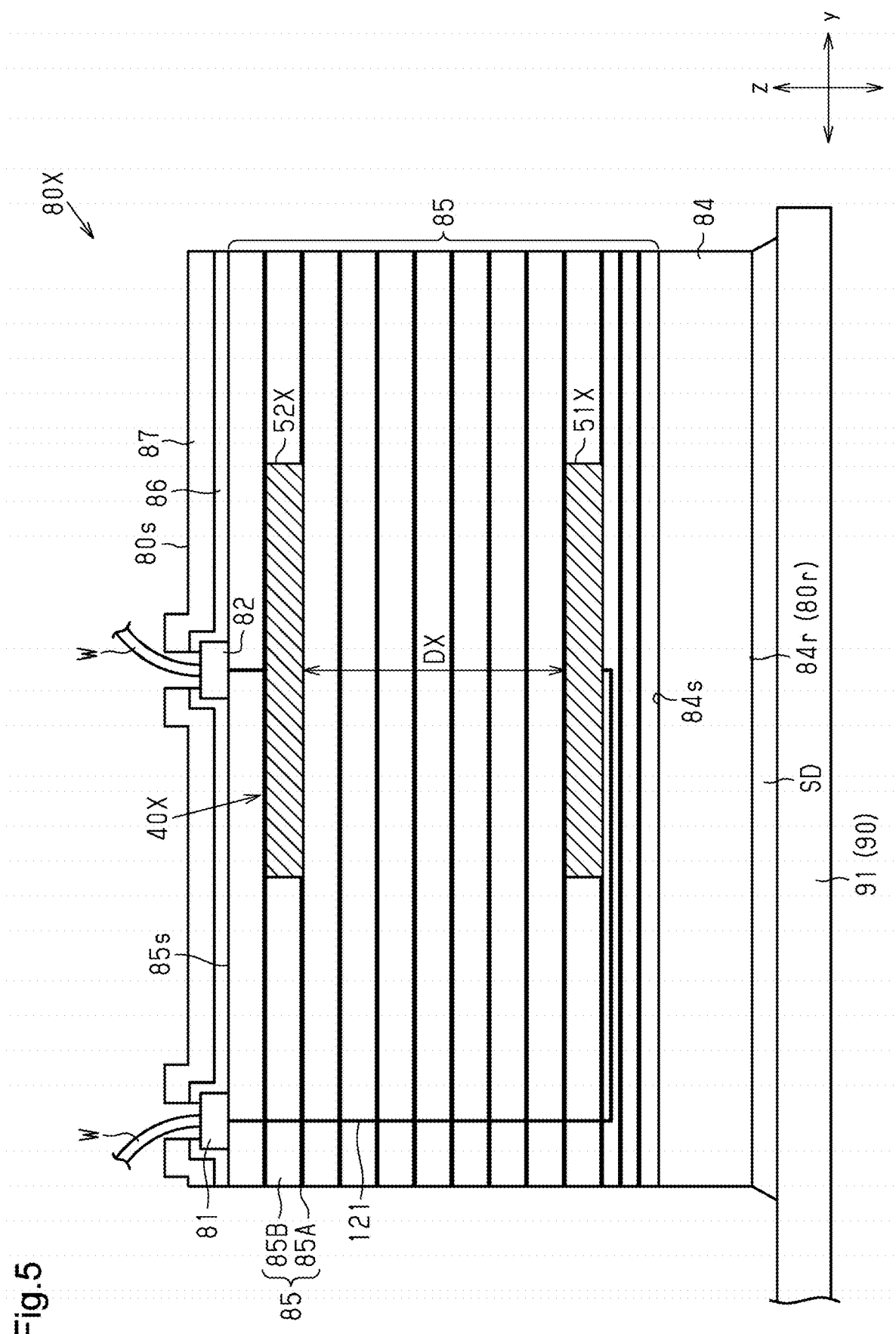
FIG. 5 is a schematic cross-sectional view showing a comparative example of a capacitor chip.

FIG. 5 is a cross-sectional view of a comparative example of a capacitor chip 80X mainly showing a cross-sectional structure of a first electrode portion 51X and a second electrode portion 52X of a capacitor 40X.

Each of the first electrode portion 51X and the second electrode portion 52X has the form of a rectangular plate. The first electrode portion 51X and the second electrode portion 52X are arranged so that, as viewed in the z-direction, the first electrode portion 51X and the second electrode portion 52X are separated and opposed to each other over the entire surface in the z-direction. Thus, the insulation layers 85 are arranged between the first electrode portion 51X and the second electrode portion 52X.

The insulation voltage of the capacitor 40X mainly depends on a separation distance DX between the first electrode portion 51X and the second electrode portion 52X. Therefore, it is desirable that the separation distance DX be large. As the separation distance DX is increased, the number of the insulation layers 85 stacked is increased. This increases the thickness of an insulation layer stack formed of insulation layers 85 in which the first electrode portion 51X and the second electrode portion 52X are embedded. When the thickness of the insulation layer stack is increased, the insulation layer stack is prone to warpage.

In this regard, in the gate driver 10 of the present embodiment, the capacitor 40A of the capacitor chip 80 includes the first electrode portion 51, the second electrode portion 52, the first intermediate electrode portion 53, and the second intermediate electrode portion 54 and is formed by coupling the first electrode portion 51 and the second electrode portion 52 through the intermediate electrode portions 53 and 54. The capacitor 40A (40B) having the structure described above has an insulation voltage that corresponds to the total value (D1+D2+D3) of the separation distance D1 between the first electrode portion 51 and the first upper electrode layer 53A of the first intermediate electrode portion 53, the separation distance D2 between the first lower electrode layer 53B and the second upper electrode layer 54A of the second intermediate electrode portion 54, and the separation distance D3 between the second lower electrode layer 54B and the second electrode portion 52.

Thus, the total value (D1+D2+D3) is greater than the separation distance between the two electrode portions 51X and 52X of the capacitor chip 80X in the comparative example without an increase in the number of insulation layers 85 between the first electrode portion 51 and the second electrode portion 52. This improves the dielectric strength of the capacitor 40A (40B).

In particular, the intermediate electrode portions 53 and 54, respectively, include steps including the upper electrode layers 53A and 54A and the lower electrode layers 53B and 54B that are located at different positions in the z-direction. The separation distances D2 and D3 are increased by the amount corresponding to the steps of the upper electrode layers 53A and 54A and the lower electrode layers 53B and 54B. This increases the total value, thereby improving the dielectric strength of the capacitor 40A (40B).

In a structure in which the first electrode portion 51 and the second electrode portion 52 are coupled through the intermediate electrode portions 53 and 54, it is considered that the capacitor 40A (40B) equivalently includes the capacitor cells 55A, 55B, and 55C that are connected in series to each other. In this case, the insulation voltage of the capacitor 40A (40B) corresponds to the insulation voltage of the capacitor cells 55A, 55B, and 55C.

In such a structure, since the total value (D1+D2+D3) is greater than the separation distance DX between the first electrode portion 51X and the second electrode portion 52X of the capacitor chip 80X in the comparative example, the combined insulation voltage of the capacitor cells 55A to 55C is greater than the insulation voltage of the capacitor chip 80X of the comparative example. This improves the dielectric strength of the capacitor 40A (40B).

Advantage of the Gate Driver of Present Embodiment

The gate driver 10 of the present embodiment obtains the following advantages.

(1-1) The gate driver 10 includes the low-voltage circuit chip 60 including the low-voltage circuit 20, the high-voltage circuit chip 70 including the high-voltage circuit 30, and the capacitor chip 80 connected between the low-voltage circuit chip 60 and the high-voltage circuit chip 70. The capacitor chip 80 includes the insulation layer 85, the first electrode portion 51 embedded in the insulation layer 85 and electrically connected to the first electrode pad 81, the first intermediate electrode portion 53 and the second intermediate electrode portion 54 embedded in the insulation layer 85 and not connected to the first electrode portion 51 and the second electrode portion 52, and the second electrode portion 52 embedded in the insulation layer 85 and electrically connected to the second electrode pad 82. The first intermediate electrode portion 53 includes the first upper electrode layer 53A, the first lower electrode layer 53B, and the first connector 53C. The second intermediate electrode portion 54 includes the second upper electrode layer 54A, the second lower electrode layer 54B, and the second connector 54C. The capacitor 40A (40B) is formed by coupling the first electrode portion 51 and the second electrode portion 52 through the intermediate electrode portions 53 and 54.

In this structure, the separation distance determining the insulation voltage of the capacitor 40A (40B) is the total value (D1+D2+D3) of the separation distance D1 between the first electrode portion 51 and the first upper electrode layer 53A of the first intermediate electrode portion 53, the separation distance D2 between the first lower electrode layer 53B and the second upper electrode layer 54A of the second intermediate electrode portion 54, and the separation distance D3 between the second lower electrode layer 54B and the second electrode portion 52. Thus, the separation distance determining the insulation voltage of the capacitor 40A (40B) is increased.

In addition, since the upper electrode layers 53A and 54A and the lower electrode layers 53B and 54B of the intermediate electrode portions 53 and 54 are located at different positions in the z-direction, the dielectric strength of the capacitor 40A (40B) is improved without an increase in the distance (separation distance) between the first electrode portion 51 and the second electrode portion 52. In other words, the dielectric strength of the capacitor 40A (40B) is improved without increasing the number of insulation layers 85, that is, increasing the thickness of the stack of the insulation layers 85. This limits formation of warpage of the stack of the insulation layers 85. Thus, while a decrease in the throughput yield during manufacturing is limited, the dielectric strength of the capacitor chip 80 is improved.

In the present embodiment, the capacitor 40 includes multiple intermediate electrode portions such as the first intermediate electrode portion 53 and the second intermediate electrode portion 54. This further increases the separation distance, or the total value (D1+D2+D3) determining the insulation voltage of the capacitor 40A (40B). Thus, the dielectric strength of the capacitor chip 80 is improved.

(1-2) The capacitance of the capacitor cell 55A, which is formed of the first electrode portion 51 and the first upper electrode layer 53A of the first intermediate electrode portion 53, is equal to the capacitance of the second capacitor cell 55B, which is formed of the first lower electrode layer 53B of the first intermediate electrode portion 53 and the second upper electrode layer 54A of the second intermediate electrode portion 54.

This structure improves the dielectric strength of the capacitor chip 80 as compared to a structure in which the capacitance of the capacitor cell 55A differs from the capacitance of the second capacitor cell 55B.

In addition, the capacitance of the third capacitor cell 55C, which is formed of the second lower electrode layer 54B of the second intermediate electrode portion 54 and the second electrode portion 52, is equal to the capacitance of each of the capacitor cells 55A and 55B.

This structure improves the dielectric strength of the capacitor chip 80 as compared to a structure in which at least one of the capacitance of the capacitor cell 55A, the capacitance of the second capacitor cell 55B, and the capacitance of the third capacitor cell 55C differs from the others. When the capacitances of the capacitor cells 55A to 55C are equal to each other, the dielectric strength of the capacitor chip 80 is further improved.

(1-3) The ring-shaped first lower electrode layer 53B and the first electrode portion 51 are located at different positions in the z-direction. In plan view, the first lower electrode layer 53B is located outward from the first electrode portion 51. This structure allows the distance D4 between the first lower electrode layer 53B and the first electrode portion 51 to be readily increased.

The ring-shaped second upper electrode layer 54A and the first upper electrode layer 53A are located at different positions in the z-direction. In plan view, the second upper electrode layer 54A is located outward from the first upper electrode layer 53A. This structure allows the distance D5 between the first upper electrode layer 53A and the second upper electrode layer 54A to be readily increased.

The ring-shaped second lower electrode layer 54B and the first lower electrode layer 53B are located at different positions in the z-direction. In plan view, the second lower electrode layer 54B is located outward from the first lower electrode layer 53B. This structure allows the distance D6 between the second lower electrode layer 54B and the first lower electrode layer 53B to be readily increased.

The ring-shaped second electrode portion 52 and the second upper electrode layer 54A are located at different positions in the z-direction. In plan view, the second electrode portion 52 is located outward from the second upper electrode layer 54A. This structure allows the distance D7 between the second electrode portion 52 and the second upper electrode layer 54A to be readily increased.

Thus, the distances D4 to D7 necessary for the set insulation voltage of the capacitor chip 80 are obtained without increasing the size of the capacitor chip 80 in a direction orthogonal to the z-direction.

Second Embodiment

A second embodiment of a gate driver 10 will be described with reference to FIGS. 6 and 7. The gate driver 10 of the present embodiment differs from the gate driver 10 of the first embodiment mainly in the number of capacitors that are connected in series. In the following description, the differences from the first embodiment will be described. The same reference characters are given to those components that are the same as the corresponding components of the gate driver 10 of the first embodiment. Such components will not be described in detail.

Figure 6:
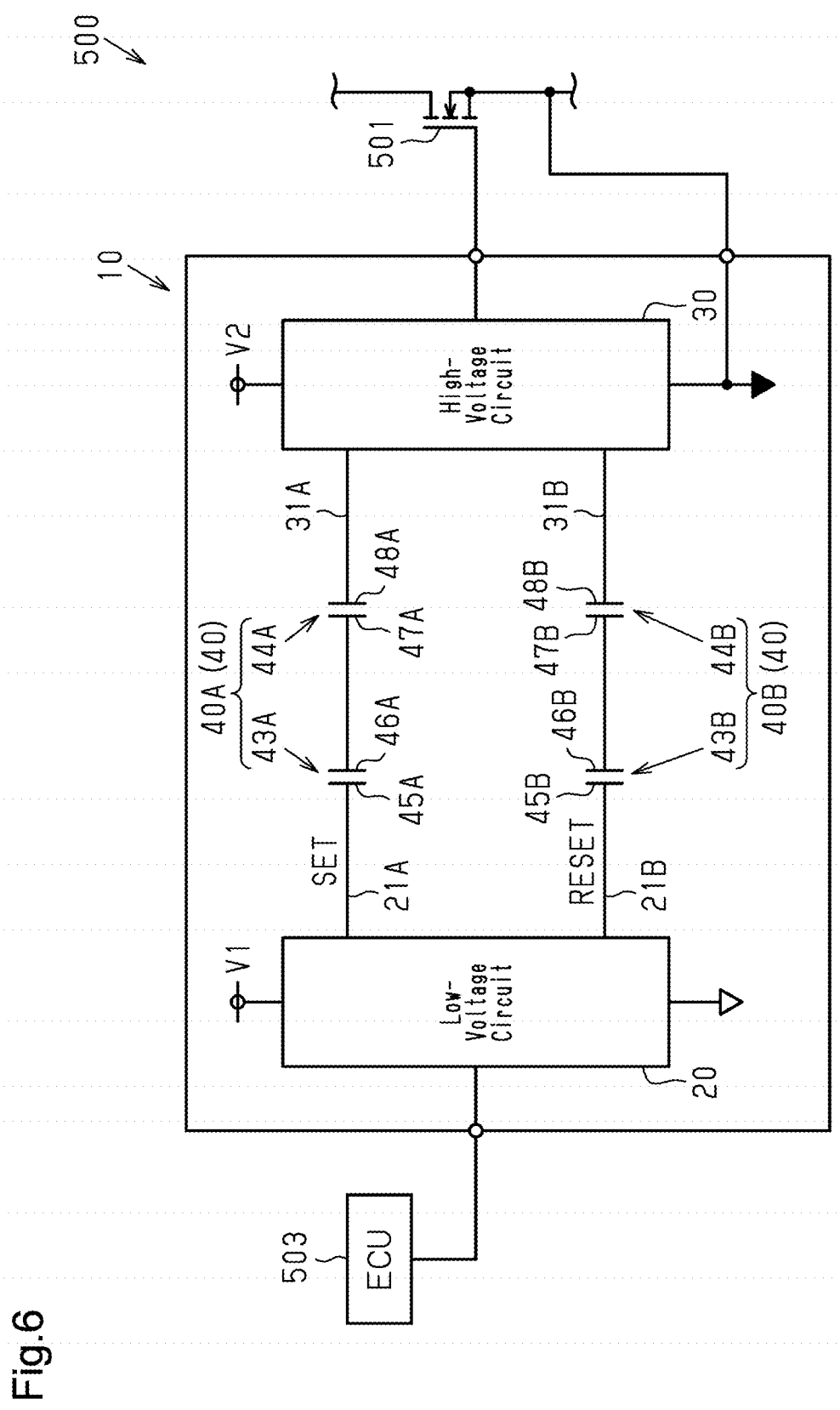
FIG. 6 is a schematic circuit diagram showing a second embodiment of a gate driver.

As shown in FIG. 6, the gate driver 10 of the present embodiment includes multiple capacitors having a double insulation structure. More specifically, the capacitor 40A includes a first capacitor 43A and a second capacitor 44A connected in series to each other. The capacitor 40B includes a first capacitor 43B and a second capacitor 44B connected in series to each other. As described above, each of the capacitors 40A and 40B has a double insulation structure. Thus, the insulation voltage of the gate driver 10 is greater than that in the first and second embodiments and is, for example, approximately 7500 Vrms.

The first capacitor 43A is electrically connected to the low-voltage circuit 20. The first capacitor 43A includes a first electrode 45A and a second electrode 46A. The first electrode 45A is electrically connected to the low-voltage circuit 20 by the low-voltage signal line 21A.

The second capacitor 44A is electrically connected to the high-voltage circuit 30. The second capacitor 44A connects the first capacitor 43A and the high-voltage circuit 30. The second capacitor 44A includes a first electrode 47A and a second electrode 48A. The first electrode 47A is electrically connected to the second electrode 46A of the first capacitor 43A. The first electrode 47A of the second capacitor 44A and the second electrode 46A of the first capacitor 43A are electrically floating. The second electrode 48A is electrically connected to the high-voltage circuit 30 by the high-voltage signal line 31A.

The first capacitor 43B of the capacitor 40B is electrically connected to the low-voltage circuit 20 and includes a first electrode 45B and a second electrode 46B. The second capacitor 44B of the capacitor 40B is electrically connected to the high-voltage circuit 30 and includes a first electrode 47B and a second electrode 48B. The capacitors 43B and 44B are the same as the capacitors 43A and 44A and thus will not be described in detail.

Figure 7:
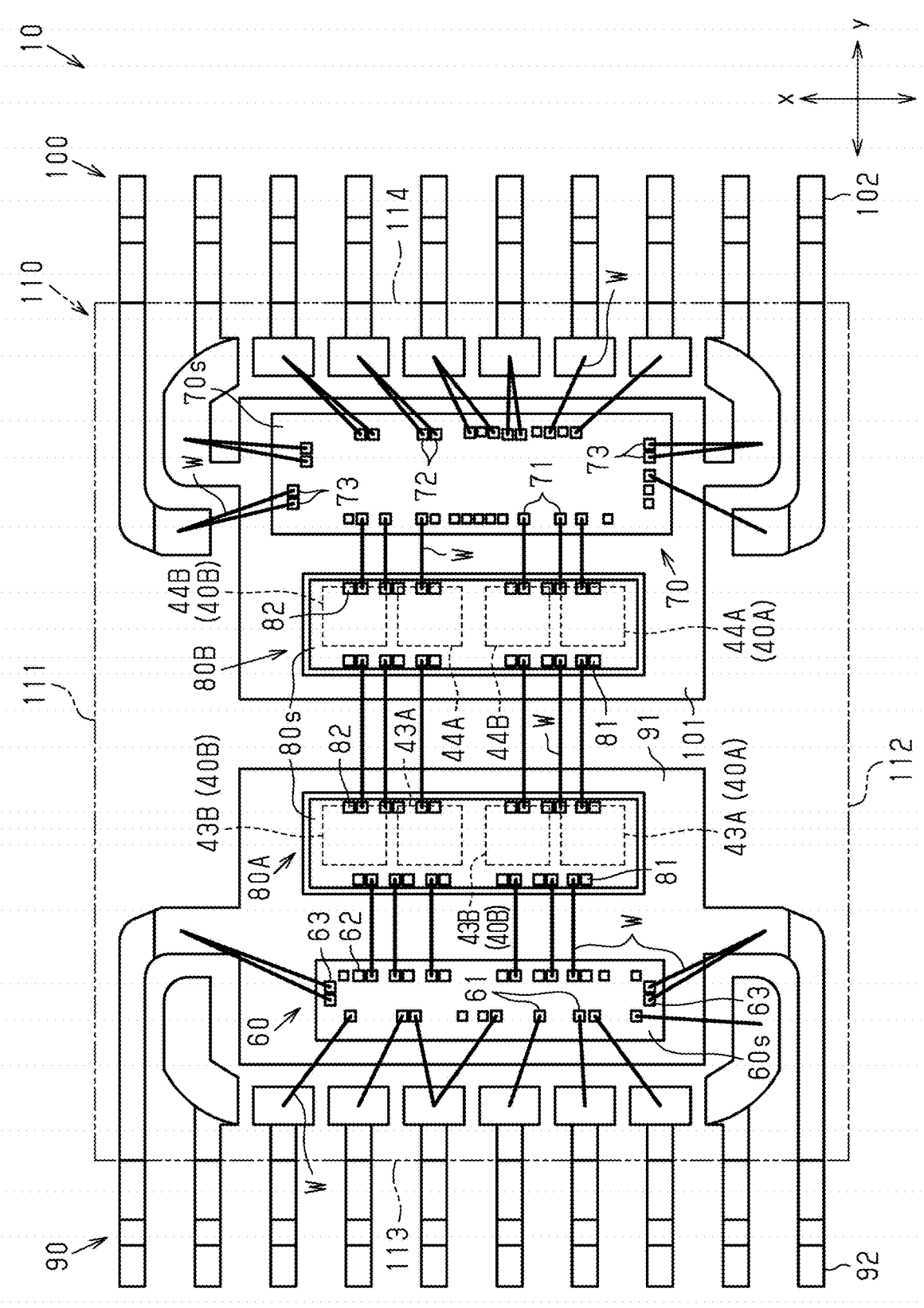
FIG. 7 is a plan view showing an internal structure of the gate driver of the second embodiment.

FIG. 7 shows an example of a plan view showing the internal structure of the gate driver 10. FIG. 6 shows a simplified circuit configuration of the gate driver 10. Hence, the number of external terminals of the gate driver 10 shown in FIG. 7 is greater than the number of external terminals of the gate driver 10 shown in FIG. 5. The number of external terminals of the gate driver 10 is the number of external electrodes configured to connect the gate driver 10 to electronic components arranged outside the gate driver 10, such as the ECU 503 and the switching element 501 (refer to FIG. 6). The number of signal lines (the number of wires W described later) that transmit a signal from the low-voltage circuit 20 to the high-voltage circuit 30 in the gate driver 10 shown in FIG. 7 is greater than the number of signal lines in the gate driver 10 shown in FIG. 6.

As shown in FIG. 7, the gate driver 10 includes a first capacitor chip 80A and a second capacitor chip 80B instead of the capacitor chip 80 of the first embodiment. More specifically, the gate driver 10 includes the low-voltage circuit chip 60, the high-voltage circuit chip 70, the first capacitor chip 80A, and the second capacitor chip 80B. The low-voltage circuit chip 60, the high-voltage circuit chip 70, the first capacitor chip 80A, and the second capacitor chip 80B are separated from each other in the y-direction. In other words, the chips 60, 70, 80A, and 80B are arranged in the arrangement direction of the low-voltage die pad 91 and the high-voltage die pad 101.

The low-voltage circuit chip 60, the first capacitor chip 80A, the second capacitor chip 80B, and the high-voltage circuit chip 70 are arranged in this order from the low-voltage leads 92 toward the high-voltage leads 102. In other words, in plan view, the capacitor chips 80A and 80B are disposed between the low-voltage circuit chip 60 and the high-voltage circuit chip 70.

In the present embodiment, the low-voltage circuit chip 60 and the first capacitor chip 80A are mounted on the low-voltage die pad 91 of the low-voltage lead frame 90. The high-voltage circuit chip 70 and the second capacitor chip 80B are mounted on the high-voltage die pad 101 of the high-voltage lead frame 100.

The first capacitor chip 80A includes the first capacitor 43A of the capacitor 40A and the first capacitor 43B of the capacitor 40B. More specifically, the two capacitors 43A and 43B are arranged in a single package. Thus, the first capacitor chip 80A includes capacitors of the capacitors 40A and 40B that are located closer to the low-voltage circuit 20 than to the high-voltage circuit 30 in the circuitry.

The second capacitor chip 80B includes the second capacitor 44A of the capacitor 40A and the second capacitor 44B of the capacitor 40B. More specifically, the capacitors 44A and 44B are arranged in a single package. Thus, the second capacitor chip 80B includes capacitors of the capacitors 40A and 40B that are located closer to the high-voltage circuit 30 than to the low-voltage circuit 20 in the circuitry.

In the present embodiment, the capacitor chips 80A and 80B have the same structure as the capacitor chip 80 of the first embodiment. More specifically, the capacitors 43A and 43B of the capacitor chip 80A and the capacitors 44A and 44B of the capacitor chip 80B have the same structure as the capacitors 40A and 40B of the capacitor chip 80. Hence, the capacitor chips 80A and 80B will not be described in detail.

The low-voltage circuit chip 60 and the first capacitor chip 80A are connected by wires W. More specifically, the second electrode pads 62 of the low-voltage circuit chip 60 and the first electrode pads 81 of the first capacitor chip 80A are connected by the wires W. Thus, the low-voltage circuit 20 is electrically connected to the first electrode 45A of the first capacitor 43A (refer to FIG. 6), and the low-voltage circuit 20 is electrically connected to the first electrode 45B of the first capacitor 43B (refer to FIG. 6).

The first capacitor chip 80A and the second capacitor chip 80B are connected by wires W. More specifically, the second electrode pads 82 of the first capacitor chip 80A and the first electrode pads 81 of the second capacitor chip 80B are connected by the wires W. Thus, the second electrode 46A of the first capacitor 43A is electrically connected to the first electrode 47A of the second capacitor 44A, and the second electrode 46B of the first capacitor 43B is electrically connected to the first electrode 47B of the second capacitor 44B.

The second capacitor chip 80B and the high-voltage circuit chip 70 are connected by wires W. More specifically, the second electrode pads 82 of the second capacitor chip 80B and the first electrode pads 71 of the high-voltage circuit chip 70 are connected by wires W. Thus, the second electrode 48A of the second capacitor 44A (refer to FIG. 6) is electrically connected to the high-voltage circuit 30. The second electrode 48B of the second capacitor 44B (refer to FIG. 6) is electrically connected to the high-voltage circuit 30.

Advantages of Second Embodiment

The gate driver 10 of the present embodiment obtains the following advantages in addition to the advantages of the first embodiment.

(2-1) The capacitor 40A includes the first capacitor 43A and the second capacitor 44A connected in series to each other. The capacitor 40B includes a first capacitor 43B and a second capacitor 44B connected in series to each other. With this structure, the first capacitor 43A and the second capacitor 44A form a double insulation structure between the low-voltage circuit 20 and the high-voltage circuit 30 in the signal line that transmits the set signal. The first capacitor 43B and the second capacitor 44B form a double insulation structure between the low-voltage circuit 20 and the high-voltage circuit 30 in the signal line that transmits the reset signal. This improves the dielectric strength of the gate driver 10.

Third Embodiment

A third embodiment of a gate driver 10 will be described with reference to FIGS. 8 and 9. The gate driver 10 of the present embodiment differs from the gate driver 10 of the first embodiment mainly in that the gate driver 10 of the present embodiment includes a plurality of packages. In the following description, the differences from the first embodiment will be described. The same reference characters are given to those components that are the same as the corresponding components of the gate driver 10 of the first embodiment. Such components will not be described in detail.

Figure 8:
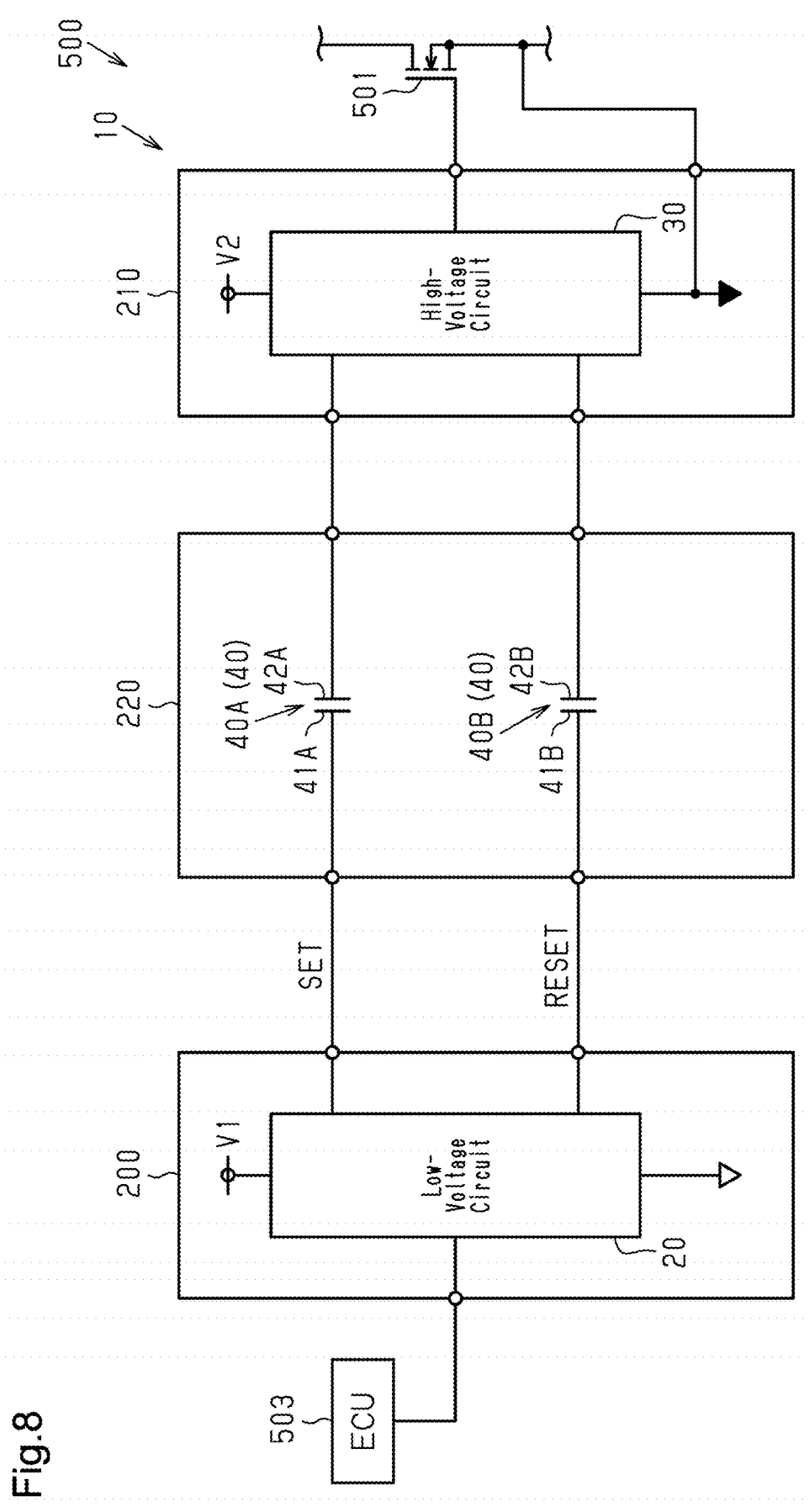
FIG. 8 is a schematic circuit diagram showing a third embodiment of a gate driver.

As shown in FIG. 8, the gate driver 10 of the present embodiment has the same circuit configuration as the gate driver 10 of the first embodiment. The gate driver 10 includes a low-voltage circuit module 200, a high-voltage circuit module 210, and an insulating module 220.

The low-voltage circuit module 200 includes a low-voltage circuit 20. In an example, although not shown, the low-voltage circuit module 200 includes a low-voltage circuit chip including the low-voltage circuit 20, a low-voltage lead frame including a low-voltage die pad on which the low-voltage circuit chip is mounted, and an encapsulation resin encapsulating a part of the low-voltage lead frame and the low-voltage circuit chip.

The high-voltage circuit module 210 includes a high-voltage circuit 30. In an example, although not shown, the high-voltage circuit module 210 includes a high-voltage circuit chip including the high-voltage circuit 30, a high-voltage lead frame including a high-voltage die pad on which the high-voltage circuit chip is mounted, and an encapsulation resin encapsulating a part of the high-voltage lead frame and the high-voltage circuit chip.

The insulating module 220 insulates the low-voltage circuit 20 from the high-voltage circuit 30 while allowing transmission of the set signal and the reset signal from the low-voltage circuit 20 to the high-voltage circuit 30. That is, the insulating module 220 is used to insulate the low-voltage circuit 20 and the high-voltage circuit 30 included in the gate driver 10. The insulating module 220 includes capacitors 40. In the same manner as the first embodiment, the capacitors 40 are used to transmit signals (set signal and reset signal) between the low-voltage circuit 20 and the high-voltage circuit 30. As shown in FIG. 8, the insulating module 220 is arranged between the low-voltage circuit 20 and the high-voltage circuit 30 in the circuitry. Thus, the low-voltage circuit 20 and the high-voltage circuit 30 are configured to be connected by the capacitors 40.

Figure 9:
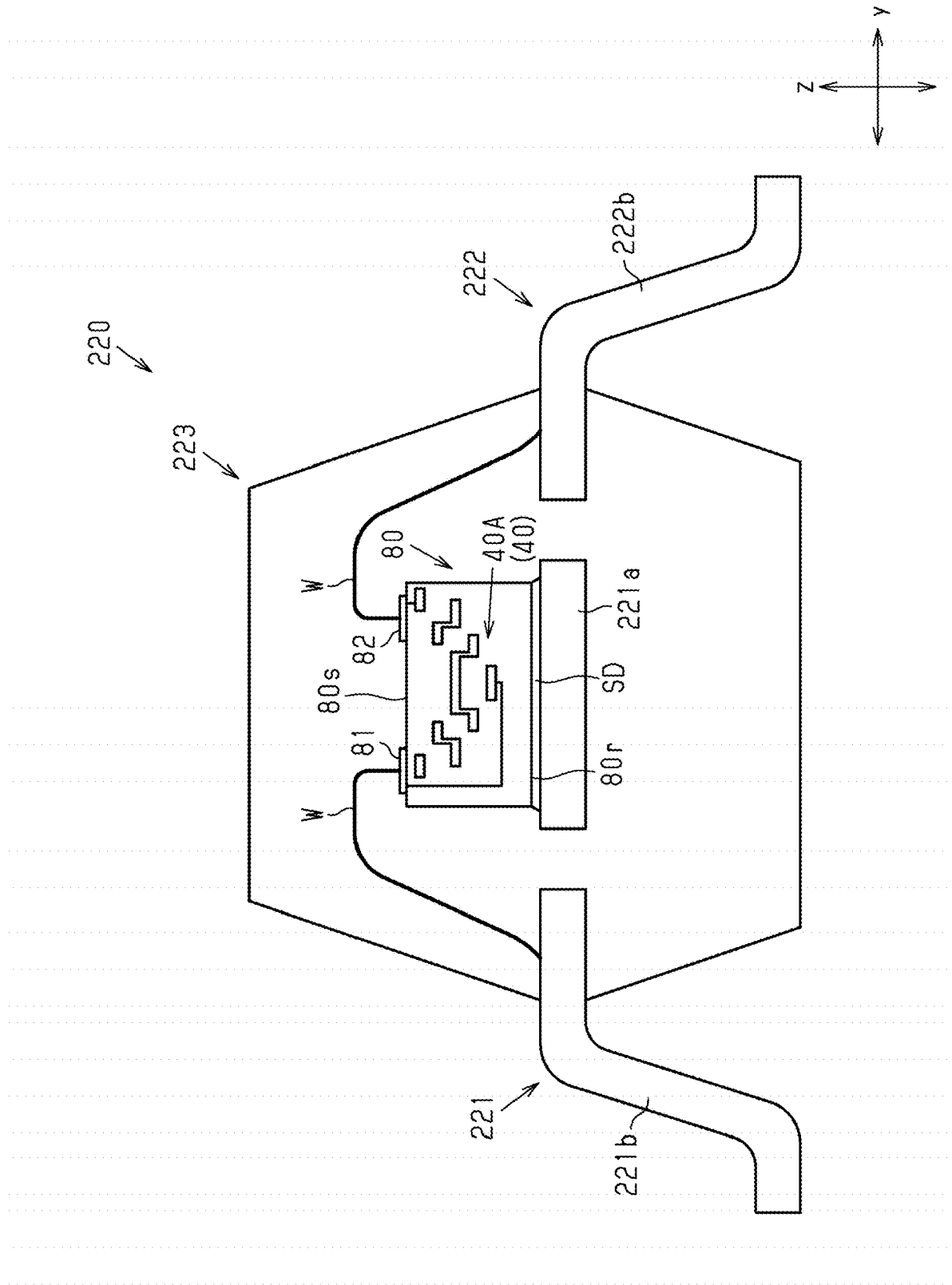
FIG. 9 is a schematic cross-sectional view of an insulating module in the gate driver of the third embodiment.

FIG. 9 shows an example of a schematic cross-sectional structure of the insulating module 220. As shown in FIG. 9, the insulating module 220 includes a capacitor chip 80, a low-voltage lead frame 221, a high-voltage lead frame 222, and an encapsulation resin 223 that encapsulates the capacitor chip 80, and a part of each of the lead frames 221 and 222.

The lead frames 221 and 222 are formed from a conductor and, in the present embodiment, are formed from Cu. The lead frames 221 and 222 extend from the inside to the outside of the encapsulation resin 223.

The low-voltage lead frame 221 is electrically connected to the low-voltage circuit 20 (refer to FIG. 8) and includes a low-voltage die pad 221a arranged in the encapsulation resin 223 and a plurality of low-voltage leads 221b extending from the inside to the outside of the encapsulation resin 223. Each of the low-voltage leads 221b includes an external terminal electrically connected to the low-voltage circuit 20.

The high-voltage lead frame 222 is electrically connected to the high-voltage circuit 30 (refer to FIG. 8) and includes a plurality of high-voltage leads 222b extending from the inside to the outside of the encapsulation resin 223. Each of the high-voltage leads 222b includes an external terminal electrically connected to the high-voltage circuit 30. In the present embodiment, the capacitor chip 80 is mounted on the low-voltage die pad 221a.

The first electrode pad 81 of the capacitor chip 80 is connected to the low-voltage lead 221b by a wire W. Thus, the first electrode 41A of the capacitor 40A is electrically connected to the low-voltage lead 221b. Although not shown, the first electrode 41B of the capacitor 40B is electrically connected to another low-voltage lead 221b.

The second electrode pad 82 of the capacitor chip 80 is connected to the high-voltage lead 222b by a wire W. Thus, the second electrode 42A of the capacitor 40A is electrically connected to the high-voltage lead 222b. Although not shown, the second electrode 42B of the capacitor 40B is electrically connected to another high-voltage lead 222b.

Advantage of Third Embodiment

The gate driver 10 of the present embodiment obtains the following advantages in addition to the advantages of the first embodiment.

(3-1) The capacitors 40 are included in the insulating module 220, which is a semiconductor module differing from the low-voltage circuit module 200 and the high-voltage circuit module 210.

This structure allows the common insulating module 220 to be used for the low-voltage circuit module 200 and high-voltage circuit module 210, which differ from each other. This reduces the costs for manufacturing different types of gate drivers that differ in at least one of the low-voltage circuit module 200 and the high-voltage circuit module 210.

Fourth Embodiment

A fourth embodiment of a gate driver 10 will be described with reference to FIGS. 10 and 11. The gate driver 10 of the present embodiment differs from the gate driver 10 of the first embodiment mainly in that the gate driver 10 of the present embodiment includes a plurality of packages. In the following description, the differences from the first embodiment will be described. The same reference characters are given to those components that are the same as the corresponding components of the gate driver 10 of the first embodiment. Such components will not be described in detail.

Figure 10:
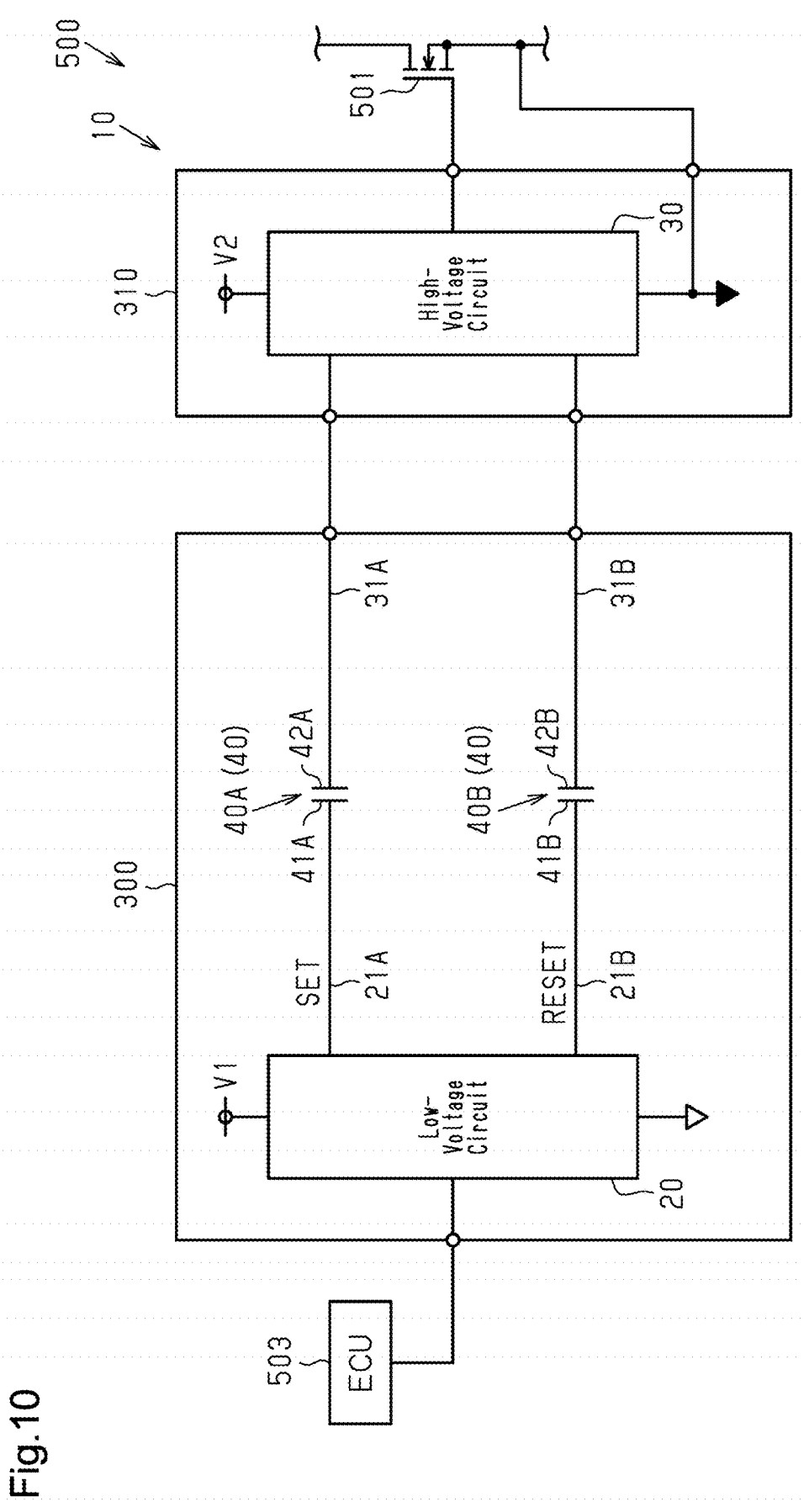
FIG. 10 is a schematic circuit diagram showing a fourth embodiment of a gate driver.

As shown in FIG. 10, the gate driver 10 of the present embodiment has the same circuit configuration as the gate driver 10 of the first embodiment. The gate driver 10 includes a low-voltage circuit unit 300 and a high-voltage circuit module 310. The high-voltage circuit module 310 has the same structure as the high-voltage circuit module 210 (refer to FIG. 8) of the third embodiment. The low-voltage circuit unit 300 corresponds to "insulating module."

The low-voltage circuit unit 300 includes the low-voltage circuit 20 and the capacitor 40. The low-voltage circuit unit 300 insulates the low-voltage circuit 20 from the high-voltage circuit 30 while allowing transmission of the set signal and the reset signal from the low-voltage circuit 20 to the high-voltage circuit 30.

Figure 11:
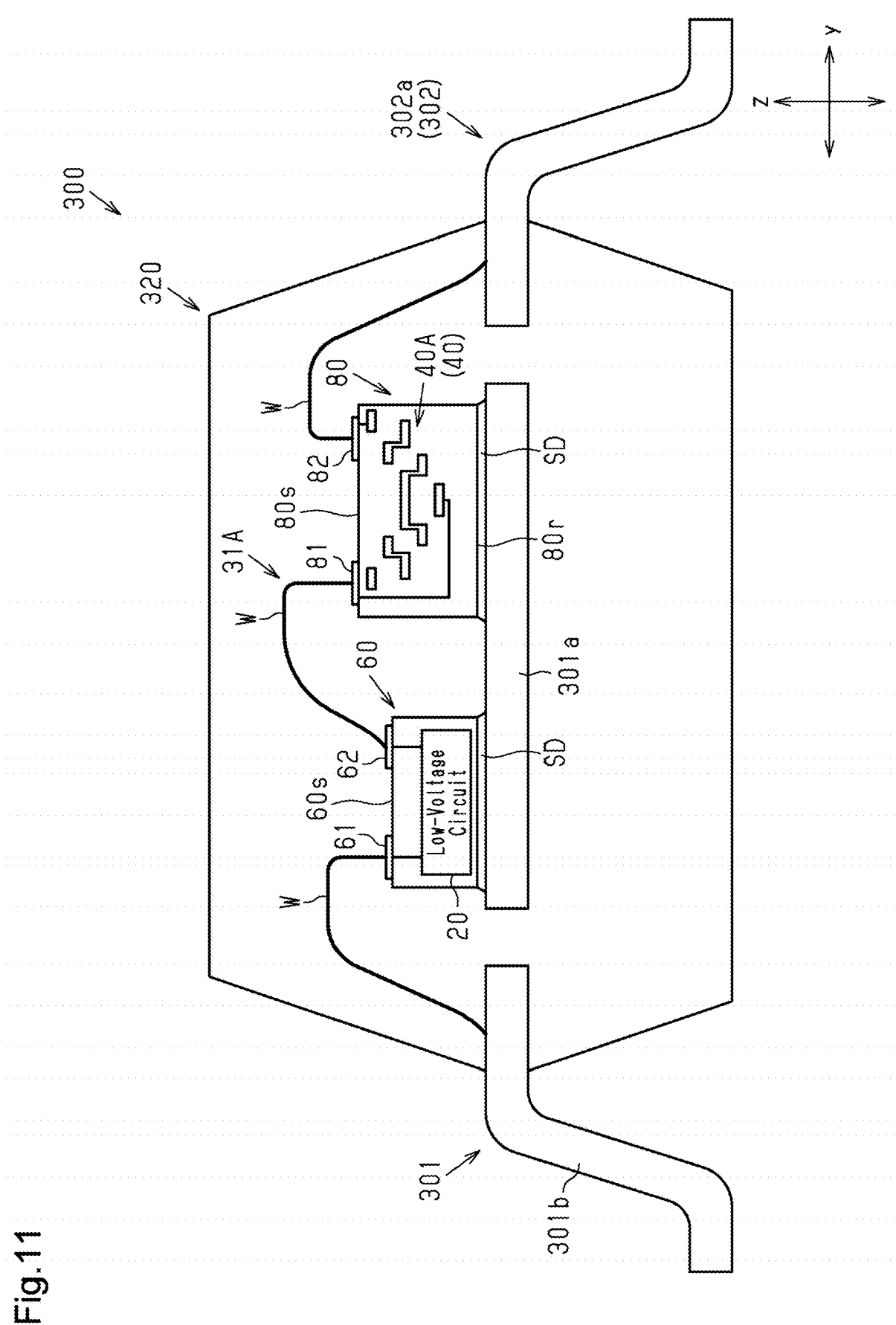
FIG. 11 is a schematic cross-sectional view of an insulating module in the gate driver according to the fourth embodiment.

FIG. 11 shows an example of a schematic cross-sectional structure of the low-voltage circuit unit 300. As shown in FIG. 11, the low-voltage circuit unit 300 includes a low-voltage circuit chip 60 including the low-voltage circuit 20, a capacitor chip 80, a low-voltage lead frame 301, a high-voltage lead frame 302, and an encapsulation resin 320 that encapsulates the chips 60 and 80 and a part of each of the lead frames 301 and 302.

The lead frames 301 and 302 are formed from a conductor and, in the present embodiment, are formed from Cu. The lead frames 301 and 302 extend from the inside to the outside of the encapsulation resin 320.

The low-voltage lead frame 301 is electrically connected to the low-voltage circuit and includes a low-voltage die pad 301*a* arranged in the encapsulation resin 320 and a plurality of low-voltage leads 301*b* extending from the inside to the outside of the encapsulation resin 320. Each of the low-voltage leads 301*b* includes an external terminal electrically connected to the low-voltage circuit 20.

The high-voltage lead frame 302 is electrically connected to the high-voltage circuit 30 (refer to FIG. 10) and includes a plurality of high-voltage leads 302*a* extending from the inside to the outside of the encapsulation resin 320. The high-voltage leads 302*a* include external terminals electrically connected to the high-voltage circuit 30.

In the present embodiment, the low-voltage circuit chip 60 and the capacitor chip 80 are mounted on the low-voltage die pad 301*a*. The low-voltage circuit chip 60 and the capacitor chip 80 are separated from each other in the y-direction. In the present embodiment, the low-voltage circuit chip 60 and the capacitor chip 80 are arranged in this order from the low-voltage leads 301*b* toward the high-voltage leads 302*a*. The low-voltage circuit chip 60 and the capacitor chip 80 are connected by wires W in the same manner as those of the first embodiment. The present embodiment has the same advantages as the first embodiment.

Fifth Embodiment

A fifth embodiment of a gate driver 10 will be described with reference to FIGS. 12 and 13. The gate driver 10 of the present embodiment differs from the gate driver 10 of the first embodiment mainly in that the gate driver 10 of the present embodiment includes a plurality of packages. In the following description, the differences from the first embodiment will be described. The same reference characters are given to those components that are the same as the corresponding components of the gate driver 10 of the first embodiment. Such components will not be described in detail.

Figure 12:
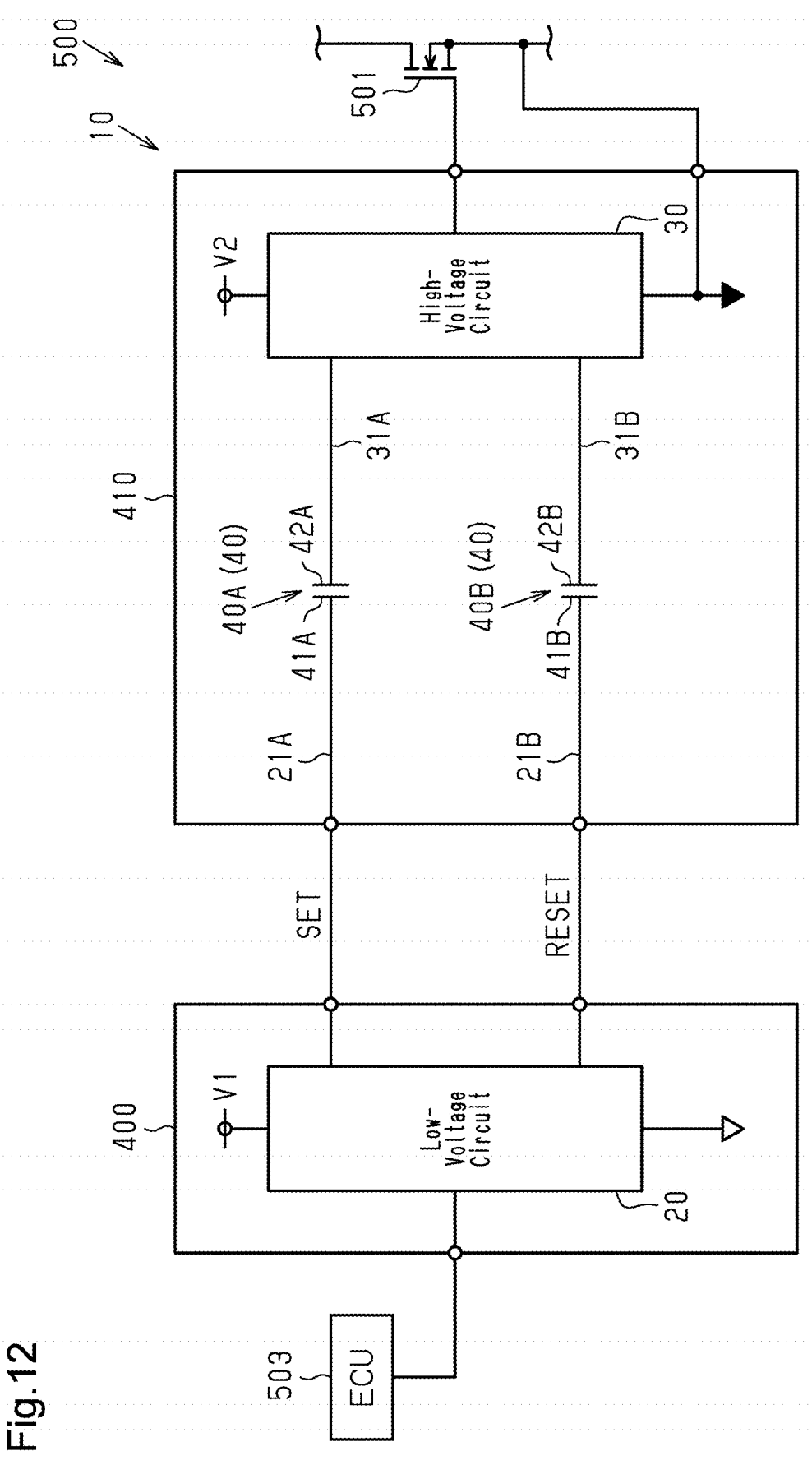
FIG. 12 is a schematic circuit diagram showing a fifth embodiment of a gate driver.

As shown in FIG. 12, the gate driver 10 of the present embodiment has the same circuit configuration as the gate driver 10 of the first embodiment. The gate driver 10 includes a low-voltage circuit module 400 and a high-voltage circuit unit 410. The low-voltage circuit module 400 has the same structure as the low-voltage circuit module 200 of the third embodiment. The high-voltage circuit unit 410 corresponds to "insulating module."

The high-voltage circuit unit 410 includes the high-voltage circuit 30 and the capacitor 40. The high-voltage circuit unit 410 insulates the low-voltage circuit 20 from the high-voltage circuit 30 while allowing transmission of the set signal and the reset signal from the low-voltage circuit 20 to the high-voltage circuit 30.

Figure 13:
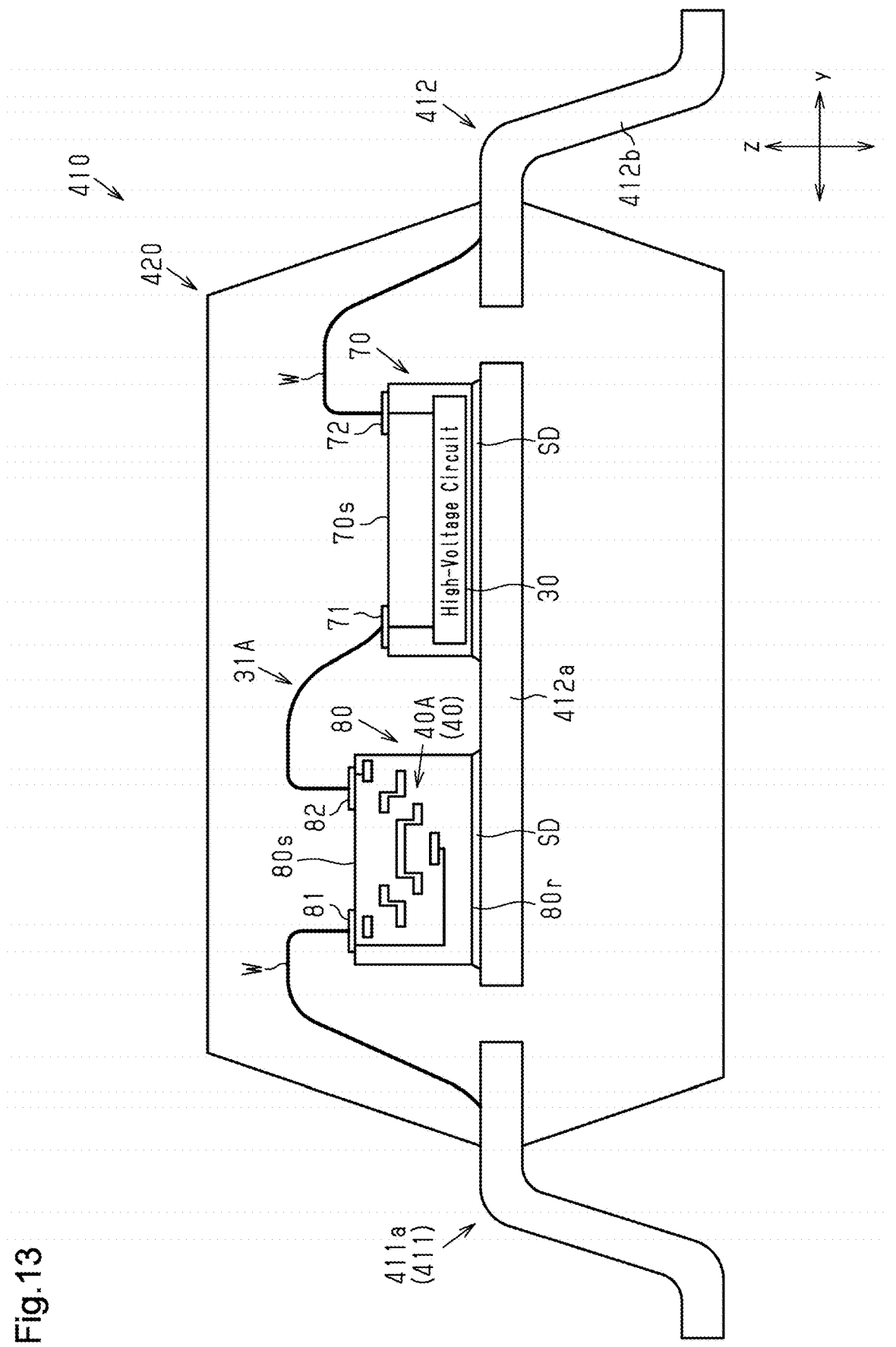
FIG. 13 is a schematic cross-sectional view of an insulating module in the gate driver of the fifth embodiment.

FIG. 13 shows an example of a schematic cross-sectional structure of the high-voltage circuit unit 410. As shown in FIG. 13, the high-voltage circuit unit 410 includes a high-voltage circuit chip 70, a capacitor chip 80, a low-voltage lead frame 411, a high-voltage lead frame 412, and an encapsulation resin 420 that encapsulates the chips 70 and 80 and a part of each of the lead frames 411 and 412.

The lead frames 411 and 412 are formed from a conductor and, in the present embodiment, are formed from Cu. The lead frames 411 and 412 extend from the inside to the outside of the encapsulation resin 420.

The low-voltage lead frame 411 is electrically connected to the low-voltage circuit 20 (refer to FIG. 12) and includes a plurality of low-voltage leads 411*a* extending from the inside to the outside of the encapsulation resin 420. The low-voltage leads 411*a* include external terminals electrically connected to the low-voltage circuit 20.

The high-voltage lead frame 412 is electrically connected to the high-voltage circuit 30 and includes a high-voltage die pad 412*a* arranged in the encapsulation resin 420 and a plurality of high-voltage leads 412*b* extending from the inside to the outside of the encapsulation resin 420. Each of the high-voltage leads 412*b* includes an external terminal electrically connected to the high-voltage circuit 30.

In the present embodiment, the high-voltage circuit chip 70 and the capacitor chip 80 are mounted on the high-voltage die pad 412*a*. The high-voltage circuit chip 70 and the capacitor chip 80 are separated from each other in the y-direction. In the present embodiment, the capacitor chip 80 and the high-voltage circuit chip 70 are arranged in this order from the low-voltage lead 411a toward the high-voltage lead 412b.

The high-voltage circuit chip 70 and the capacitor chip 80 are connected by wires W in the same manner as those of the first embodiment. The first electrode pads 81 of the capacitor chip 80 are connected to the low-voltage leads 411a by wires W. The present embodiment has the same advantages as the first embodiment.

Modified Examples

The above embodiments exemplify, without any intention to limit, applicable forms of a gate driver and an insulating module according to the present disclosure. The gate driver and the insulating module according to the present disclosure can be applicable to forms differing from the above embodiments. In an example of such a form, the structure of the embodiments is partially replaced, changed, or omitted, or a further structure is added to the embodiments. The modified examples described below may be combined with one another as long as there is no technical inconsistency. In the modified examples, the same reference characters are given to those components that are the same as the corresponding components of the above embodiments. Such components will not be described in detail.

In each embodiment, in plan view, the orientation of the capacitors 40A and 40B (capacitors 43A and 44B) may be changed in any manner. In an example, each of the first electrode portion 51, the second electrode portion 52, and the intermediate electrode portions 53 and 54 may be arranged so that the long sides extend in the y-direction and the short sides extend in the x-direction.

In each embodiment, in plan view, the shape of the first electrode portion 51 may be changed in any manner. In an example, in plan view, the shape of the first electrode portion 51 may be a circle. In plan view, the shape of the first electrode portion 51 may be a triangle or a polygon having five or more sides. In plan view, the shape of the first electrode portion 51 may be an ellipse or an oval. In addition, the shape of the first upper electrode layer 53A of the first intermediate electrode portion 53 in plan view may be changed in the same manner.

In each embodiment, in plan view, the shape of the second electrode portion 52 may be changed in any manner. In an example, in plan view, the shape of the second electrode portion 52 may be a circular ring. In plan view, the shape of the second electrode portion 52 may be a triangular ring or a polygonal ring having five or more sides. In plan view, the shape of the second electrode portion 52 may be an elliptical ring or an oval ring. In addition, the shapes of the first lower electrode layer 53B and the first connector 53C of the first intermediate electrode portion 53 and the shapes of the second upper electrode layer 54A, the second lower electrode layer 54B, and the second connector 54C of the second intermediate electrode portion 54 in plan view may be changed in the same manner.

In each embodiment, the positions of the intermediate electrode portions 53 and 54 in the z-direction may be changed in any manner.

In an example, the first upper electrode layer 53A of the first intermediate electrode portion 53 may be arranged closer to the surface 85s of the insulation layers 85 than the second lower electrode layer 54B of the second intermediate electrode portion 54 is. That is, the second lower electrode layer 54B may be arranged between the first upper electrode layer 53A and the second electrode portion 52.

In an example, the first lower electrode layer 53B of the first intermediate electrode portion 53 may be aligned with the first electrode portion 51 in the z-direction.

In an example, the second upper electrode layer 54A of the second intermediate electrode portion 54 may be aligned with the second electrode portion 52 in the z-direction.

In an example, the second lower electrode layer 54B of the second intermediate electrode portion 54 may be arranged closer to the surface 85s of the insulation layers 85 than the first upper electrode layer 53A is. The second lower electrode layer 54B may be arranged farther away from the surface 85s of the insulation layers 85 than the first lower electrode layer 53B is.

Figure 14:
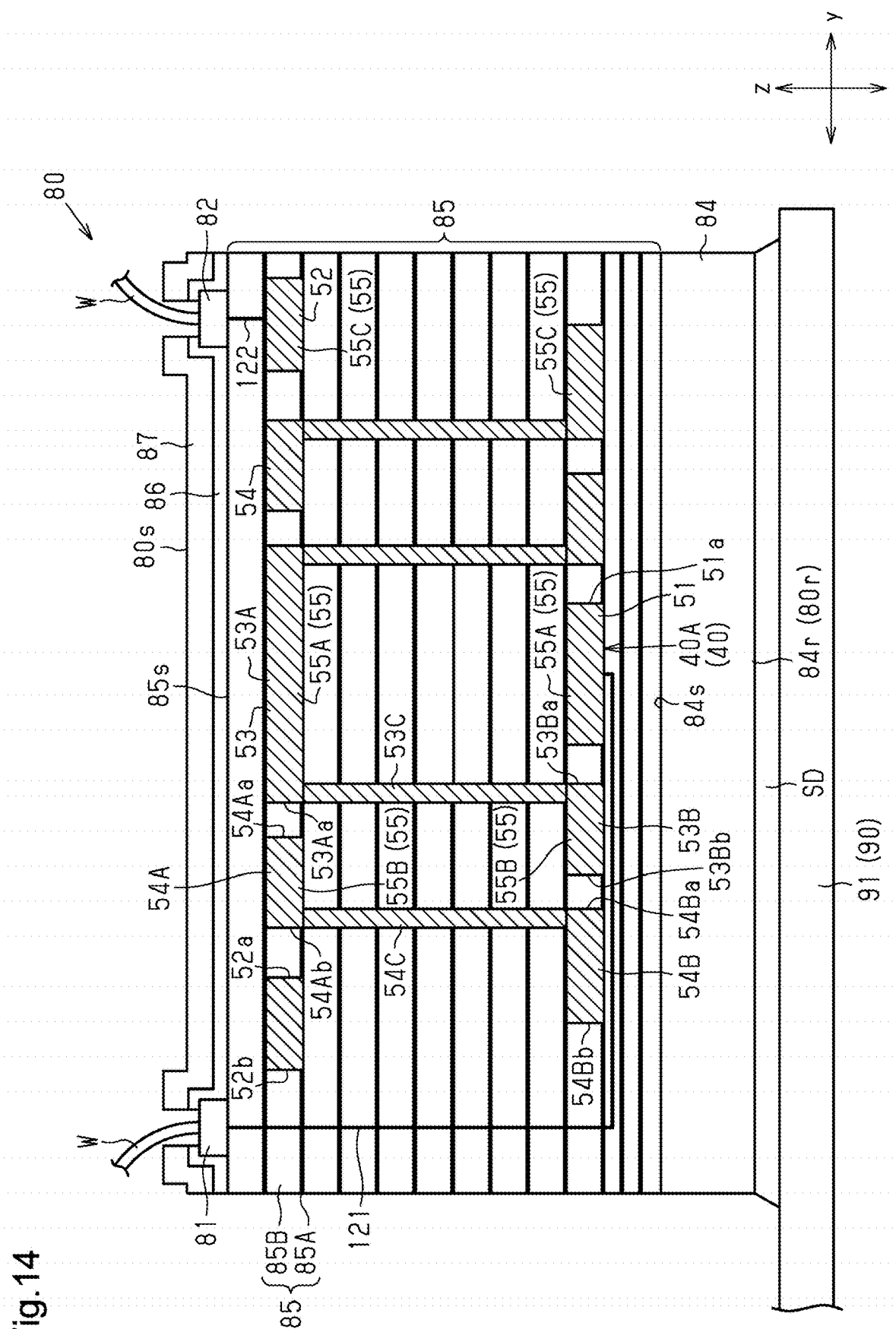
FIG. 14 is a schematic cross-sectional view of a capacitor chip in a modified example of a gate driver.

In each embodiment, the first electrode portion 51, the second electrode portion 52, and the intermediate electrode portions 53 and 54 of the capacitor 40A (40B) are located at different positions in the z-direction. However, there is no limit to such an arrangement. For example, as shown in FIG. 14, the first electrode portion 51, the second electrode portion 52, and the intermediate electrode portions 53 and 54 may be aligned with one another in the z-direction.

More specifically, the first lower electrode layer 53B of the first intermediate electrode portion 53 and the second lower electrode layer 54B of the second intermediate electrode portion 54 are aligned with the first electrode portion 51 in the z-direction. The first upper electrode layer 53A of the first intermediate electrode portion 53 and the second upper electrode layer 54A of the second intermediate electrode portion 54 are aligned with the second electrode portion 52 in the z-direction. In this structure, the distances D4 to D7 are set so that the capacitor chip 80 will have the set insulation voltage. It is preferred that the distances D4 to D7 be greater than or equal to the separation distances D1 to D3. However, the distances D4 to D7 may be less than the separation distances D1 to D3 within a range in which the capacitor chip 80 has the set insulation voltage.

In this structure, each of the separation distances D1 to D3 is increased. This increases the total value (D1+D2+D3) of the separation distance D1 between the first electrode portion 51 and the first upper electrode layer 53A of the first intermediate electrode portion 53, the separation distance D2 between the first lower electrode layer 53B and the second upper electrode layer 54A of the second intermediate electrode portion 54, and the separation distance D3 between the second lower electrode layer 54B and the second electrode portion 52, which correspond to the separation distance determining the insulation voltage of the capacitor 40A (40B). Thus, the dielectric strength of the capacitor 40A (40B) is improved, thereby improving the dielectric strength of the capacitor chip 80.

In each embodiment, the capacitor 40A (40B) includes the two intermediate electrode portions 53 and 54. However, the number of intermediate electrode portions may be changed in any manner. For example, the intermediate electrode portions may be one or three or more.

Figure 15:
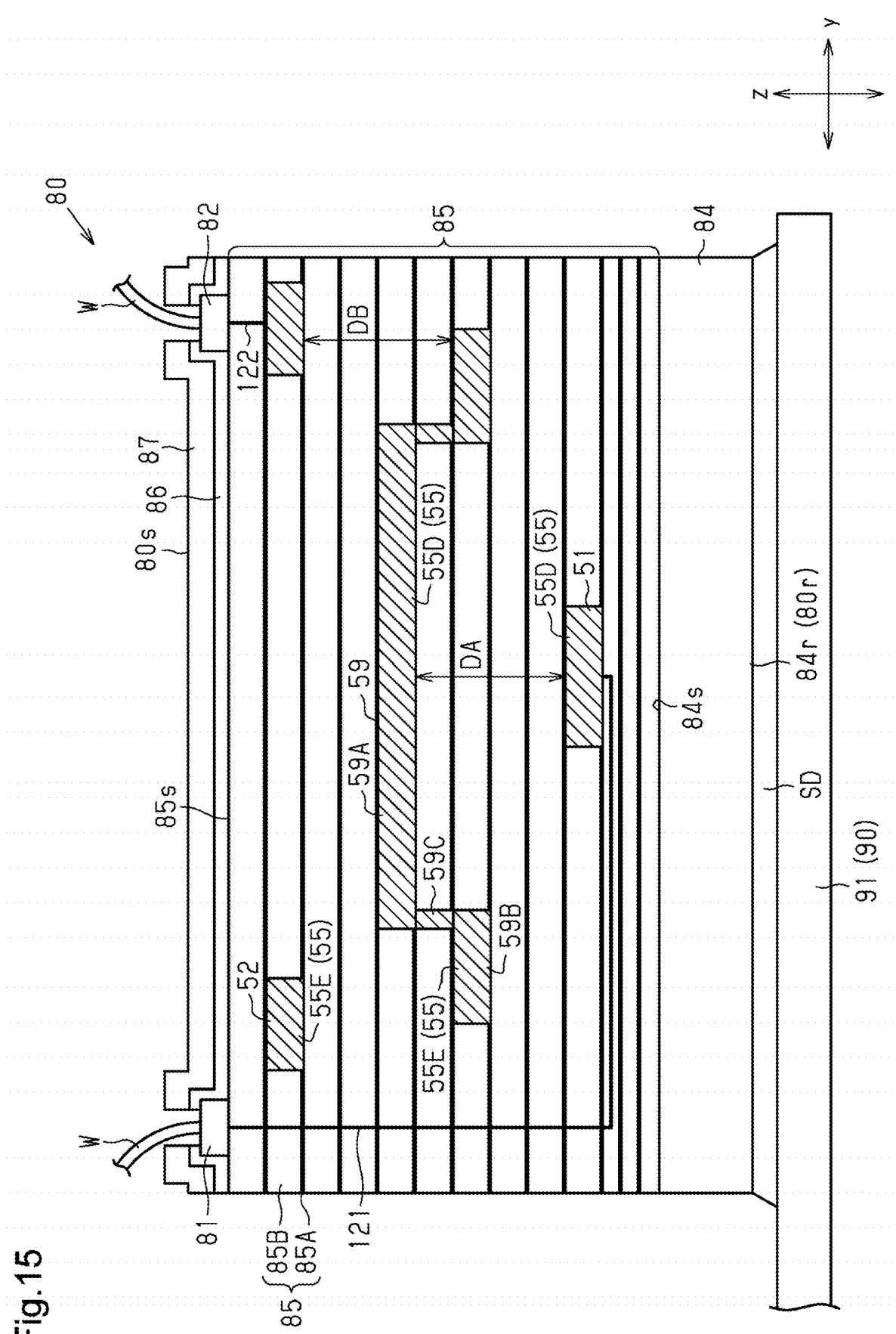
FIG. 15 is a schematic cross-sectional view of a capacitor chip in a modified example of a gate driver.

FIG. 15 is a cross-sectional view showing a cross-sectional structure of a capacitor chip 80 in which the capacitor 40A includes a single intermediate electrode portion 59.

As shown in FIG. 15, the capacitor 40A includes the first electrode portion 51, the second electrode portion 52, and the intermediate electrode portion 59. The intermediate electrode portion 59 is not connected to the first electrode portion 51 and the second electrode portion 52. In other words, the intermediate electrode portion 59 is electrically floating such that the intermediate electrode portion 59 is not fixed at an electric potential that is applied to the first electrode portion 51 and the second electrode portion 52.

The first electrode portion 51 is configured as the first electrode 41A of the capacitor 40A and is electrically connected to the first electrode pad 81 of the capacitor chip 80. The second electrode portion 52 is configured as the second electrode 42A of the capacitor 40A and is electrically connected to the second electrode pad 82 of the capacitor chip 80. The capacitor 40A is formed by coupling the first electrode portion 51 and the second electrode portion 52 through the intermediate electrode portion 59.

The intermediate electrode portion 59 has the same structure as, for example, the first intermediate electrode portion 53. The intermediate electrode portion 59 includes an upper electrode layer 59A corresponding to the first upper electrode layer 53A of the first intermediate electrode portion 53, a lower electrode layer 59B corresponding to the first lower electrode layer 53B of the first intermediate electrode portion 53, and a connector 59C corresponding to the first connector 53C of the first intermediate electrode portion 53.

The upper electrode layer 59A is opposed to the first electrode portion 51 in the z-direction. The upper electrode layer 59A is located above the first electrode portion 51. The upper electrode layer 59A is located farther away from the substrate 84 than the first electrode portion 51 is. In other words, the upper electrode layer 59A is located closer to the surface 85s of the insulation layers 85 than the first electrode portion 51 is. The upper electrode layer 59A and the first electrode portion 51 form a first capacitor cell 55D.

The lower electrode layer 59B is opposed to the second electrode portion 52 in the z-direction. The lower electrode layer 59B is located below the second electrode portion 52. The lower electrode layer 59B is located closer to the substrate 84 than the second electrode portion 52 is. In other words, the lower electrode layer 59B is located farther away from the surface 85s of the insulation layers 85 than the second electrode portion 52 is. The lower electrode layer 59B and the second electrode portion 52 form a second capacitor cell 55E. Since the lower electrode layer 59B is electrically connected to the upper electrode layer 59A by the connector 59C, the second capacitor cell 55E is connected in series to the first capacitor cell 55D. Thus, the intermediate electrode portion 59 has steps formed of the upper electrode layer 59A, the lower electrode layer 59B, and the connector 59C. This increases a separation distance DB between the lower electrode layer 59B and the second electrode portion 52 in the z-direction.

In the example shown, the second electrode portion 52 and the intermediate electrode portion 59 are located at different positions in the z-direction. More specifically, the second electrode portion 52 is located above the upper electrode layer 59A. In other words, the second electrode portion 52 is located closer to the surface 85s of the insulation layers 85 than the upper electrode layer 59A is.

In the example shown, the total value (DA+DB) of a separation distance DA, between the upper electrode layer 59A and the first electrode portion 51 in the z-direction, and the separation distance DB, between the lower electrode layer 59B and the second electrode portion 52 in the z-direction, is greater than the distance between the first electrode portion 51 and the second electrode portion 52 in the z-direction. In addition, the total value (DA+DB) may be greater than the thickness of the insulation layers 85. The thickness of the insulation layers 85 refers to a distance between the substrate main surface 84s and the surface 85s of the insulation layers 85 in the z-direction.

In the capacitor 40A having the structure described above, the opposing area of the upper electrode layer 59A and the first electrode portion 51, the separation distance DA, the opposing area of the lower electrode layer 59B and the second electrode portion 52, and the separation distance DB are set so that the capacitance of the first capacitor cell 55D is equal to the capacitance of the second capacitor cell 55E.

More specifically, the separation distance DA between the upper electrode layer 59A and the first electrode portion 51 in the z-direction is equal to the separation distance DB between the lower electrode layer 59B and the second electrode portion 52 in the z-direction. A first opposing area in which the upper electrode layer 59A is opposed to the first electrode portion 51 is equal to a second opposing area in which the lower electrode layer 59B is opposed to the second electrode portion 52. When the difference between the separation distance DA and the separation distance DB is, for example, within 20% of the separation distance DA, it is considered that the separation distance DA is equal to the separation distance DB. Also, when the difference between the first opposing area and the second opposing area is, for example, within 20% of the first opposing area, it is considered that the first opposing area is equal to the second opposing area.

As described above, when the separation distance DA and the first opposing area are set to be equal to the separation distance DA and the second opposing area, the capacitance of the first capacitor cell 55D is equal to the capacitance of the second capacitor cell 55E. This structure obtains advantages similar to those of the first embodiment.

In the capacitor chip 80 of the modified example shown in FIG. 15, the upper electrode layer 59A may be aligned with the second electrode portion 52 in the z-direction, and the lower electrode layer 59B may be aligned with the first electrode portion 51 in the z-direction.

Figure 16:
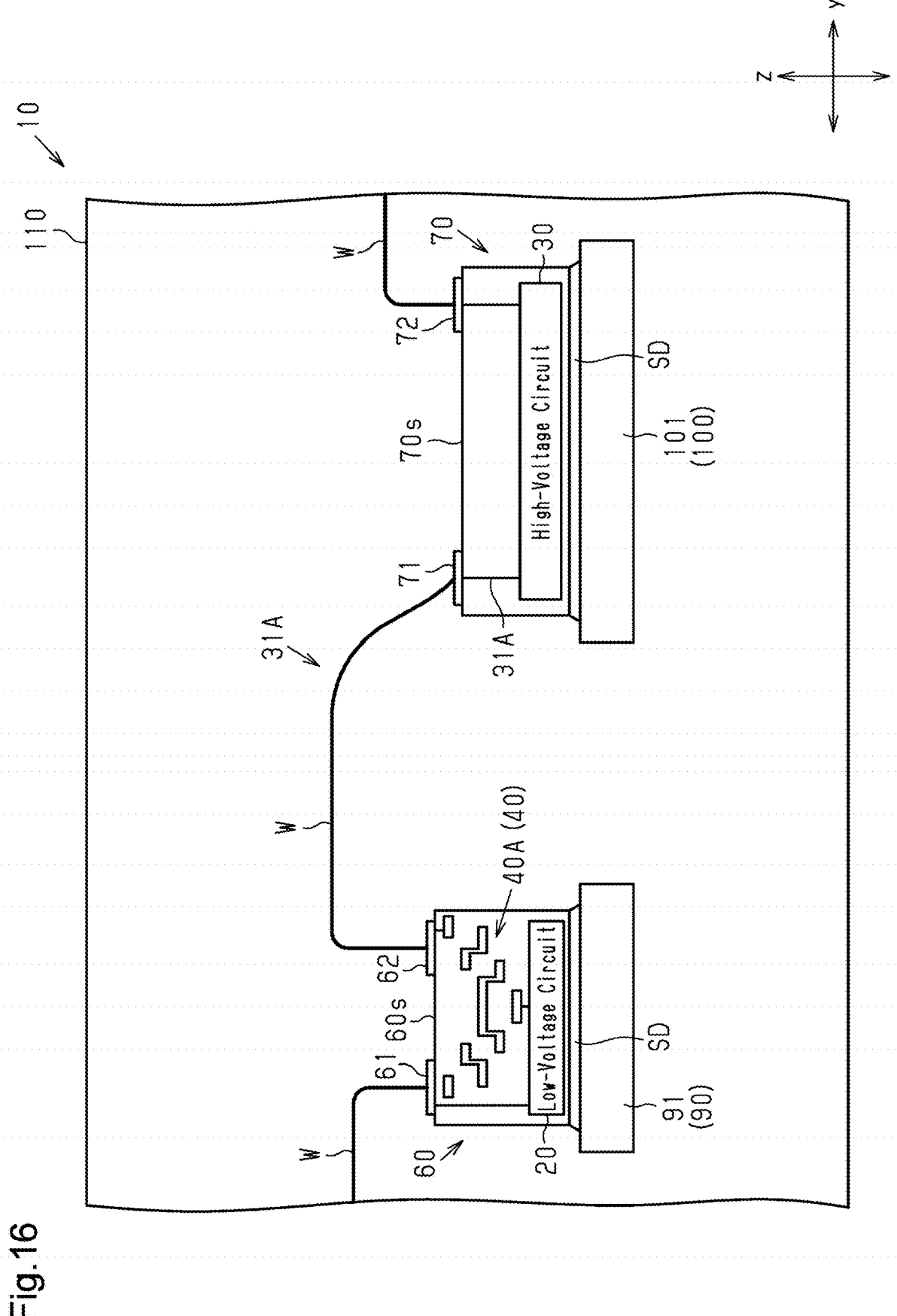
FIG. 16 is a schematic cross-sectional view showing a portion of a modified example of a gate driver.

In the first to fourth embodiments, the low-voltage circuit 20 and the capacitor 40 are formed in separate chips. Instead, for example, as shown in FIG. 16, the capacitor 40 and the low-voltage circuit 20 may be mounted on a single chip. In an example, the low-voltage circuit chip 60 may include both the low-voltage circuit 20 and the capacitor 40. That is, the capacitor 40 may be arranged in insulation layers stacked on the substrate of the low-voltage circuit chip 60. In this case, the first electrode portion 51, the second electrode portion 52, and the intermediate electrode portions 53 and 54 of the capacitor 40 are embedded in the insulation layers. In an example, although not shown, the low-voltage circuit 20 may be formed on the substrate 84 of the capacitor chip 80.

Figure 17:
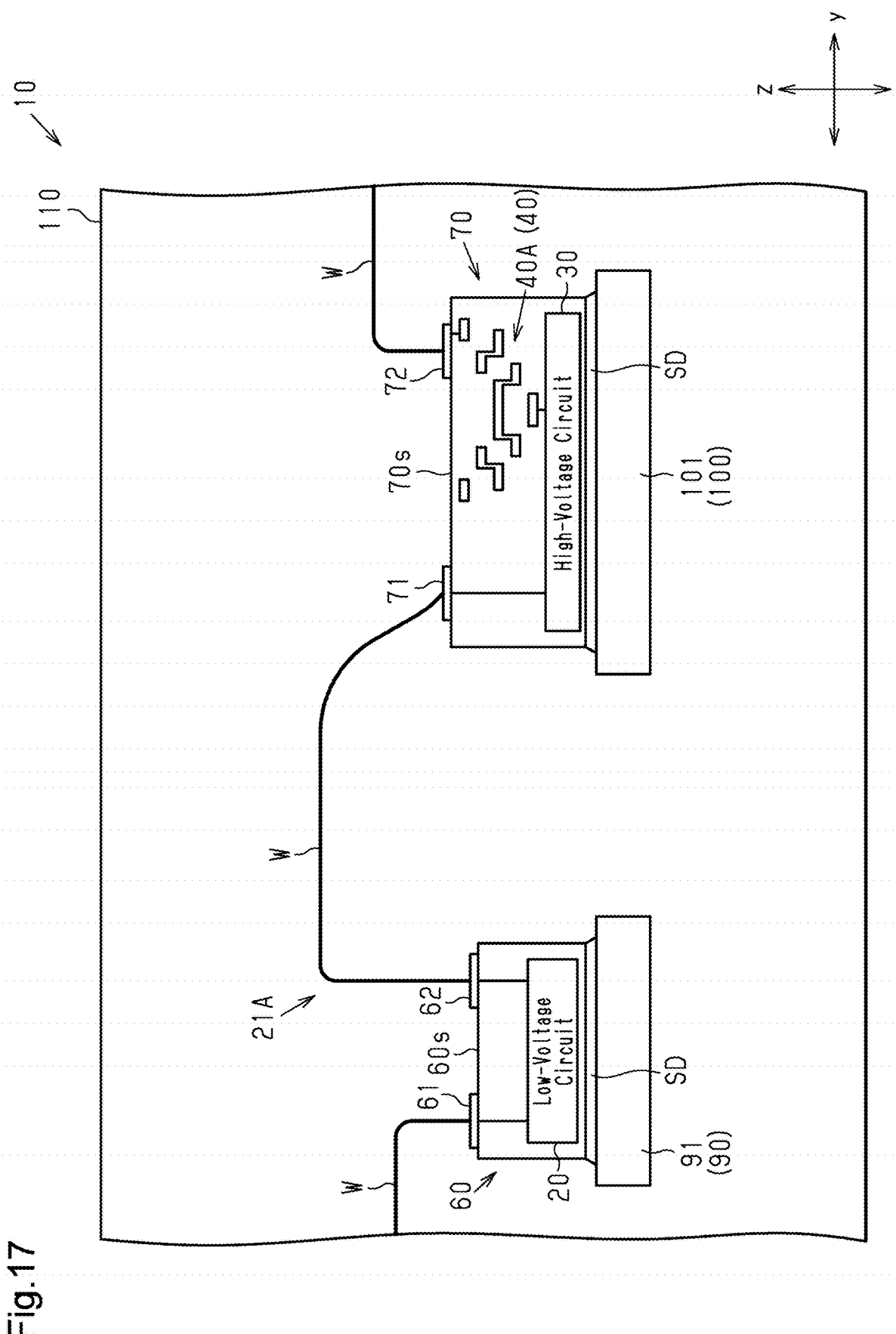
FIG. 17 is a schematic cross-sectional view showing a portion of a modified example of a gate driver.

In the first to fifth embodiments, the high-voltage circuit 30 and the capacitor 40 are formed in separate chips. Instead, for example, as shown in FIG. 17, the capacitor 40 and the high-voltage circuit 30 may be mounted on a single chip. In an example, the high-voltage circuit chip 70 may include both the high-voltage circuit 30 and the capacitor 40. That is, the capacitor 40 may be arranged in insulation layers stacked on the substrate of the high-voltage circuit chip 70. In this case, the first electrode portion 51, the second electrode portion 52, and the intermediate electrode portions 53 and 54 of the capacitor 40 are embedded in the insulation layers. In an example, although not shown, the high-voltage circuit 30 may be formed on the substrate 84 of the capacitor chip 80. In this case, the capacitor chip 80 is mounted on the high-voltage die pad 101.

The structure of the capacitor 40 in the second embodiment may be applied to the third embodiment. More specifically, the insulating module 220 may include the first capacitor chip 80A and the second capacitor chip 80B. As described above, the insulating module 220 may include multiple capacitor chips.

The structure of the capacitor 40 in the second embodiment may be applied to the fourth embodiment. More specifically, the low-voltage circuit unit 300 may include the low-voltage circuit chip 60, the first capacitor chip 80A, and the second capacitor chip 80B. As described above, the low-voltage circuit unit 300 may include multiple capacitor chips.

The structure of the capacitor 40 in the second embodiment may be applied to the fifth embodiment. More specifically, the high-voltage circuit unit 410 may include the high-voltage circuit chip 70, the first capacitor chip 80A, and the second capacitor chip 80B. As described above, the high-voltage circuit unit 410 may include multiple capacitor chips.

In the first embodiment, the capacitor chip 80 may be mounted on the high-voltage die pad 101. In the capacitor chip 80, the first electrode 41A is separated from the high-voltage die pad 101 by a distance sufficient to maintain insulation between the capacitor chip 80 and the high-voltage die pad 101 even when the second reference potential of the high-voltage die pad 101 fluctuates and becomes high.

In the second embodiment, both the first capacitor chip 80A and the second capacitor chip 80B may be mounted on the low-voltage die pad 91. In the second capacitor chip 80B, the second electrode 48A (48B) is separated from the low-voltage die pad 91 by a distance sufficient to maintain insulation between the second capacitor chip 80B and the low-voltage die pad 91 even when the second reference potential of the high-voltage die pad 101 fluctuates and becomes high.

The first capacitor chip 80A and the second capacitor chip 80B may be mounted on the high-voltage die pad 101. In the first capacitor chip 80A, the first electrode 45A (45B) is separated from the high-voltage die pad 101 by a distance sufficient to maintain insulation between the first capacitor chip 80A and the high-voltage die pad 101 even when the second reference potential of the high-voltage die pad 101 fluctuates and becomes high.

Figure 18:
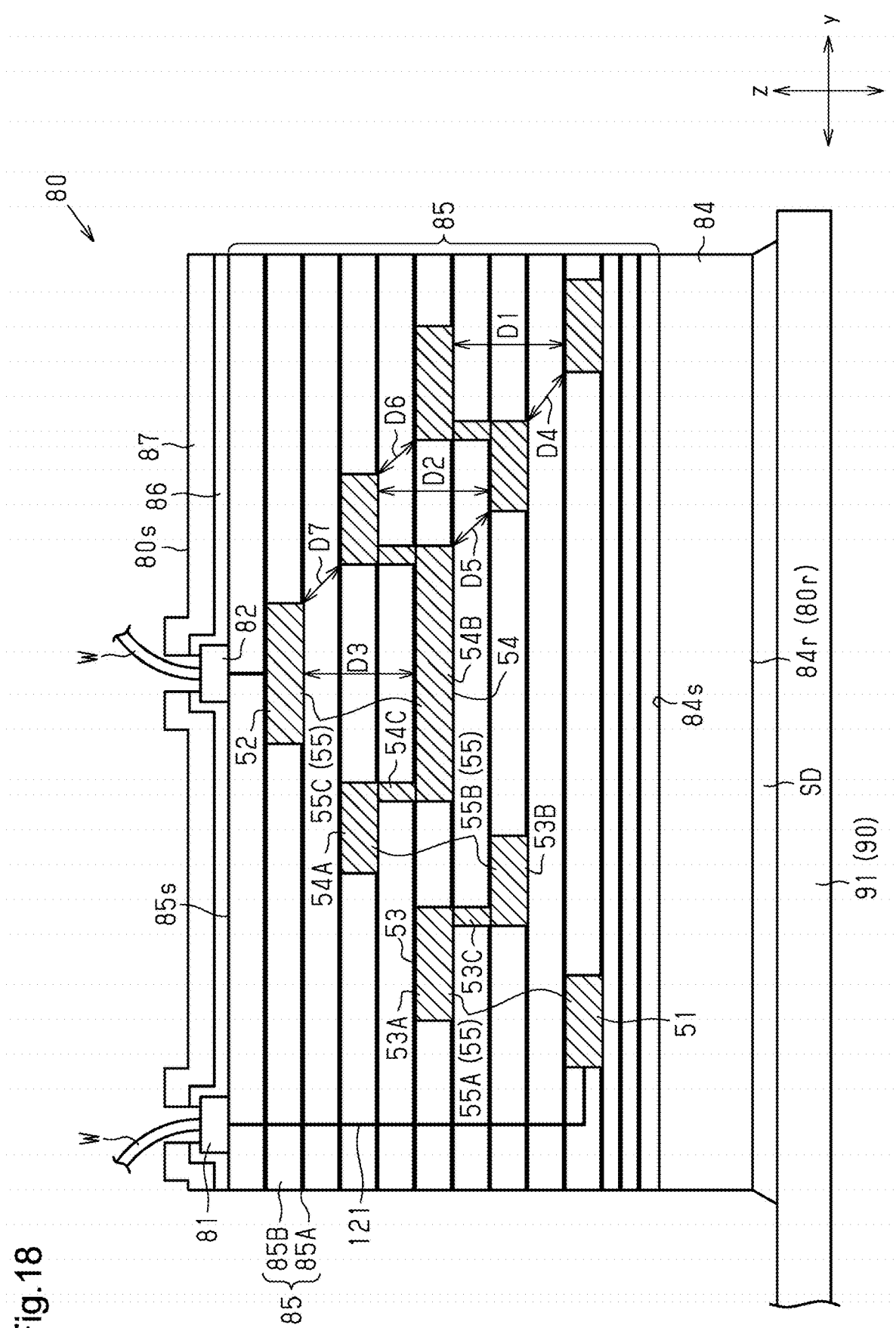
FIG. 18 is a schematic cross-sectional view showing a modified example of a capacitor chip.

In the capacitor chip 80 (80A, 80B) of each embodiment, the first electrode portion 51, the second electrode portion 52, and the intermediate electrode portions 53 and 54 of the capacitor 40A (40B, 43A, 43B, 44A, 44B) may be changed in any manner. In an example, as shown in FIG. 18, the shape of the first electrode portion 51 in plan view is a rectangular ring, and the shape of the second electrode portion 52 in plan view is a rectangular plate. In plan view, the first electrode portion 51 surrounds the second electrode portion 52.

The first intermediate electrode portion 53, which is opposed to the first electrode portion 51 in the z-direction, includes the first upper electrode layer 53A, the first lower electrode layer 53B, and the first connector 53C.

The first upper electrode layer 53A is opposed to the first electrode portion 51 in the z-direction. This forms the capacitor cell 55A. The shape of the first upper electrode layer 53A in plan view is a rectangular ring.

In plan view, the first lower electrode layer 53B is shifted from the first upper electrode layer 53A. In plan view, the first lower electrode layer 53B includes a portion extending inward from the first upper electrode layer 53A. The shape of the first lower electrode layer 53B in plan view is a rectangular ring. In plan view, the first lower electrode layer 53B is located inward from the first electrode portion 51.

The first connector 53C is configured to connect the first upper electrode layer 53A and the first lower electrode layer 53B and is in contact with the inner peripheral end of the first upper electrode layer 53A and the outer peripheral end of the first lower electrode layer 53B. The first connector 53C extends in the z-direction.

The second intermediate electrode portion 54, which is opposed to the first intermediate electrode portion 53 in the z-direction, includes the second upper electrode layer 54A, the second lower electrode layer 54B, and the connector 54C.

The second upper electrode layer 54A is opposed to the first lower electrode layer 53B in the z-direction. This forms the second capacitor cell 55B. Since the first lower electrode layer 53B is connected to the first upper electrode layer 53A by the first connector 53C, the second capacitor cell 55B is connected in series to the capacitor cell 55A. The shape of the second upper electrode layer 54A in plan view is a rectangular ring. In plan view, the second upper electrode layer 54A is located inward from the first upper electrode layer 53A.

In plan view, the second lower electrode layer 54B is shifted from the second upper electrode layer 54A. In plan view, the second lower electrode layer 54B has a portion extending inward from the second upper electrode layer 54A. The shape of the second lower electrode layer 54B in plan view is a rectangular plate. In plan view, the second lower electrode layer 54B is located inward from the first lower electrode layer 53B.

The second connector 54C is configured to connect the second upper electrode layer 54A and the second lower electrode layer 54B and is in contact with the inner peripheral end of the second upper electrode layer 54A and the outer peripheral end of the second lower electrode layer 54B. The second connector 54C extends in the z-direction.

The second electrode portion 52 is opposed to the second lower electrode layer 54B in the z-direction. This forms the third capacitor cell 55C. Since the second lower electrode layer 54B is connected to the second upper electrode layer 54A by the second connector 54C, the third capacitor cell 55C is connected in series to the second capacitor cell 55B. The shape of the second electrode portion 52 in plan view is a rectangular plate. In plan view, the second electrode portion 52 is located inward from the second upper electrode layer 54A.

In the present embodiment, the layout and the size of the first electrode portion 51, the second electrode portion 52, the first intermediate electrode portion 53, and the second intermediate electrode portion 54 are set so that the capacitance of the capacitor cell 55A, the capacitance of the second capacitor cell 55B, and the capacitance of the third capacitor cell 50C are equal to each other. More specifically, the opposing area of the first electrode portion 51 and the first upper electrode layer 53A of the first intermediate electrode portion 53, the separation distance D1, the opposing area of the first lower electrode layer 53B and the second upper electrode layer 54A of the second intermediate electrode portion 54, the separation distance D2, the opposing area of the second lower electrode layer 54B and the second electrode portion 52, and the separation distance D3 are set so that the capacitance of the capacitor cell 55A, the capacitance of the second capacitor cell 55B, and the capacitance of the third capacitor cell 55C are equal to each other.

In an example, the separation distance D1 between the first electrode portion 51 and the first upper electrode layer 53A in the z-direction, the separation distance D2 between the first lower electrode layer 53B and the second upper electrode layer 54A in the z-direction, and the separation distance D3 between the second lower electrode layer 54B and the second electrode portion 52 in the z-direction are equal to each other. When the maximum value of variations between the separation distance D1, the separation distance D2, and the separation distance D3 is, for example, within 20% of the separation distance D1, it is considered that the separation distance D1, the separation distance D2, and the separation distance D3 are equal to each other.

A first opposing area in which the first electrode portion 51 is opposed to the first upper electrode layer 53A, a second opposing area in which the first lower electrode layer 53B is opposed to the second upper electrode layer 54A, and a third opposing area in which the second lower electrode layer 54B is opposed to the second electrode portion 52 are equal to each other. When the maximum value of variations between the first opposing area, the second opposing area, and the third opposing area is, for example, within 20% of the first opposing area, it is considered that the first opposing area, the second opposing area, the third opposing area are equal to each other.

When the separation distance D1 and the first opposing area, the separation distance D2 and the second opposing area, and the separation distance D3 and the third opposing area are set to be equal to each other, the capacitance of the capacitor cell 55A, the capacitance of the second capacitor cell 55B, and the capacitance of the third capacitor cell 55C are equal to each other. This structure obtains the same advantages as the first embodiment.

In FIG. 18, which schematically shows a cross-sectional structure of the capacitor chip 80, the distance D4 between the first electrode portion 51 and the first lower electrode layer 53B is less than the separation distance D1 between the first electrode portion 51 and the first upper electrode layer 53A for the sake of convenience. However, in an actual structure, the distance D4 is greater than or equal to the separation distance D1. Also, in FIG. 18, the distance D5 between the first upper electrode layer 53A and the second upper electrode layer 54A is less than the separation distance D2 between the first lower electrode layer 53B and the second upper electrode layer 54A. However, in an actual structure, the distance D5 is greater than or equal to the separation distance D2. In FIG. 18, the distance D6 between the first lower electrode layer 53B and the second lower electrode layer 54B is less than the separation distance D2. However, in an actual structure, the distance D6 is greater than or equal to the separation distance D2. In FIG. 18, the distance D7 between the second upper electrode layer 54A and the second electrode portion 52 is less than the separation distance D3 between the second lower electrode layer 54B and the second electrode portion 52. In an actual structure, the distance D7 is greater than or equal to the separation distance D3.

In each embodiment, the gate driver 10 is configured to transmit a signal from the low-voltage circuit 20 to the high-voltage circuit 30. Instead, for example, the gate driver 10 may be configured to transmit a signal from the low-voltage circuit 20 to the high-voltage circuit 30 and also transmit a signal from the high-voltage circuit 30 to the low-voltage circuit 20. An example of a structure in which the gate driver 10 of the first embodiment further includes a signal path for transmitting a signal from the high-voltage circuit 30 to the low-voltage circuit 20 will be described with reference to FIG. 19.

Figure 19:
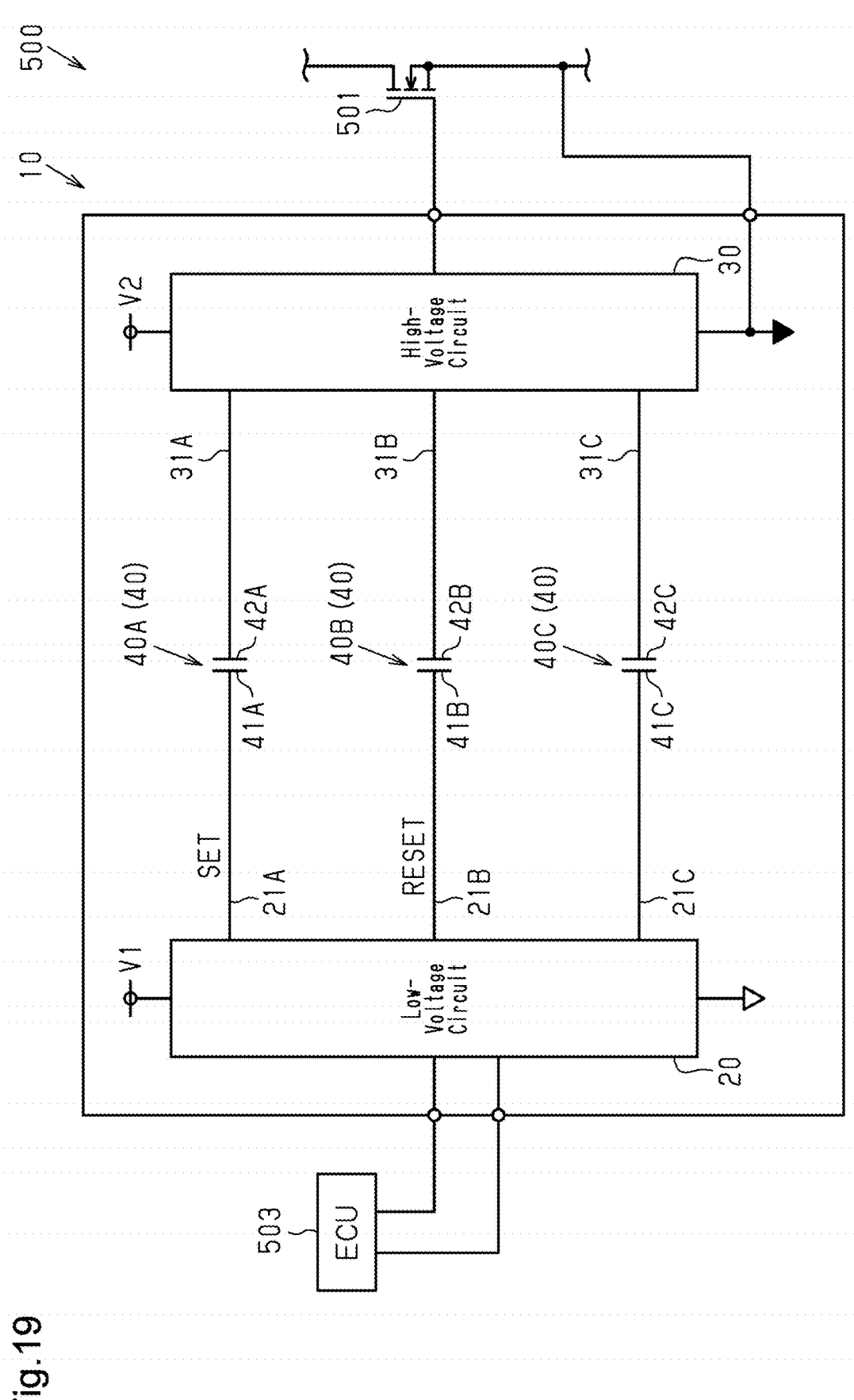
FIG. 19 is a schematic circuit diagram showing a modified example of a gate driver.

As shown in FIG. 19, the first electrode 41A (41B) of the capacitor 40A (40B) is electrically connected to the low-voltage circuit 20, and the second electrode 42A(42B) is electrically connected to the high-voltage circuit 30. Thus, the capacitors 40A and 40B each correspond to a first signal capacitor.

The set signal output from the low-voltage circuit 20 is transmitted to the high-voltage circuit 30 through the capacitor 40A, and the reset signal output from the low-voltage circuit 20 is transmitted to the high-voltage circuit 30 through the capacitor 40B. In other words, the first signal output from the low-voltage circuit 20 is transmitted to the high-voltage circuit 30 through the first signal capacitor.

As shown in FIG. 19, the gate driver 10 further includes a capacitor 40C, a low-voltage signal line 21C, and a high-voltage signal line 31C. The capacitor 40C corresponds to a second signal capacitor.

The capacitor 40C insulates the high-voltage circuit 30 from the low-voltage circuit 20 while transmitting a signal from the high-voltage circuit 30 toward the low-voltage circuit 20. In an example, the signal is for detecting an anomaly in the temperature of the switching element 501 and corresponds to a second signal. The capacitor 40C includes a first electrode 41C and a second electrode 42C. The first electrode 41C is electrically connected to the high-voltage circuit 30. The second electrode 42C is electrically connected to the low-voltage circuit 20.

As described above, in the modified example shown in FIG. 19, the gate driver 10 is configured to bidirectionally transmit signals between the low-voltage circuit 20 and the high-voltage circuit 30 through the capacitor 40 (40A, 40B, 40C). The signals include a first signal transmitted from the low-voltage circuit 20 toward the high-voltage circuit 30 and a second signal transmitted from the high-voltage circuit 30 toward the low-voltage circuit 20.

Although not shown, the capacitor chip 80 includes the capacitors 40A, 40B, and 40C. More specifically, the capacitors 40A, 40B, and 40C are arranged in a single chip. Although not shown, in plan view, the capacitors 40A to 40C are aligned with each other in the y-direction and separated from each other in the x-direction. The first electrode 41C of the capacitor 40C is electrically connected to the second electrode pad 82. The second electrode 42C is electrically connected to the first electrode pad 81. Since the second electrode pad 82 is connected to the first electrode pad 71 of the high-voltage circuit chip 70 by a wire W, the first electrode 41C is electrically connected to the high-voltage circuit 30 through the second electrode pad 82 and the wire W. Since the first electrode pad 81 is connected to the second electrode pad 62 of the low-voltage circuit chip 60 by a wire W, the second electrode 42C is electrically connected to the low-voltage circuit 20 through the first electrode pad 81 and the wire W.

Although not shown, the capacitor 40C has the same structure as the capacitors 40A and 40B. The correspondence relationship of the first electrode 41C and the second electrode 42C in the capacitor 40C with the first electrode portion 51 and the second electrode portion 52 differs from that of the capacitors 40A and 40B. The second electrode portion 52 of the capacitor 40C is configured as the first electrode 41C of the capacitor 40C. The first electrode portion 51 of the capacitor 40C is configured as the second electrode 42C of the capacitor 40C.

Figure 20:
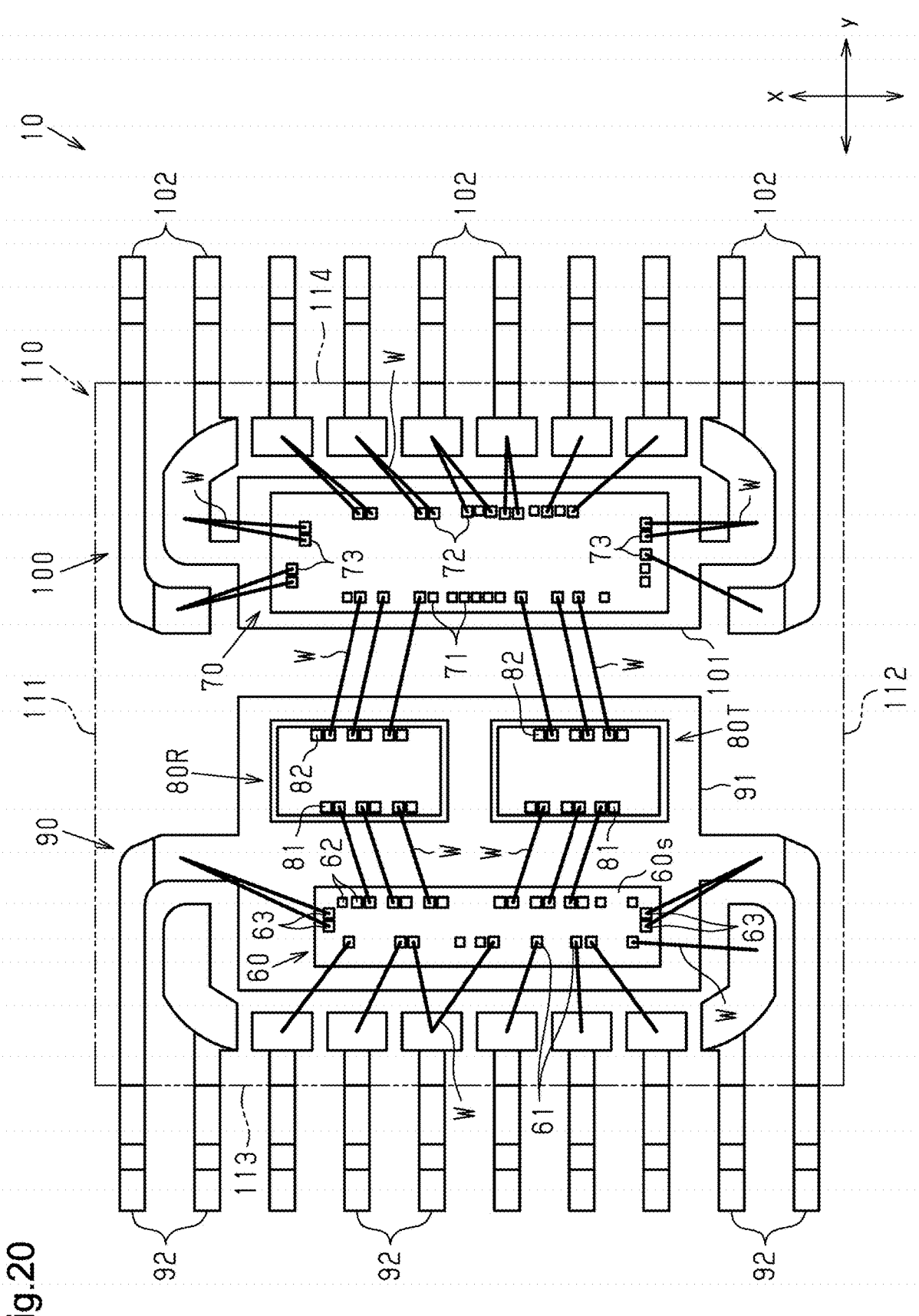
FIG. 20 is a plan view showing an internal structure of the gate driver shown in FIG. 19.

In the gate driver 10 of the modified example shown in FIG. 19, the structure of the capacitor chip may be changed as follows. More specifically, as shown in FIG. 20, the gate driver 10 including the capacitor 40C shown in FIG. 19 may include a capacitor chip 80T transmitting a signal (first signal) from the low-voltage circuit 20 to the high-voltage circuit 30 and a capacitor chip 80R transmitting a signal (second signal) from the high-voltage circuit 30 to the low-voltage circuit 20, instead of the capacitor chip 80. In the example shown, the capacitor chips 80T and 80R are mounted on the low-voltage die pad 91. The capacitor chip 80T and the capacitor chip 80R are aligned with each other in the y-direction and separated from each other in the x-direction. The capacitor chip 80T corresponds to a first capacitor chip including the first signal capacitor. The capacitor chip 80R corresponds to a second capacitor chip including a second signal capacitor.

The capacitor chip 80T includes the capacitor 40A and the capacitor 40B. More specifically, the two capacitors 40A and 40B are arranged in a single chip. More specifically, the capacitor chip 80T is a semiconductor chip that is separate from the low-voltage circuit chip 60 and the high-voltage circuit chip 70 (refer to FIG. 2) and is dedicated to the capacitors 40A and 40B. The two capacitors 40A and 40B in the capacitor chip 80T have the same structure as the two capacitors 40A and 40B in the capacitor chip 80.

The capacitor chip 80R includes the capacitor 40C. More specifically, the capacitor 40C is arranged in a single chip. More specifically, the capacitor chip 80R is a semiconductor chip dedicated to the capacitor 40C, which differs from the low-voltage circuit chip 60, the high-voltage circuit chip 70, and the capacitor chip 80T. The capacitor 40C in the capacitor chip 80R has the same structure as the two capacitors 40A and 40B in the capacitor chip 80.

In each embodiment, the capacitor chip 80 may include one or more resin layers as the insulation layer in which the capacitors 40A to 40C are embedded. The resin layers may include a material including any one of polyimide resin, phenol resin, and epoxy resin. Alternatively, as the insulation layer in which the capacitors 40A to 40C are embedded, the capacitor chip 80 may include an oxide film and a resin layer as in the insulation layer 85.

In each embodiment, the structure of the connectors 53C and 54C may be changed in any manner. In an example, in plan view, multiple first connectors 53C may be separated from each other in the circumferential direction of the electrode layers 53A and 53B and overlap both the first upper electrode layer 53A and the first lower electrode layer 53B. In an example, in plan view, multiple second connectors 54C may be separated from each other in the circumferential direction of the electrode layers 54A and 54B and overlap both the second upper electrode layer 54A and the second lower electrode layer 54B. That is, the first connector 53C may have any structure that electrically connects the first upper electrode layer 53A and the first lower electrode layer 53B. The second connector 54C may have any structure that electrically connects the second upper electrode layer 54A and the second lower electrode layer 54B.

In the first and third to fifth embodiments, at least one of the separation distances D1 to D3 may differ from the others by, for example, adjusting the opposing area of the first electrode portion 51 and the first upper electrode layer 53A, the opposing area of the first lower electrode layer 53B and the second upper electrode layer 54A, and the opposing area of the second lower electrode layer 54B and the second electrode portion 52 in a range in which the capacitances of the capacitor cell 55A, the second capacitor cell 55B, and the third capacitor cell 55C are equal to each other. In the same manner, at least one of the opposing area of the first electrode portion 51 and the first upper electrode layer 53A, the opposing area of the first lower electrode layer 53B and the second upper electrode layer 54A, and the opposing area of the second lower electrode layer 54B and the second electrode portion 52 may differ from the others by adjusting, for example, the separation distances D1 to D3 in a range in which the capacitances of the capacitor cell 55A, the second capacitor cell 55B, and the third capacitor cell 55C are equal to each other. The capacitors 43A(43B) and 44A(44B) of the second embodiment may be changed in the same manner.

In the first and third to fifth embodiments, at least one of the capacitance of the capacitor cell 55A, the capacitance of the second capacitor cell 55B, and the capacitance of the third capacitor cell 55C may differ from the others. The capacitors 43A(43B) and 44A(44B) of the second embodiment may be changed in the same manner.

In the modified example shown in FIG. 15, the separation distances DA and DB may differ from each other by adjusting, for example, the opposing area of the first electrode portion 51 and the upper electrode layer 59A and the opposing area of the second electrode portion 52 and the lower electrode layer 59B in a range in which the capacitance of the first capacitor cell 55D is equal to the capacitance of the second capacitor cell 55E. Also, the opposing area of the first electrode portion 51 and the upper electrode layer 59A and the opposing area of the second electrode portion 52 and the lower electrode layer 59B may differ from each other by adjusting, for example, the separation distances DA and DB in a range in which the capacitance of the first capacitor cell 55D is equal to the capacitance of the second capacitor cell 55E.

In the modified example shown in FIG. 15, the capacitance of the first capacitor cell 55D may differ from the capacitance of the second capacitor cell 55E.

In the third embodiment, the insulating module 220 may be used in a circuit other than the gate driver 10. Also, the low-voltage circuit unit 300 of the fourth embodiment and the high-voltage circuit unit 410 of the fifth embodiment may be used in a circuit other than the gate driver 10.

In the present disclosure, the term "on" includes the meaning of "above" in addition to the meaning of "on" unless otherwise clearly indicated in the context. Thus, the phrase "A is formed on B" is intended to mean that A may be disposed directly on B in contact with B in the present embodiment and also that A may be disposed above B without contacting B in a modified example. In other words, the term "on" does not exclude a structure in which another member is formed between A and B.

The z-direction as referred to in the present disclosure does not necessarily have to be the vertical direction and does not necessarily have to fully conform to the vertical direction. In the structures according to the present disclosure, "upward" and "downward" in the z-direction as referred to in the present description are not limited to "upward" and "downward" in the vertical direction. In an example, the x-direction may conform to the vertical direction. In another example, the y-direction may conform to the vertical direction.

In this specification, "at least one of A and B" should be understood to mean "only A, only B, or both A and B."

Clauses

The technical aspects that are understood from the embodiments and the modified examples will be described below. The reference signs of the elements in the embodiments are given to the corresponding elements in clauses with parentheses. The reference signs used as examples to facilitate understanding, and the elements in each clause are not limited to those elements given with the reference signs.

[Clause 1] An isolator (80) including:
an insulation layer (85); and
a capacitor (40/40A, 40B, 40C) embedded in the insulation layer (85), where
the capacitor (40/40A, 40B, 40C) includes a first electrode portion (51) arranged in the insulation layer (85) and connected to a first pad (81) formed on a surface (85s) of the insulation layer (85), a second electrode portion (52) arranged in the insulation layer (85) and connected to a second pad (82) formed on the surface (85s) of the insulation layer (85), and an intermediate electrode portion (53, 54) arranged in the insulation layer (85) and not connected to the first electrode portion (51) and the second electrode portion (52), the intermediate electrode portion (53, 54) includes a first intermediate layer (53A, 54A) and a second intermediate layer (53B, 54B) differing from each other in position in a thickness-wise direction (z-direction) of the insulation layer (85), and a connector (53C, 54C) extending in the thickness-wise direction (z-direction) of the insulation layer (85) and connecting the first intermediate layer (53A, 54A) and the second intermediate layer (53B, 54B), and the capacitor (40/40A, 40B, 40C) is formed by coupling the first electrode portion (51) and the second electrode portion (52) through the intermediate electrode portion (53, 54).

[Clause 2] The isolator according to clause 1, where the intermediate electrode portion (53, 54) includes multiple intermediate electrode portions, the first electrode portion (51) and the second electrode portion (52) are coupled through the multiple intermediate electrode portions (53, 54) to form the capacitor (40/40A, 40C), the multiple intermediate electrode portions (53, 54) include a first intermediate electrode portion (53) and a second intermediate electrode portion (54), the first intermediate layer (53A) of the first intermediate electrode portion (53) and the first electrode portion (51) are separated and opposed to each other in the thickness-wise direction (z-direction) of the insulation layer (85) to form a first capacitor cell (55A), as viewed in the thickness-wise direction (z-direction) of the insulation layer (85), the second intermediate layer (53B) of the first intermediate electrode portion (53) and the first intermediate layer (53A) of the first intermediate electrode portion (53) are arranged at different positions, and the second intermediate layer (53B) of the first intermediate electrode portion (53) and the first intermediate layer (54A) of the second intermediate electrode portion (54) are separated and opposed to each other in the thickness-wise direction (z-direction) of the insulation layer (85) to form a second capacitor cell (55B) that is connected in series to the first capacitor cell (55A) through the connector (53C) of the first intermediate electrode portion (53).

[Clause 3] The isolator according to clause 2, where the first intermediate layer (53A) of the first intermediate electrode portion (53) is circular or polygonal as viewed in the thickness-wise direction (z-direction) of the insulation layer (85), as viewed in the thickness-wise direction (z-direction) of the insulation layer (85), the second intermediate layer (53B) of the first intermediate electrode portion (53) and the first intermediate layer (54A) of the second intermediate electrode portion (54) are ring-shaped and surround the first intermediate layer (53A) of the first intermediate electrode portion (53), and as viewed in the thickness-wise direction (z-direction) of the insulation layer (85), the second intermediate layer (54B) of the second intermediate electrode portion (54) is ring-shaped and surrounds the first intermediate layer (54A) of the second intermediate electrode portion (54).

[Clause 4] The isolator according to clause 2 or 3, where in the thickness-wise direction (z-direction) of the insulation layer (85), the second intermediate layer (53B) of the first intermediate electrode portion (53) is arranged between the first intermediate layer (53A) of the first intermediate electrode portion (53) and the first electrode portion (51), and in the thickness-wise direction (z-direction) of the insulation layer (85), the first intermediate layer (54A) of the second intermediate electrode portion (54) is arranged closer to the surface (85s) of the insulation layer (85) than the first intermediate layer (53A) of the first intermediate electrode portion (53) is.

[Clause 5] The isolator according to any one of clauses 2 to 4, where an area of the first intermediate layer (53A) of the first intermediate electrode portion (53) opposed to the first electrode portion (51), a separation distance (D1) between the first intermediate layer (53A) of the first intermediate electrode portion (53) and the first electrode portion (51), an area of the second intermediate layer (53B) of the first intermediate electrode portion (51) opposed to the first intermediate layer (54A) of the second intermediate electrode portion (54), and a separation distance (D2) between the second intermediate layer (53B) of the first intermediate electrode portion (51) and the first intermediate layer (54A) of the second intermediate electrode portion (54) are set so that a capacitance of the first capacitor cell (55A) is equal to a capacitance of and the second capacitor cell (55B).

[Clause 6] The isolator according to any one of clauses 2 to 5, where as viewed in the thickness-wise direction (z-direction) of the insulation layer (85), the second intermediate layer (54B) of the second intermediate electrode portion (54) and the first intermediate layer (54A) of the second intermediate electrode portion (54) are arranged at different positions, and the second intermediate layer (54B) of the second intermediate electrode portion (54) and the second electrode portion (52) are separated and opposed to each other in the thickness-wise direction (z-direction) of the insulation layer (85) to form a third capacitor cell (55C) that is connected in series to the second capacitor cell (55B) through the connector (54C) of the second intermediate electrode portion (54).

[Clause 7] The isolator according to clause 6, where in the thickness-wise direction (z-direction) of the insulation layer (85), the second intermediate layer (54B) of the second intermediate electrode portion (54) is arranged between the second intermediate layer (53B) of the first intermediate electrode portion (53) and the second electrode portion (52).

[Clause 8] The isolator according to clause 6 or 7, where a capacitance of the first capacitor cell (55A) is equal to a capacitance of the second capacitor cell (55B), and an area of the second intermediate layer (54B) of the second intermediate electrode portion (54) opposed to the second electrode portion (52) and a separation distance (D3) between the second intermediate layer (54B) of the second intermediate electrode portion (54)

and the second electrode portion (52) are set so that the capacitance of the first capacitor cell (55A) and the second capacitor cell (55B) are equal to a capacitance of the third capacitor cell (55C).

[Clause 9] The isolator according to clause 1, where the first intermediate layer (59A) and the first electrode portion (51) are separated and opposed to each other in the thickness-wise direction (z-direction) of the insulation layer (85) to form a first capacitor cell (55D),
the second intermediate layer (59B) and the first intermediate layer (59A) are arranged at different positions as viewed in the thickness-wise direction (z-direction) of the insulation layer (85), and
the second intermediate layer (59B) and the second electrode portion (52) are separated and opposed to each other in the thickness-wise direction (z-direction) of the insulation layer (85) to form a second capacitor cell (55E) that is connected in series to the first capacitor cell (55D) through the connector (59C).

[Clause 10] The isolator according to clause 9, where the second intermediate layer (59B) is arranged between the first intermediate layer (59A) and the first electrode portion (51) in the thickness-wise direction (z-direction) of the insulation layer (85), and
the second electrode portion (52) is arranged closer to the surface (85s) of the insulation layer (85) than the first intermediate layer (59A) is.

[Clause 11] The isolator according to clause 9 or 10, where an area of the first intermediate layer (59A) opposed to the first electrode portion (51), a separation distance (DA) between the first intermediate layer (59A) and the first electrode portion (51), an area of the second intermediate layer (59B) opposed to the second electrode portion (52), and a separation distance (DB) between the second intermediate layer (59B) and the second electrode portion (52) are set so that a capacitance of the first capacitor cell (55D) is equal to a capacitance of the second capacitor cell (55E).

[Clause 12] The insulating module according to clause 15, including:
the isolator according to any one of clauses 1 to 11; and
a low-voltage circuit chip (60) included in a gate driver (10) that drives a switching element (501), where the isolator (80) is configured to be connected between the low-voltage circuit chip (60) and a high-voltage circuit chip (70) included in the gate driver (10).

[Clause 13] The insulating module according to clause 15, including:
the isolator according to any one of clauses 1 to 11; and
a high-voltage circuit chip (70) included in a gate driver (10) that drives a switching element (501), where the isolator (80) is configured to be connected between the high-voltage circuit chip (70) and a low-voltage circuit chip (60) included in the gate driver (10).

[Clause 14] A gate driver (10) that applies a drive voltage signal to a gate of a switching element (501), the gate driver, including:
a low-voltage circuit chip (60) including a low-voltage circuit (20) configured to be actuated by application of a first voltage (V1);
a high-voltage circuit chip (70) including a high-voltage circuit (30) configured to be actuated by application of a second voltage (V2) that is higher than the first voltage (V1); and
an isolator (80) connected between the low-voltage circuit chip (60) and the high-voltage circuit chip (70), where the isolator (80) includes an insulation layer (85),
a first electrode portion (51) arranged in the insulation layer (85) and connected to a first pad (81) formed on a surface (85s) of the insulation layer (85),
a second electrode portion (52) arranged in the insulation layer (85) and connected to a second pad (82) formed on the surface (85s) of the insulation layer (85), and
an intermediate electrode portion (53, 54) arranged in the insulation layer (85) and not connected to the first electrode portion (51) and the second electrode portion (52),
the intermediate electrode portion (53, 54) includes
a first electrode portion (53A, 54A) and a second electrode portion (53B, 54B) differing from each other in position in the thickness-wise direction (z-direction) of the insulation layer (85), and
a connector (53C, 54C) extending in the thickness-wise direction (z-direction) of the insulation layer (85) and connecting the first electrode portion (53A, 54A) and the second electrode portion (53B, 54B), and
the capacitor (40/40A, 40B, 40C) is formed by coupling the first electrode portion (51) and the second electrode portion (52) through the intermediate electrode portion (53, 54).

[Clause 15] The gate driver according to clause 14, where the first electrode portion (51) is electrically connected to the low-voltage circuit (20), and
the second electrode portion (52) is electrically connected to the high-voltage circuit (30).

[Clause 16] The gate driver according to clause 14, where the gate driver (10) is configured to bidirectionally transmit a signal between the low-voltage circuit (20) and the high-voltage circuit (30) through the capacitor (40/40A, 40C),
the signal includes a first signal and a second signal,
the capacitor (40/40A, 40B, 40C) includes a first signal capacitor (40A, 40B) and a second signal capacitor (40C),
the first signal is transmitted from the low-voltage circuit (20) toward the high-voltage circuit (30) through the first signal capacitor (40A, 40B), and
the second signal is transmitted from the high-voltage circuit (30) toward the low-voltage circuit (20) through the second signal capacitor (40C).

[Clause 17] The gate driver according to any one of clauses 14 to 16, where the insulation layer (85) includes at least one of an oxide film or a resin.

[Clause 18] The gate driver according to clause 13, including an isolator (80) including the first signal capacitor (40A, 40B) and the second signal capacitor (40C).

[Clause 19] The gate driver according to clause 13, where the isolator includes
a first capacitor chip (80T) including the first signal capacitor (40A, 40B), and
a second capacitor chip (80R) including the second signal capacitor (40C).

[Clause 20] The gate driver according to clause 7, where a total value (D1+D2+D3) of a separation distance (D1) between the first intermediate layer (53A) of the first intermediate electrode portion (53) and the first electrode portion (51), a separation distance (D2) between the second intermediate layer (53B) of the first intermediate electrode portion (51) and the first intermediate layer (54A) of the second intermediate electrode portion (54), and a separation distance (D3) between the second intermediate layer (54B) of the second intermediate electrode portion (54) and the second electrode portion (52) is greater than a thickness of the insulation layer (85).

[Clause 21] The gate driver according to clause 10, where a total value (DA+DB) of a separation distance (DA) between the first intermediate layer (59A) of the intermediate electrode portion (59) and the first electrode portion (51) and a separation distance (DB) between the second intermediate layer (59B) of the intermediate electrode portion (59) and the second electrode portion (52) is greater than a thickness of the insulation layer (85).

[Clause 22] A gate driver (10) that applies a drive voltage signal to a gate of a switching element (501), the gate driver, including:

a low-voltage circuit chip (60) including a low-voltage circuit (20) configured to be actuated by application of a first voltage (V1); and a high-voltage circuit chip (70) including a high-voltage circuit (30) configured to be actuated by application of a second voltage (V2) that is higher than the first voltage (V1), the low-voltage circuit chip (60) includes an insulation layer (85), a first electrode portion (51) arranged in the insulation layer (85) and connected to a first pad (81) formed on a surface (85s) of the insulation layer (85), a second electrode portion (52) arranged in the insulation layer (85) and connected to a second pad (82) formed on the surface (85s) of the insulation layer (85), and an intermediate electrode portion (53, 54) arranged in the insulation layer (85) and not connected to the first electrode portion (51) and the second electrode portion (52), the intermediate electrode portion (53, 54) includes a first electrode portion (53A, 54A) and a second electrode portion (53B, 54B) differing from each other in position in the thickness-wise direction (z-direction) of the insulation layer (85), and a connector (53C, 54C) extending in the thickness-wise direction (z-direction) of the insulation layer (85) and connecting the first electrode portion (53A, 54A) and the second electrode portion (53B, 54B), and the capacitor (40/40A, 40B, 40C) is formed by coupling the first electrode portion (51) and the second electrode portion (52) through the intermediate electrode portion (53, 54).

[Clause 23] A gate driver (10) that applies a drive voltage signal to a gate of a switching element (501), the gate driver, including:

a low-voltage circuit chip (60) including a low-voltage circuit (20) configured to be actuated by application of a first voltage (V1); and a high-voltage circuit chip (70) including a high-voltage circuit (30) configured to be actuated by application of a second voltage (V2) that is higher than the first voltage (V1), the high-voltage circuit chip (70) includes an insulation layer (85), a first electrode portion (51) arranged in the insulation layer (85) and connected to a first pad (81) formed on a surface (85s) of the insulation layer (85), a second electrode portion (52) arranged in the insulation layer (85) and connected to a second pad (82) formed on the surface (85s) of the insulation layer (85), and an intermediate electrode portion (53, 54) arranged in the insulation layer (85) and not connected to the first electrode portion (51) and the second electrode portion (52), the intermediate electrode portion (53, 54) includes a first electrode portion (53A, 54A) and a second electrode portion (53B, 54B) differing from each other in position in the thickness-wise direction (z-direction) of the insulation layer (85), and a connector (53C, 54C) extending in the thickness-wise direction (z-direction) of the insulation layer (85) and connecting the first electrode portion (53A, 54A) and the second electrode portion (53B, 54B), and the capacitor (40/40A, 40B, 40C) is formed by coupling the first electrode portion (51) and the second electrode portion (52) through the intermediate electrode portion (53, 54).

REFERENCE SIGNS LIST 10) gate driver
20) low-voltage circuit
30) high-voltage circuit
40A, 40B) capacitor
43A, 43B) first capacitor (capacitor)
44A, 44B) second capacitor (capacitor)
51) first electrode portion
52) second electrode portion
53) first intermediate electrode portion
53A) first upper electrode layer (first intermediate layer)
53B) first lower electrode layer (second intermediate layer)
53C) first connector (connector)
54) second intermediate electrode portion
54A) second upper electrode layer (first intermediate layer)
54B) second lower electrode layer (second intermediate layer)
54C) second connector (connector)
55) capacitor
55A) first capacitor cell
55B) second capacitor cell
55C) third capacitor cell
55D) first capacitor cell
55E) second capacitor cell
59) intermediate electrode portion
59A) upper electrode layer (first intermediate layer)
59B) lower electrode layer (second intermediate layer)
59C) connector
60) low-voltage circuit chip
70) high-voltage circuit chip
80) capacitor chip
80A) first capacitor chip
80B) second capacitor chip
80R) capacitor chip
80T) capacitor chip
80s) chip main surface
81) first electrode pad (first pad)
82) second electrode pad (second pad)
85) insulation layer
85s) surface
220) insulating module
300) low-voltage circuit unit (insulating module)

410) high-voltage circuit unit (insulating module)
501, 502) switching element
D1 to D3, DA, DB) distance
The invention claimed is:

1. An isolator comprising:
an insulation layer; and
a capacitor embedded in the insulation layer, wherein
the capacitor includes
    a first electrode portion arranged in the insulation layer
    and connected to a first pad formed on a surface of
    the insulation layer,
    a second electrode portion arranged in the insulation
    layer and connected to a second pad formed on the
    surface of the insulation layer, and
    an intermediate electrode portion arranged in the insu-
    lation layer and not connected to the first electrode
    portion and the second electrode portion,
the intermediate electrode portion includes
    a first intermediate layer and a second intermediate
    layer differing from each other in position in a
    thickness-wise direction of the insulation layer, and
    a connector extending in the thickness-wise direction of
    the insulation layer and connecting the first interme-
    diate layer and the second intermediate layer, and
the capacitor is formed by coupling the first electrode
    portion and the second electrode portion through the
    intermediate electrode portion.

2. The isolator according to claim 1, wherein
the intermediate electrode portion includes multiple inter-
    mediate electrode portions,
the first electrode portion and the second electrode portion
    are coupled through the multiple intermediate electrode
    portions to form the capacitor,
the multiple intermediate electrode portions include a first
    intermediate electrode portion and a second intermedi-
    ate electrode portion,
the capacitor includes a first capacitor cell and a second
    capacitor cell,
the first capacitor cell includes the first intermediate layer
    of the first intermediate electrode portion and the first
    electrode portion, the first intermediate layer of the first
    intermediate electrode portion and the first electrode
    portion being separated and opposed to each other in
    the thickness-wise direction of the insulation layer,
as viewed in the thickness-wise direction of the insulation
    layer, the second intermediate layer of the first inter-
    mediate electrode portion and the first intermediate
    layer of the first intermediate electrode portion are
    arranged at different positions,
the second capacitor cell includes the second intermediate
    layer of the first intermediate electrode portion and the
    first intermediate layer of the second intermediate elec-
    trode portion, the second intermediate layer of the first
    intermediate electrode portion and the first intermediate
    layer of the second intermediate electrode portion being
    separated and opposed to each other in the thickness-
    wise direction of the insulation layer, and
the second capacitor cell is connected in series to the first
    capacitor cell through the connector of the first inter-
    mediate electrode portion.

3. The isolator according to claim 2, wherein
the first intermediate layer of the first intermediate elec-
    trode portion is circular or polygonal as viewed in the
    thickness-wise direction of the insulation layer,
as viewed in the thickness-wise direction of the insulation
    layer, the second intermediate layer of the first inter-
    mediate electrode portion and the first intermediate layer of the second intermediate electrode portion are
    ring-shaped and surround the first intermediate layer of
    the first intermediate electrode portion, and
as viewed in the thickness-wise direction of the insulation
    layer, the second intermediate layer of the second
    intermediate electrode portion is ring-shaped and sur-
    rounds the first intermediate layer of the second inter-
    mediate electrode portion.

4. The isolator according to claim 2, wherein
in the thickness-wise direction of the insulation layer, the
    second intermediate layer of the first intermediate elec-
    trode portion is arranged between the first intermediate
    layer of the first intermediate electrode portion and the
    first electrode portion, and
in the thickness-wise direction of the insulation layer, the
    first intermediate layer of the second intermediate elec-
    trode portion is arranged closer to the surface of the
    insulation layer than the first intermediate layer of the
    first intermediate electrode portion is.

5. The isolator according to claim 2, wherein an area of
the first intermediate layer of the first intermediate electrode
portion opposed to the first electrode portion, a separation
distance between the first intermediate layer of the first
intermediate electrode portion and the first electrode portion,
an area of the second intermediate layer of the first inter-
mediate electrode portion opposed to the first intermediate
layer of the second intermediate electrode portion, and a
separation distance between the second intermediate layer of
the first intermediate electrode portion and the first interme-
diate layer of the second intermediate electrode portion are
set so that a capacitance of the first capacitor cell is equal to
a capacitance of the second capacitor cell.

6. The isolator according to claim 2, wherein
as viewed in the thickness-wise direction of the insulation
    layer, the second intermediate layer of the second
    intermediate electrode portion and the first intermediate
    layer of the second intermediate electrode portion are
    arranged at different positions, and
the second intermediate layer of the second intermediate
    electrode portion and the second electrode portion are
    separated and opposed to each other in the thickness-
    wise direction of the insulation layer to form a third
    capacitor cell that is connected in series to the second
    capacitor cell through the connector of the second
    intermediate electrode portion.

7. The isolator according to claim 6, wherein in the
thickness-wise direction of the insulation layer, the second
intermediate layer of the second intermediate electrode
portion is arranged between the second intermediate layer of
the first intermediate electrode portion and the second elec-
trode portion.

8. The isolator according to claim 6, wherein
a capacitance of the first capacitor cell is equal to a
    capacitance of the second capacitor cell, and
an area of the second intermediate layer of the second
    intermediate electrode portion opposed to the second
    electrode portion and a separation distance between the
    second intermediate layer of the second intermediate
    electrode portion and the second electrode portion are
    set so that the capacitance of the first capacitor cell and
    the capacitance of the second capacitor cell are equal to
    a capacitance of the third capacitor cell.

9. The isolator according to claim 1, wherein
the capacitor includes a first capacitor cell and a second
    capacitor cell,
the first capacitor cell includes the first intermediate layer
    and the first electrode portion, the first intermediate layer and the first electrode portion being separated and opposed to each other in the thickness-wise direction of the insulation layer, the second intermediate layer and the first intermediate layer are arranged at different positions as viewed in the thickness-wise direction of the insulation layer, the second capacitor cell includes the second intermediate layer and the second electrode portion, the second intermediate layer and the second electrode portion being separated and opposed to each other in the thickness-wise direction of the insulation layer, and the second capacitor cell is connected in series to the first capacitor cell through the connector.

10. The isolator according to claim 9, wherein the second intermediate layer is arranged between the first intermediate layer and the first electrode portion in the thickness-wise direction of the insulation layer, and the second electrode portion is arranged closer to the surface of the insulation layer than the first intermediate layer is.

11. The isolator according to claim 9, wherein an area of the first intermediate layer opposed to the first electrode portion, a separation distance between the first intermediate layer and the first electrode portion, an area of the second intermediate layer opposed to the second electrode portion, and a separation distance between the second intermediate layer and the second electrode portion are set so that capacitance of the first capacitor cell is equal to capacitance of the second capacitor cell.

12. An insulating module, comprising:

the isolator according to claim 1; and a low-voltage circuit chip included in a gate driver that drives a switching element, wherein the isolator is configured to be connected between the low-voltage circuit chip and a high-voltage circuit chip included in the gate driver.

13. An insulating module, comprising:

the isolator according to claim 1; and a high-voltage circuit chip included in a gate driver that drives a switching element, wherein the isolator is configured to insulate the high-voltage circuit chip from a low-voltage circuit chip included in the gate driver.

*    *    *    *    *